United States Patent
Alfano et al.

(10) Patent No.: US 7,613,901 B2
(45) Date of Patent: Nov. 3, 2009

(54) COMPARATORS IN IC WITH PROGRAMMABLY CONTROLLED POSITIVE / NEGATIVE HYSTERESIS LEVEL AND OPEN-DRAIN / PUSH-PULL OUTPUT COUPLED TO CROSSBAR SWITCH OR RISING / FALLING EDGE INTERRUPT GENERATION

(75) Inventors: Donald E. Alfano, Round Rock, TX (US); Danny J. Allred, Austin, TX (US); Douglas S. Piasecki, Austin, TX (US); Kenneth W. Fernald, Austin, TX (US); Ka Y. Leung, Austin, TX (US); Brian Caloway, Georgetown, TX (US); Alvin Storvik, Austin, TX (US); Paul Highley, Austin, TX (US); Douglas R. Holberg, Wimberley, TX (US)

(73) Assignee: Silicon Labs CP, Inc., Austin, TX (US)

( * ) Notice: Subject to any disclaimer, the term of this patent is extended or adjusted under 35 U.S.C. 154(b) by 0 days.

(21) Appl. No.: 11/694,629

(22) Filed: Mar. 30, 2007

(65) Prior Publication Data

US 2007/0296478 A1 Dec. 27, 2007

Related U.S. Application Data

(63) Continuation of application No. 11/618,644, filed on Dec. 29, 2006, now Pat. No. 7,498,962, which is a continuation of application No. 09/885,459, filed on Jun. 19, 2001, now Pat. No. 7,171,542.

(60) Provisional application No. 60/212,653, filed on Jun. 19, 2000.

(51) Int. Cl.
*G06F 19/00* (2006.01)
*H03K 5/22* (2006.01)
(52) U.S. Cl. .............................. 712/37; 327/68; 327/78
(58) Field of Classification Search ...................... None
See application file for complete search history.

(56) References Cited

U.S. PATENT DOCUMENTS 3,783,192 A 1/1974 Takahashi (Continued)

OTHER PUBLICATIONS

"MicroConverter, Multichannel 12-Bit ADC with Embedded Flash MCU", Analog Devices, 2003, pp. 1-60, Norwood MA.

(Continued)

*Primary Examiner*—Kenneth S Kim
(74) *Attorney, Agent, or Firm*—Howison & Arnott, L.L.P.

(57) ABSTRACT

An integrated circuit package includes a processing core for operating on a set of instructions to carry out predefined processes. A plurality of comparators perform compare operations within the integrated circuit package. At least one control register is associated with each of the plurality of comparators, and each of the plurality of comparators are software programmable to control a hysteresis of the comparators responsive to control bits established in the at least one control register of the comparator by the processing core. An amount of positive hysteresis is programmed via a first group of the control bits and an amount of negative hysteresis is programmed via a second group of the control bits.

11 Claims, 38 Drawing Sheets

U.S. PATENT DOCUMENTS

| | | | |
|---|---|---|---|
| 3,984,819 A | | 10/1976 | Anderson |
| 4,368,427 A | * | 1/1983 | Hayashi et al. ............... 377/1 |
| 4,380,065 A | | 4/1983 | Hirtle et al. |
| 4,597,077 A | * | 6/1986 | Nelson et al. ............... 370/352 |
| 4,663,620 A | | 5/1987 | Paul et al. |
| 4,799,260 A | | 1/1989 | Mandell et al. |
| 4,807,183 A | | 2/1989 | Kung et al. |
| 4,928,260 A | | 5/1990 | Chuang et al. |
| 4,963,768 A | | 10/1990 | Agrawal et al. |
| 4,996,530 A | | 2/1991 | Hilton |
| 5,028,821 A | | 7/1991 | Kaplinsky |
| 5,036,300 A | | 7/1991 | Nicolai |
| 5,046,098 A | | 9/1991 | Mandell et al. |
| 5,107,146 A | | 4/1992 | El-Ayat |
| 5,153,462 A | * | 10/1992 | Agrawal et al. ............... 326/39 |
| 5,166,550 A | * | 11/1992 | Matsubara et al. ............ 327/68 |
| 5,227,863 A | * | 7/1993 | Bilbrey et al. ............... 348/578 |
| 5,261,059 A | | 11/1993 | Hedberg et al. |
| 5,392,446 A | | 2/1995 | Tower et al. |
| 5,404,054 A | * | 4/1995 | Kotowski ............... 327/73 |
| 5,428,750 A | | 6/1995 | Hsieh et al. |
| 5,444,705 A | | 8/1995 | Olnowich et al. |
| 5,451,892 A | * | 9/1995 | Bailey ............... 327/113 |
| 5,481,471 A | | 1/1996 | Naglestad et al. |
| 5,511,222 A | | 4/1996 | Shiba et al. |
| 5,555,397 A | | 9/1996 | Sasama et al. |
| 5,555,543 A | | 9/1996 | Grohoski et al. |
| 5,559,971 A | | 9/1996 | Hsieh et al. |
| 5,568,141 A | * | 10/1996 | Mori ............... 341/118 |
| 5,603,061 A | | 2/1997 | Hilley et al. |
| 5,610,545 A | * | 3/1997 | Jenkins et al. ............... 327/205 |
| 5,642,244 A | * | 6/1997 | Okada et al. ............... 360/61 |
| 5,732,207 A | | 3/1998 | Allen et al. |
| 5,751,234 A | * | 5/1998 | Schlotterer et al. ............ 341/139 |
| 5,764,080 A | | 6/1998 | Huang et al. |
| 5,796,312 A | | 8/1998 | Hull et al. |
| 5,821,776 A | | 10/1998 | McGowan |
| 5,822,610 A | | 10/1998 | Fung et al. |
| 5,847,450 A | | 12/1998 | Fink et al. |
| 5,861,681 A | * | 1/1999 | Nakano et al. ............... 307/10.1 |
| 5,861,829 A | | 1/1999 | Sutardja |
| 5,880,690 A | | 3/1999 | Rothenberg |
| 5,949,597 A | * | 9/1999 | Pahr ............... 360/46 |
| 5,949,982 A | | 9/1999 | Frankeny et al. |
| 6,037,891 A | | 3/2000 | Griph |
| 6,137,275 A | * | 10/2000 | Ravon ............... 323/274 |
| 6,192,428 B1 | * | 2/2001 | Abramson et al. ............ 710/52 |
| 6,232,907 B1 | | 5/2001 | Nagaraj et al. |
| 6,262,594 B1 | | 7/2001 | Cheung et al. |
| 6,263,415 B1 | | 7/2001 | Venkitakrishnan |
| 6,289,494 B1 | | 9/2001 | Sample et al. |
| 6,351,231 B1 | | 2/2002 | Price et al. |
| 6,367,032 B1 | | 4/2002 | Kasahara |
| RE37,716 E | | 5/2002 | Sutardja et al. |
| 6,420,990 B1 | | 7/2002 | Voelkel |
| 6,490,213 B1 | | 12/2002 | Mu et al. |
| 6,496,880 B1 | | 12/2002 | Ma et al. |
| 6,507,581 B1 | | 1/2003 | Sgammato |
| 6,643,803 B1 | | 11/2003 | Swoboda et al. |
| 6,662,314 B1 | | 12/2003 | Iwata et al. |
| 6,803,785 B1 | | 10/2004 | May et al. |

OTHER PUBLICATIONS

Computer System Architecture; Second Edition; M. Morris Mano; 1982 by Prentice Hall, Inc. pp. 454-458.

On the Speedup Required for Work-Conserving Crossbar Switches; Krishna et al.; IEEE Journal on Selected Areas in Communications, vol. 17, No. 6, Jun. 1999; pp. 1057-1066.

Testing Crossbar Switch Interconnection Networks; Janusz Sosnowski, Institute of Computer Science, Warsaw University of Technology; ul. Nowowiejska 15/19; Warsaw 00-665, Poland, IEEE 1993, p. 540-542.

Hashimoto, Masashi; self-Routing Optical Crossbar Switch; IEEE Photonics Technology Letters, vol. 2, No. 7, Jul. 1990, pp. 522-524.

* cited by examiner $V_{TEMP} = 0.0025(TEMP_C) + 0.603$

| INPUT VOLTAGE (AD0−AGND) | ADC DATA WORD | |
|---|---|---|
| REF x (4095/4096) | 0x0FFF | ADWINT NOT AFFECTED |
| | 0x0201 | |
| REF x (512/4096) | 0x0200 | ADC0LTH:ADC0LTL |
| | 0x01FF | ADWINT=1 |
| | 0x0101 | |
| REF x (256/4096) | 0x0100 | ADC0GTH:ADC0GTL |
| | 0x00FF | ADWINT NOT AFFECTED |
| 0 | 0x0000 | |

GIVEN:
AMX0SL=0x00, AMX0CF=0x00, ADLJST=0,
ADC0LTH:ADC0LTL=0x0200,
ADC0GTH:ADC0GTL=0x0100.

AN ADC END OF CONVERSION WILL CAUSE AN ADC WINDOW COMPARE INTERRUPT (ADWINT=1) IF THE RESULTING ADC DATA WORD IS < 0x0200 AND > 0x0100.

| INPUT VOLTAGE (AD0−AGND) | ADC DATA WORD | |
|---|---|---|
| REF x (4095/4096) | 0x0FFF | ADWINT=1 |
| | 0x0201 | |
| REF x (512/4096) | 0x0200 | ADC0GTH:ADC0GTL |
| | 0x01FF | ADWINT NOT AFFECTED |
| | 0x0101 | |
| REF x (256/4096) | 0x0100 | ADC0LTH:ADC0LTL |
| | 0x00FF | ADWINT=1 |
| 0 | 0x0000 | |

GIVEN:
AMX0SL=0x00, AMX0CF=0x00, ADLJST=0,
ADC0LTH:ADC0LTL=0x0100,
ADC0GTH:ADC0GTL=0x0200.

AN ADC END OF CONVERSION WILL CAUSE AN ADC WINDOW COMPARE INTERRUPT (ADWINT=1) IF THE RESULTING ADC DATA WORD IS < 0x0100 OR > 0x0200.

FROM FIG. 13A

| INPUT VOLTAGE (AD0−AD1) | ADC DATA WORD | |
|---|---|---|
| REF × (4095/4096) | 0x07FF | ⎫ ADWINT=1 |
|  | 0x0101 | ⎭ |
| REF × (256/4096) | 0x0100 | ADCOGTH:ADCOGTL |
|  | 0x00FF | ADWINT NOT AFFECTED |
|  | 0x0000 | |
| REF × (−1/4096) | 0xFFFF | ADCOLTH:ADCOLTL |
|  | 0xFFFE | ⎫ ADWINT=1 |
| −REF | 0xF800 | ⎭ |

GIVEN:

AMX0SL=0x00, AMX0CF=0x01, ADLJST=0,
ADCOLTH:ADCOLTL=0xFFFF,
ADCOGTH:ADCOGTL=0x0100.

AN ADC END OF CONVERSION WILL CAUSE AN ADC WINDOW COMPARE INTERRUPT (ADWINT=1) IF THE RESULTING ADC DATA WORD IS < 0xFFFF OR > 0x0100. (TWO'S COMPLEMENT MATH.)

---

| INPUT VOLTAGE (AD0−AD1) | ADC DATA WORD | |
|---|---|---|
| REF × (4095/4096) | 0x07FF | ADWINT NOT AFFECTED |
|  | 0x0101 | |
| REF × (256/4096) | 0x0100 | ADCOLTH:ADCOLTL |
|  | 0x00FF | ⎫ ADWINT=1 |
|  | 0x0000 | |
| REF × (−1/4096) | 0xFFFF | ⎭ |
|  | 0xFFFE | ADCOGTH:ADCOGTL |
| −REF | 0xF800 | ADWINT NOT AFFECTED |

GIVEN:

AMX0SL=0x00, AMX0CF=0x01, ADLJST=0,
ADCOLTH:ADCOLTL=0x0100,
ADCOGTH:ADCOGTL=0xFFFF.

AN ADC END OF CONVERSION WILL CAUSE AN ADC WINDOW COMPARE INTERRUPT (ADWINT=1) IF THE RESULTING ADC DATA WORD IS < 0x0100 AND > 0xFFFF. (TWO'S COMPLEMENT MATH.)

| INPUT VOLTAGE (AD0-AGND) | ADC DATA WORD | |
|---|---|---|
| REF x (4095/4096) | 0xFFF0 | ADWINT NOT AFFECTED |
| | 0x2010 | |
| | 0x2000 | ADC0LTH:ADC0LTL |
| REF x (512/4096) | 0x1FF0 | ADWINT=1 |
| | 0x1010 | |
| | 0x1000 | ADC0GTH:ADC0GTL |
| REF x (256/4096) | 0x0FF0 | ADWINT NOT AFFECTED |
| 0 | 0x0000 | |

GIVEN:
AMX0SL=0x00, AMX0CF=0x00, ADLJST=1,
ADC0LTH:ADC0LTL=0x2000,
ADC0GTH:ADC0GTL=0x1000.

AN ADC END OF CONVERSION WILL CAUSE AN ADC WINDOW COMPARE INTERRUPT (ADWINT=1) IF THE RESULTING ADC DATA WORD IS < 0x2000 AND > 0x1000.

| INPUT VOLTAGE (AD0-AGND) | ADC DATA WORD | |
|---|---|---|
| REF x (4095/4096) | 0xFFF0 | ADWINT=1 |
| | 0x2010 | |
| | 0x2000 | ADC0GTH:ADC0GTL |
| REF x (512/4096) | 0x1FF0 | ADWINT NOT AFFECTED |
| | 0x1010 | |
| | 0x1000 | ADC0LTH:ADC0LTL |
| REF x (256/4096) | 0x0FF0 | ADWINT=1 |
| 0 | 0x0000 | |

GIVEN:
AMX0SL=0x00, AMX0CF=0x00, ADLJST=1,
ADC0LTH:ADC0LTL=0x1000,
ADC0GTH:ADC0GTL=0x2000.

AN ADC END OF CONVERSION WILL CAUSE AN ADC WINDOW COMPARE INTERRUPT (ADWINT=1) IF THE RESULTING ADC DATA WORD IS < 0x1000 OR > 0x2000.

FROM FIG. 14A

| INPUT VOLTAGE (AD0-AD1) | ADC DATA WORD | |
|---|---|---|
| REF x (4095/4096) | 0x7FF0 | ADWINT=1 |
|  | 0x1010 |  |
| REF x (256/4096) | 0x1000 | ADCOGTH:ADCOGTL |
|  | 0x0FF0 | ADWINT NOT AFFECTED |
|  | 0x0000 |  |
| REF x (-1/4096) | 0xFFF0 | ADCOLTH:ADCOLTL |
|  | 0xFFE0 | ADWINT=1 |
| -REF | 0x8000 |  |

GIVEN:
AMXOSL=0x00, AMX0CF=0x01, ADLJST=1,
ADCOLTH:ADCOLTL=0xFFF0,
ADCOGTH:ADCOGTL=0x1000.

AN ADC END OF CONVERSION WILL CAUSE AN ADC WINDOW COMPARE INTERRUPT (ADWINT=1) IF THE RESULTING ADC DATA WORD IS < 0xFFF0 OR > 0x1000. (TWO'S COMPLEMENT MATH.)

---

| INPUT VOLTAGE (AD0-AD1) | ADC DATA WORD | |
|---|---|---|
| REF x (4095/4096) | 0x7FF0 | ADWINT NOT AFFECTED |
|  | 0x1010 |  |
| REF x (256/4096) | 0x1000 | ADCOLTH:ADCOLTL |
|  | 0x0FF0 | ADWINT=1 |
|  | 0x0000 |  |
| REF x (-1/4096) | 0xFFF0 | ADCOGTH:ADCOGTL |
|  | 0xFFE0 | ADWINT NOT AFFECTED |
| -REF | 0x8000 |  |

GIVEN:
AMXOSL=0x00, AMX0CF=0x01, ADLJST=1,
ADCOLTH:ADCOLTL=0x1000,
ADCOGTH:ADCOGTL=0xFFF0.

AN ADC END OF CONVERSION WILL CAUSE AN ADC WINDOW COMPARE INTERRUPT (ADWINT=1) IF THE RESULTING ADC DATA WORD IS < 0x1000 AND > 0xFFF0. (TWO'S COMPLEMENT MATH.)

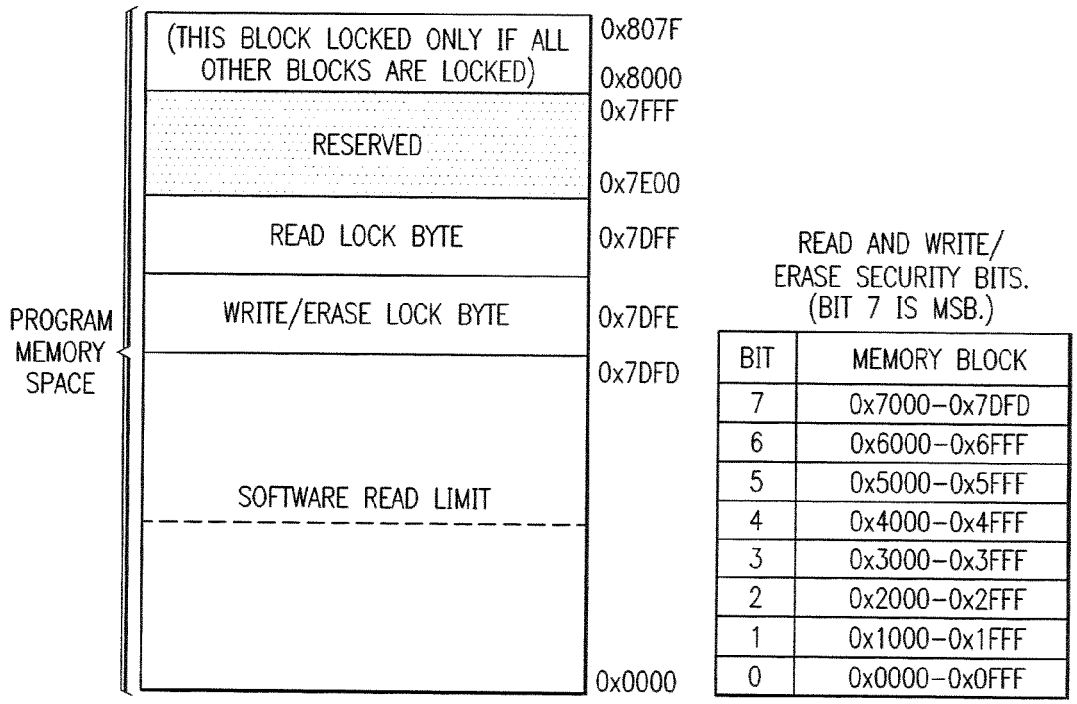

FLASH READ LOCK BYTE

BITS7-0: EACH BIT LOCKS A CORRESPONDING BLOCK OF MEMORY. (BIT 7 IS MSB.)
  0: READ OPERATIONS ARE LOCKED (DISABLED) FOR CORRESPONDING BLOCK ACROSS
  THE JTAG INTERFACE.
  1: READ OPERATIONS ARE UNLOCKED (ENABLED) FOR CORRESPONDING BLOCK
  ACCROSS THE JTAG INTERFACE.

FLASH WRITE/ERASE LOCK BYTE

BITS 7-0: EACH BIT LOCKS A CORRESPONDING BLOCK OF MEMORY.
  0: WRITE/ERASE OPERATIONS ARE LOCKED (DISABLED) FOR CORRESPONDING BLOCK
  ACROSS THE JTAG INTERFACE.
  1: WRITE/ERASE OPERATIONS ARE UNLOCKED (ENABLED) FOR CORRESPONDING BLOCK
  ACROSS THE JTAG INTERFACE.

FLASH ACCESS LIMIT REGISTER (FLACL)

THE CONTENT OF THIS REGISTER IS USED AS THE HIGH BYTE OF THE 16-BIT
  SOFTWARE READ LIMIT ADDRESS. THE 16-BIT READ LIMIT ADDRESS VALUE IS
  CALCULATED AS 0xNN00 WHERE NN IS REPLACED BY CONTENT OF THIS REGISTER
  ON RESET. SOFTWARE RUNNING AT OR ABOVE THIS ADDRESS IS PROHIBITED FROM
  USING THE MOVX AND MOVC INSTRUCTIONS TO READ, WRITE, OR ERASE, LOCATIONS
  BELOW THIS ADDRESS. ANY ATTEMPTS TO READ LOCATIONS BELOW THIS LIMIT WILL
  RETURN THE VALUE 0x00.

FIG. 21

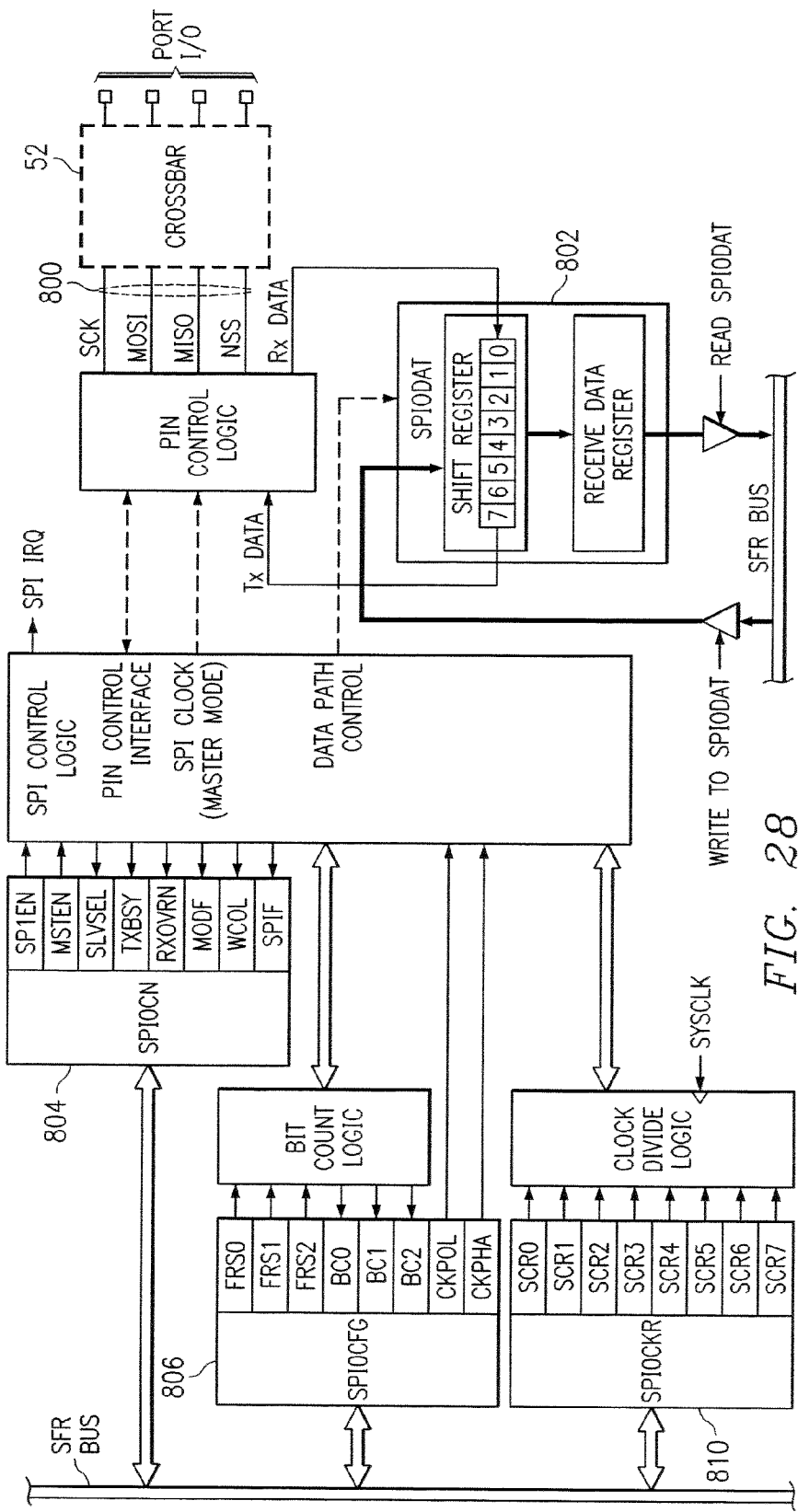

US 7,613,901 B2

COMPARATORS IN IC WITH PROGRAMMABLY CONTROLLED POSITIVE / NEGATIVE HYSTERESIS LEVEL AND OPEN-DRAIN / PUSH-PULL OUTPUT COUPLED TO CROSSBAR SWITCH OR RISING / FALLING EDGE INTERRUPT GENERATION

CROSS REFERENCE TO RELATED APPLICATIONS

This application is a Continuation of U.S. patent application Ser. No.: 11/618,644, filed Dec. 29, 2006, entitled "ANALOG-TO-DIGITAL CONVERTER WITH LOW POWER TRACK-AND-HOLD MODE", which is a Continuation of U.S. Pat. No. 7,171,542, issued on Jan. 30, 2007 and entitled "FIELD PROGRAMMABLE MIXED-SIGNAL CIRCUIT", which claims benefit of Provisional Application No. 60/212,653, filed Jun. 19, 2000, entitled "FIELD PROGRAMMABLE MIXED-SIGNAL CIRCUIT" and is related to U.S. patent application Ser. No. 11/381,707, filed May 4, 2006, entitled "FIELD PROGRAMMABLE MIXED-SIGNAL CIRCUIT", all of which are incorporated herein by reference.

TECHNICAL FIELD OF THE INVENTION

The invention pertains in general to programming integrated circuits and, more particularly to programming integrated circuits via a JTAG interface.

BACKGROUND OF THE INVENTION

As integrated circuits have seen increased use in recent years, the integration of multiple functions onto a single chip has also increased. Although purely digital circuits require a common technology with respect to transistors, i.e., all CMOS transistors, analog circuitry requires a different technology for such devices as bipolar devices. Each technology facilitates itself to a common processing technology for common devices when only that technology is involved and required. However, whenever audio systems are combined with digital systems, analog technology must be merged with digital technology. This can create problems due to the fact that analog circuitry is sometimes incompatible with the digital clocking signals, especially with respect to analog-to-digital converters. Very high resolution analog-to-digital converters or digital-to-analog converters can be affected by noise created in the digital circuitry. When merging the two technologies together, this is referred to as "mixed-signal" technology.

In current mixed-signal technology, it is desirable to combine the functionality of a microprocessor or microcontroller with an interface to the analog domain through an analog-to-digital converter or a digital-to-analog converter. Further, for many applications, there is a desire for configurability to allow various functions to be emulated or realized with the circuit. Some instrumentation applications require such. The application could be achieved with multiple integrated circuits configured in many different ways, but the desire is for a single chip solution.

SUMMARY OF THE INVENTION

The present invention, as disclosed and described herein, in one aspect thereof, comprises an integrated circuit package including a processing core for operating on a set of instructions to carry out predefined processes. A plurality of comparators perform compare operations within the integrated circuit package. Each of the plurality of comparators has associated therewith at least one control register. The plurality of comparators are programmable to operate in a plurality of operating modes responsive to control bits established in the at least one control register of the comparator by the processing core.

BRIEF DESCRIPTION OF THE DRAWINGS

For a more complete understanding of the present invention and the advantages thereof, reference is now made to the following description taken in conjunction with the accompanying Drawings in which:

FIGS. 13A, 13B, 14A and 14B illustrate the ADC inter operations;
FIG. 21 illustrates a diagrammatic view of the flash program memory bytes;
FIG. 27 illustrates a diagram of an SMBUS transaction;
FIG. 28 illustrates a diagram of the SPI block diagram.

DETAILED DESCRIPTION OF THE INVENTION

System Overview

Figure 1:
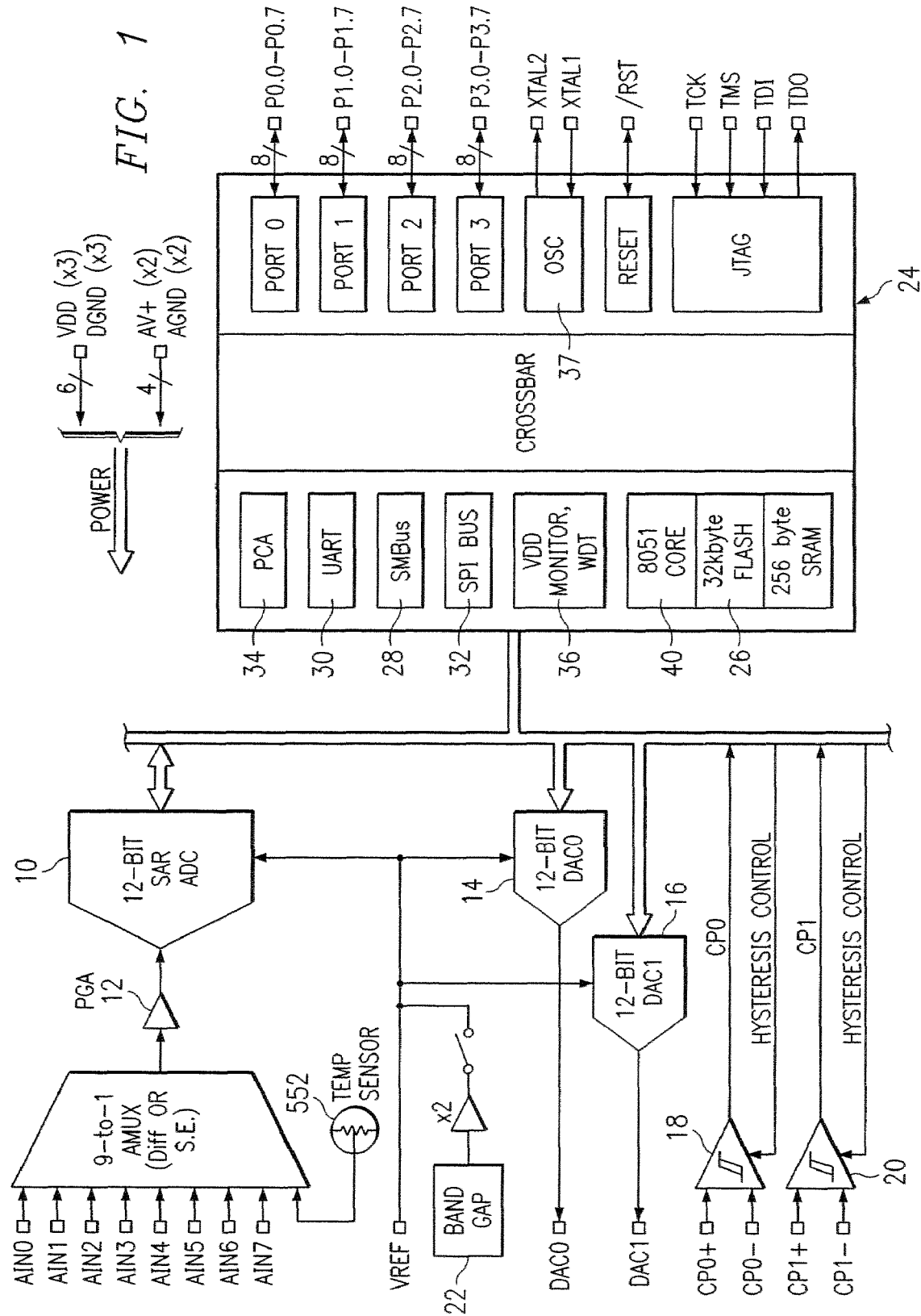
FIG. 1 illustrates an overall diagram of the system.
Figure 2:
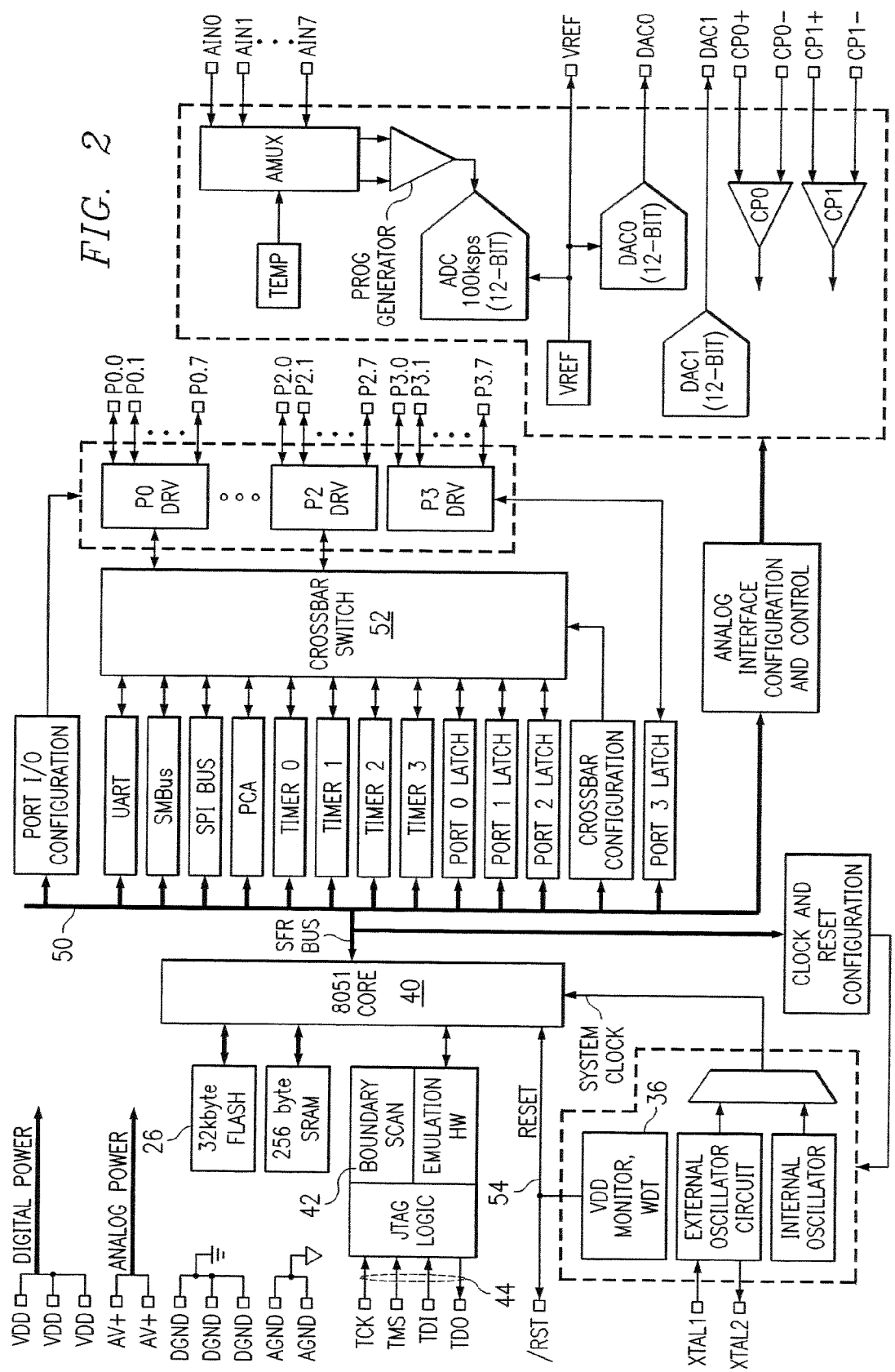
FIG. 2 illustrates in more detailed block diagram of the system.

The integrated circuit is a fully integrated mixed-signal System on a Chip with a true 12-bit multi-channel ADC 10 with a programmable gain pre-amplifier 12, two 12-bit DACs 14 and 16, two voltage comparators 18 and 20, a voltage reference 22, and an 8051-compatible microcontroller core 24 with 32 kbytes of FLASH memory 26. There are also 12C/SMBUS 28, UART 30, and SPI 32 serial interfaces implemented in hardware (not "bit-banged" in user software) as well as a Programmable Counter/Timer Array (PCA) 34 with five capture/compare modules. There are also 32 general purpose digital Port I/O.

With an on-board VDD monitor 36, WDT, and clock oscillator 37, the integrated circuit is a stand-alone System on a Chip. The MCU effectively configures and manages the analog and digital peripherals. The FLASH memory 26 can be reprogrammed even in-circuit, providing non-volatile data storage, and also allowing field upgrades of the 8051 firmware. The MCU can also individually shut down any or all of the peripherals to conserve power.

A JTAG interface 38 allows the user to interface with the IC. On-board JTAG emulation support allows non-intrusive (uses no on-chip resources), full speed, in-circuit emulation using the production integrated circuit installed in the final application. This emulation system supports inspection and modification of memory and registers, setting breakpoints, watchpoints, single stepping, run and halt commands. All analog and digital peripherals are fully functional when emulating using JTAG.

CIP-51™ Microcontroller Core

The integrated circuit utilizes a microcontroller core 40. The microcontroller 40 is fully compatible with the MCS-51™ instruction set. Standard 803x/805x assemblers and compilers can be used to develop software. The core has all the peripherals included with a standard 8052, including three 16-bit counter/timers, a full-duplex UART, 256 bytes of internal RAM, 128 byte Special Function Register (SFR) address space, and four byte-wide I/O Ports.

FIG. 1 illustrates a block diagram of the integrated circuit of the present disclosure. The core is interfaced through and internal BUS 50 to the various input/output blocks. A cross-bar switch 52, which cross-bar switch 52 which will be described hereinbelow, provides an interface between the UART 30, SPI 32, etc., and the digital I/O output. This is a configurable interface. That can be associated with the VDD monitor 36.

The Microcontroller 40 employs a pipelined architecture that greatly increases its instruction throughput over the standard 8051 architecture. In a standard 8051, all instructions except for MUL and DIV take 12 or 24 system clock cycles to execute with a maximum system clock of 12 MHz. By contrast, the Microcontroller 40 core executes seventy percent (70%) of its instructions in one or two system clock cycles, with only four instructions taking more than four system clock cycles. The Microcontroller 40 has a total of 109 instructions. The number of instructions versus the system clock cycles to execute them is as follows:

| Instructions | | | | | | | | | |
|---|---|---|---|---|---|---|---|---|---|
| | 26 | 50 | 5 | 14 | 7 | 3 | 1 | 2 | 1 |
| Clocks to Execute | 1 | 2 | 2/3 | 3 | 3/4 | 4 | 4/5 | 5 | 8 |

With the Microcontroller 40's maximum system clock at 20 MHz, it has a peak throughput of 20 MIPS.

Figure 3:
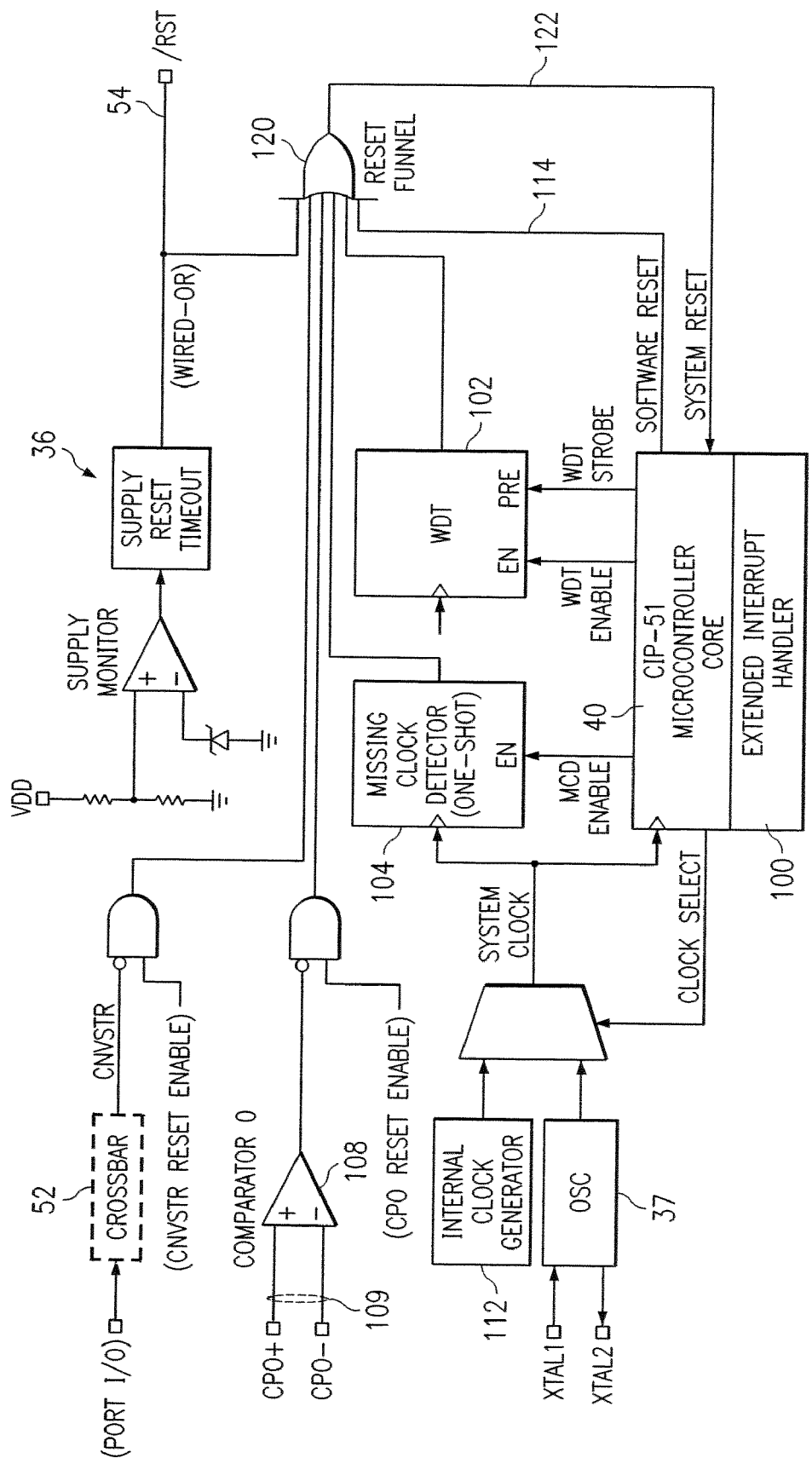
FIG. 3 illustrates the onboard clock and reset.

Referring now to FIG. 3, there is illustrated a more detailed diagram of the clock and resent function. The integrated circuit has several features both inside and outside the Microcontroller 40 core to improve its overall performance and ease of use in the end applications.

An extended interrupt handler 100 provides 22 interrupt sources into the Microcontroller 40 (as opposed to 7 for the standard 8051), allowing the numerous analog and digital peripherals to interrupt the controller. An interrupt driven system requires less intervention by the MCU, giving it more effective throughput. The extra interrupt sources are very useful when building multi-tasking, real-time systems.

There are up to seven reset sources for the system the on-board VDD monitor 36, a Watchdog Timer (WDT), a missing clock detector 104, a voltage level detection from a Comparator 108, a forced software reset on line 114, and two external reset pins 109. The /RST pin 54 is bi-directional, accommodating an external reset, or allowing the internally generated reset to be output on the /RST pin 54. Each reset source except for the $V_{DD}$ monitor and Reset Input Pin may be disabled by the user in software. The WDT 102 may be permanently enabled in software after a power-on reset during MCU initialization. All of the sources are wired Ored with OR circuit 120 to provide a system reset on input 122 to microcontroller 40.

The system has an internal, stand alone clock generator 112 which is used by default as the system clock after any reset. If desired, the clock source may be switched on the fly to the external oscillator 37, which can use a crystal, ceramic resonator, capacitor, RC, or external clock source to generate the system clock. This can be extremely useful in low power applications, allowing the system to run from a slow (power saving) external crystal source, while periodically switching to the fast (up to 15 MHz) internal oscillator as needed.

Memory

The Microcontroller 40 has a standard 8051 program and data address configuration. It includes 256 bytes of data RAM, with the upper 128 bytes dual-mapped. Indirect addressing accesses the upper 128 bytes of general purpose RAM, and direct addressing accesses the 128 byte SFR address space. The lower 128 bytes of RAM are accessible via direct and indirect addressing. The first 32 bytes are addressable as four banks of general purpose registers, and the next 16 bytes can be byte addressable or bit addressable.

Figure 4:
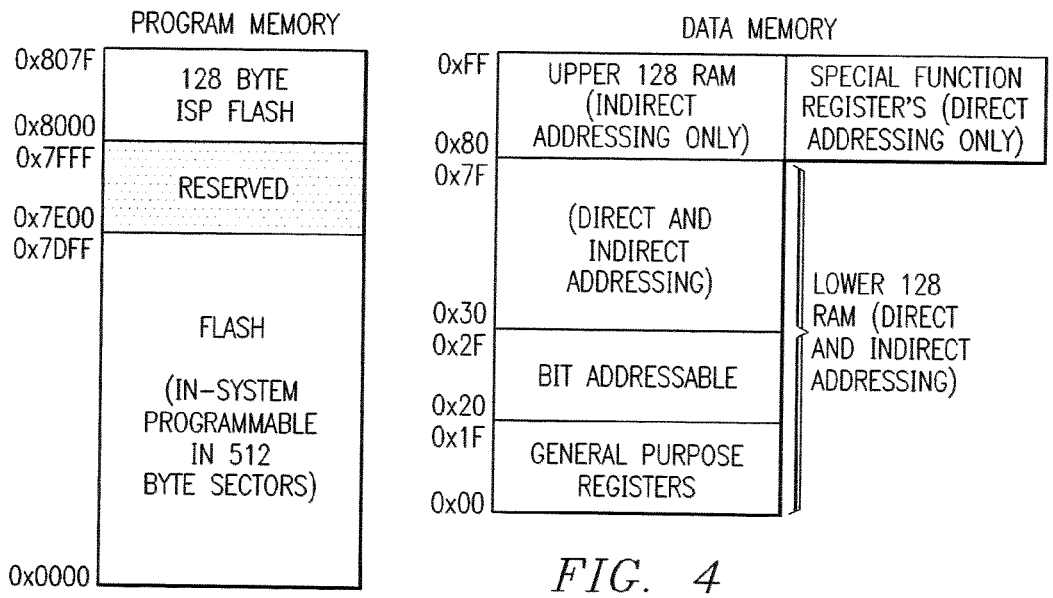
FIG. 4 illustrates the onboard memory maps.

The integrated circuit program memory consists of 32 k+128 bytes of FLASH in memory 26. This memory 26 may be reprogrammed in-system in 512 byte sectors, and requires no special off-chip programming voltage. The 512 bytes from addresses 0x7E00 to 0x7FFF are reserved for factory use. There is also a single 128-byte sector at address 0x8000 to 0x807F, which may be useful as a small table for software constants or as additional program space. See FIG. 4 for the system memory map.

JTAG Emulation and Boundary Scan

Figure 5:
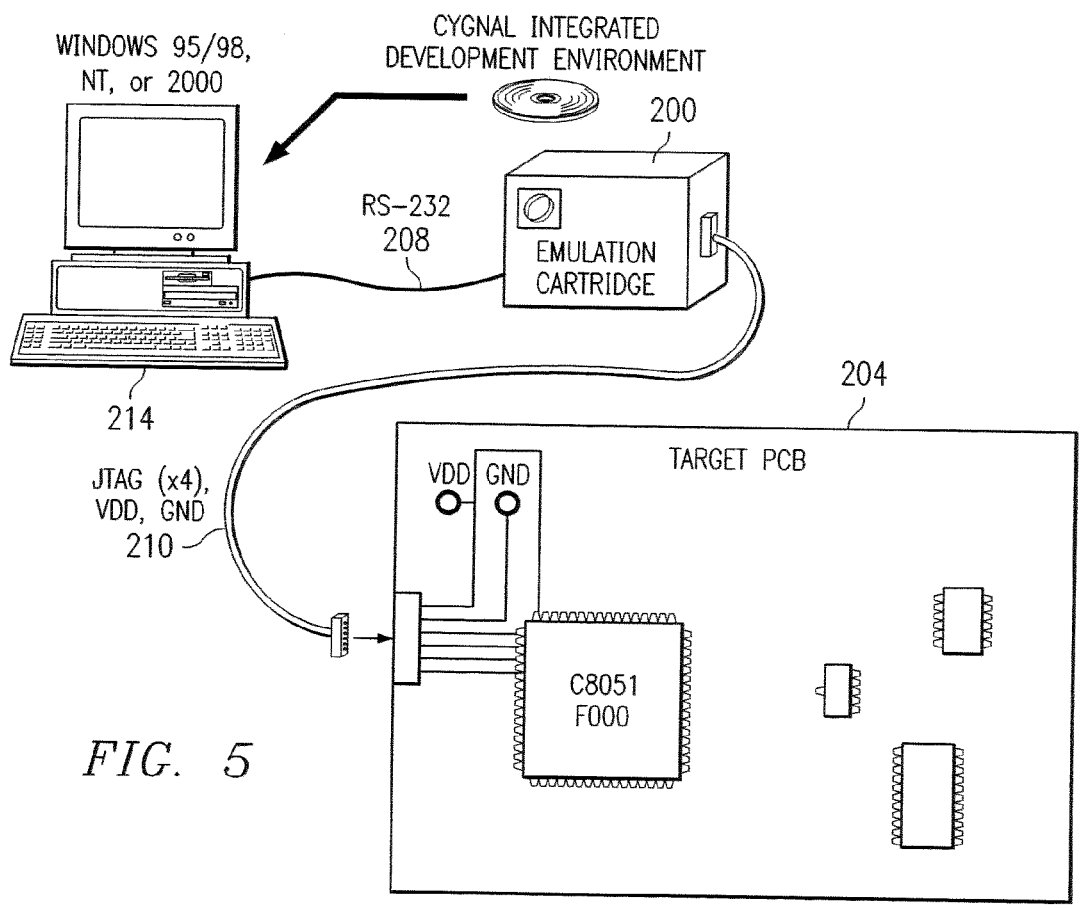
FIG. 5 illustrates an emulation diagram.

Referring now to FIG. 5, there is illustrated a block diagram of the JTAG emulation. The integrated circuit has on-chip JTAG and emulation logic that provide non-intrusive, full speed, in-circuit emulation using the production part installed in the end application using the four-pin JTAG I/F. The JTAG port is fully compliant to IEEE 1149.1, providing full boundary scan for test and manufacturing purposes.

An emulation system is provided that supports inspection and modification of memory and registers, breakpoints, watchpoints, a stack monitor, and single stepping. No additional target RAM, program memory, timers, or communications channels are required. All the digital and analog peripherals are functional and work correctly while emulating. All the peripherals (except for the ADC) are stalled when the MCU is halted, during single stepping, or at a breakpoint in order to keep them in sync.

A development software application 202 is provided with an emulation cartridge 200 to develop application code and perform in-circuit emulation with the integrated circuit. The software includes a developer's studio and debugger, and an integrated 8051 assembler. A target application board 204 is provided with a integrated circuit installed and large prototyping area, plus an RS-232 cable 208 and JTAG cable 210, and wall-mount power supply. The Development Kit requires a Windows 95/98 or NT computer with one available RS-232 serial port. A PC 214 is connected via the RS-232 cable 208 to the Emulation Cartridge 200. A six-inch ribbon cable connects the Emulation Cartridge 200 to the target application board 204, picking up the four JTAG pins and $V_{DD}$ and GND. The Emulation Cartridge 200 takes its power from the application board. It requires roughly 20 mA at 2.7-3.6V. For applications where there is not sufficient power available from the target application board 204, the provided power supply can be connected directly to the Emulation Cartridge 200.

Programmable Digital I/O and Crossbar

Figure 6:
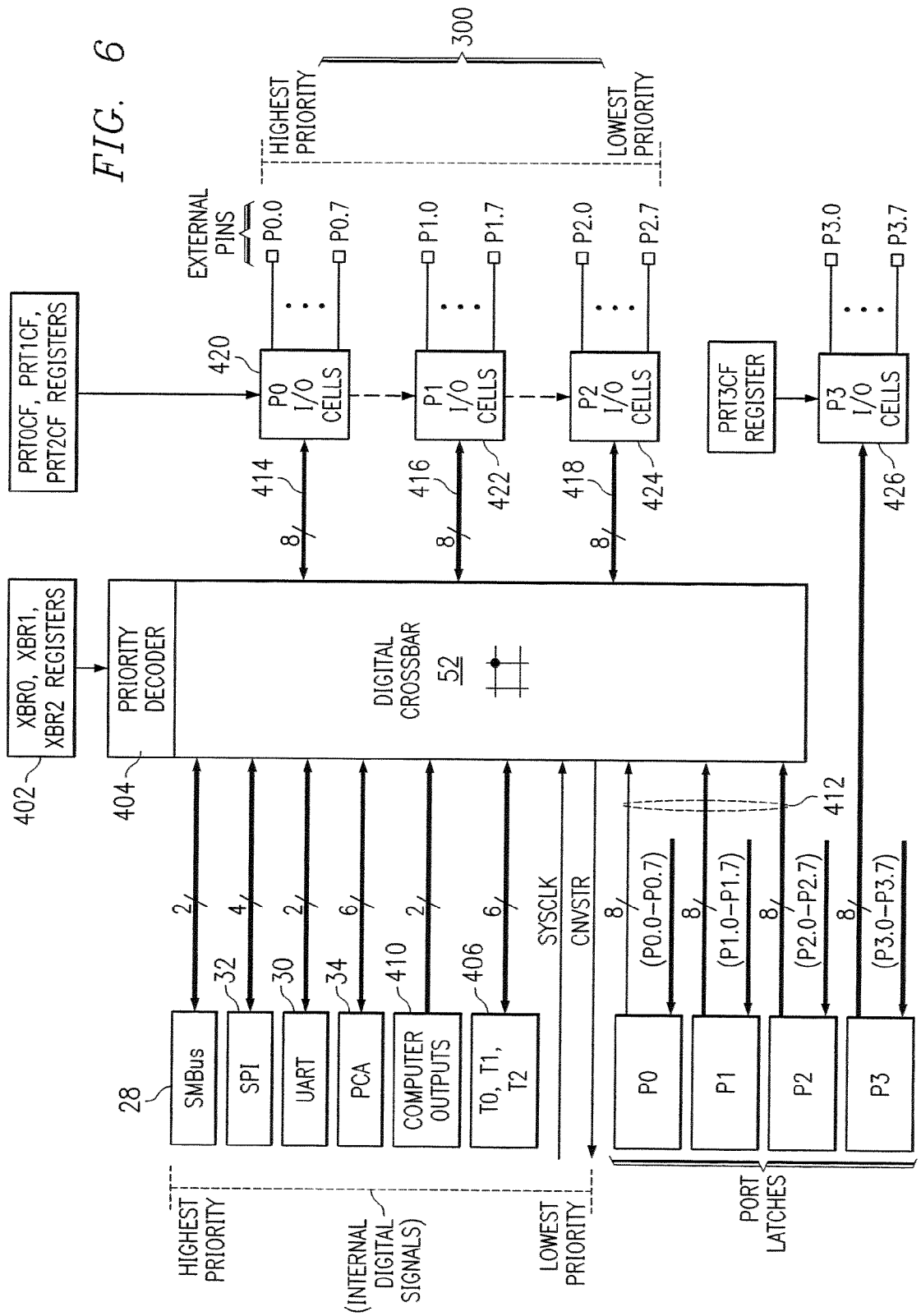
FIG. 6 illustrates the digital crossbar.

Referring now to FIG. 6, there is illustrated a block diagram of the digital cross-bar switch 52. The standard 8051 Ports (0, 1, 2, and 3) are available on the system. The Port I/O behave like the standard 8051 with a few enhancements. Each Port I/O pin can be configured as either a push-pull or open-drain output. Also, the "weak pull-ups" which are normally fixed on an 8051 can be globally disabled, providing additional power saving capabilities for low power applications. The Digital Crossbar switch 52 is essentially a large digital switching network that allows mapping of internal digital system resources to Port I/O pins 300 on P0, P1, and P2. Unlike microcontrollers with standard multiplexed digital I/O, all combinations of functions are supported.

The on-board counter/timers, serial buses, HW interrupts, ADC Start of Conversion input, comparator outputs, and other digital signals in the digital crossbar switch 52 can be configured to appear on the Port I/O pins 300 specified in Crossbar Control registers 402. This allows the user to select the exact mix of general purpose Port I/O and digital resources needed for his particular application.

The digital cross-bar switch 52 has a priority decoder 404 that is associated therewith. The lowest priority group that can be interfaced with are the SMBUS 28, SPI 32, UART 30, PCA 34, the T0, T1 and T2 block 406 and general miscellaneous computer outputs 410. Additionally, there are the port latches which are interfaced through lines 412 to the cross-bar 52.

The I/O side is interfaced to BUSes 414, 416 and 418, respectively, all networked for each of the cell 420 interfaces with eight external pins, such that there are three banks of pins. They range from the highest priority at Port 0 associated with the cell one 420 to the lowest priority associated with the cell 424. There is also provided a fourth port cell 426, associated with a second set of eight outputs. These are directly interfaced to the port latches. The detailed description of digital cross-bar switch 52 is described in U.S. patent application Ser. No. 09/583,260, filed May 31, 2000, entitled CROSS-BAR MATRIX FOR CONNECTING DIGITAL RESOURCES TO I/O PINS OF AN INTEGRATED CIRCUIT, which is incorporated herein by reference.

Programmable Counter Array

Figure 7:
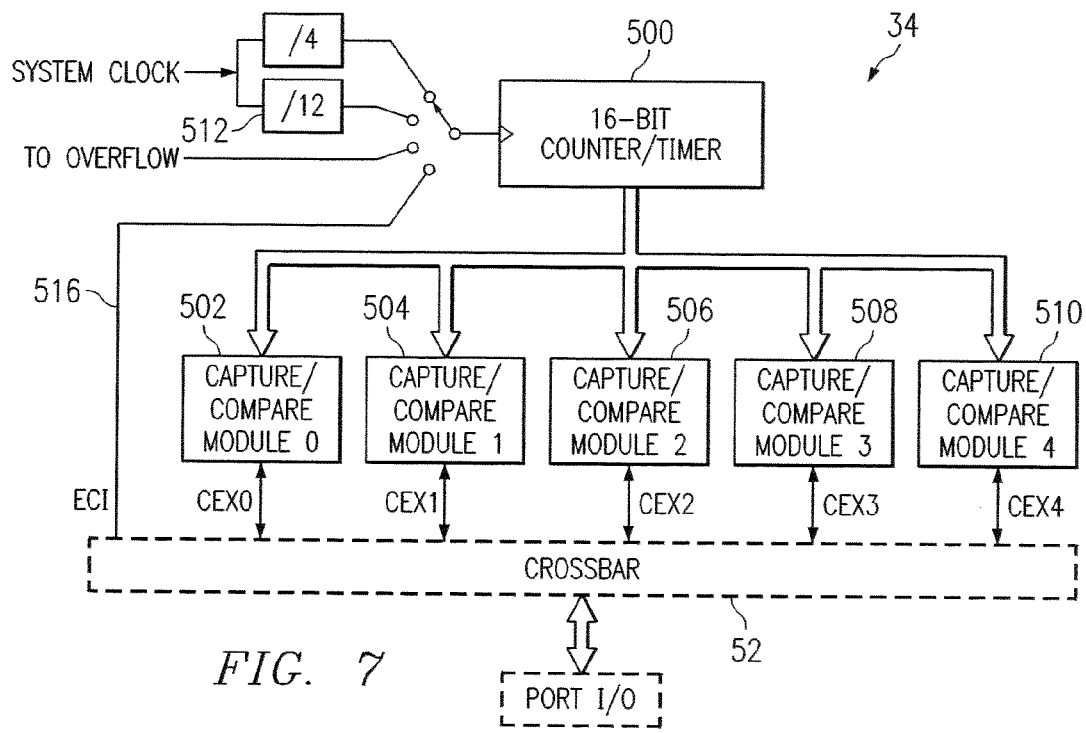
FIG. 7 illustrates a PCA block diagram.

Referring now to FIG. 7, there is illustrated a block diagram of the on-board Programmable Counter/Timer Array (PCA) 34 in addition to the four counter/timers included with the 8051. The PCA consists of a dedicated 16-bit counter/timer time base 500 with five programmable capture/compare modules 502-510. The timebase receives its clock from one of four sources: the system clock divided by 12 through a divider 512, the system clock divided by four through a timer 514, Timer 0 overflow, or an External Clock Input (ECI) on line 516.

Each capture/compare module 502-510 can be configured to operate in one of four modes: Edge-Triggered Capture, Software Timer, High Speed Output, or Pulse Width Modulator. The PCA Capture/Compare Module I/O and External Clock Input are routed to the integrated circuit Port I/O via the Digital Crossbar.

Serial Ports

The integrated circuit, as described hereinabove, includes a Full-Duplex UART, SPI BUS, and I2C/SMBUS. Each of the serial buses is fully implemented in hardware and makes extensive use of the Microcontroller 40's interrupts, thus requiring very little intervention by the CPU. The serial buses do not "share" resources such as timers, interrupts, or Port I/O, so any or all of the ports may be used together or separately with any other.

Analog to Digital Converter

Figure 8:
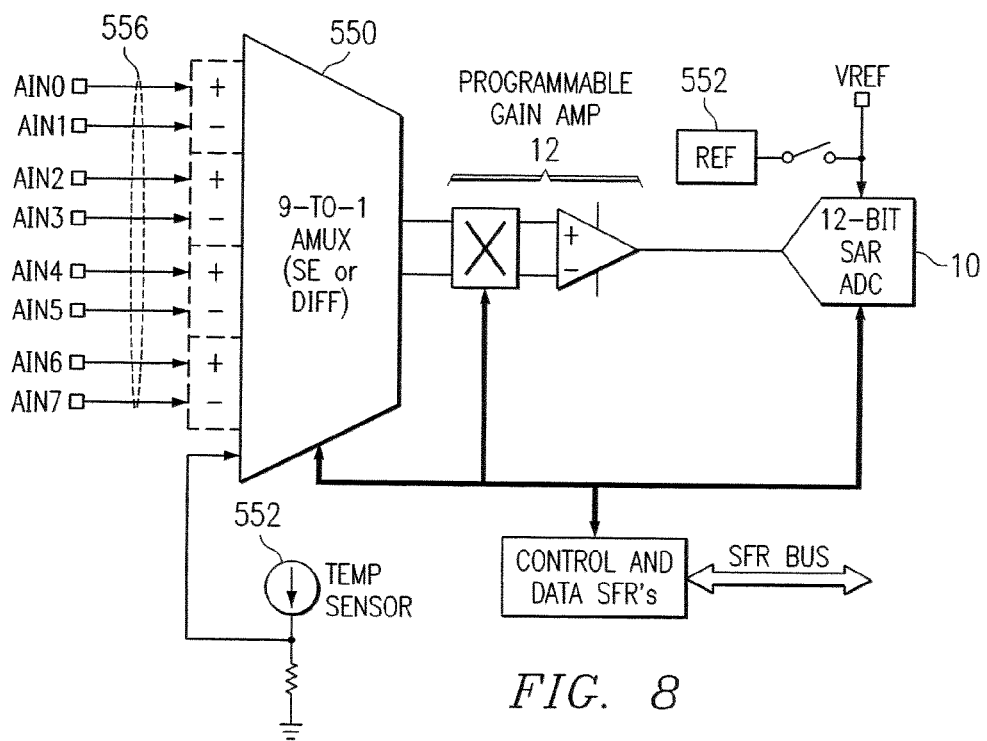
FIG. 8 illustrates the ADC.

Referring now to FIG. 8, there is illustrated a block diagram of the ADC integrated circuit which has an on-board 12-bit SAR ADC 10 with a 9-channel input multiplexer 550 and programmable gain amplifier 12. With a maximum throughput of 100 ksps, the ADC offers true 12-bit accuracy with an INL of ±1LSB. There is also an on-board 30 ppm voltage reference, which can be overridden externally.

The ADC 10 is under full control of the Microcontroller 40 via the Special Function Registers. One input channel is tied to an internal temperature sensor 552, while the other eight channels are available externally through pins 556. Each pair of the eight external input channels can be configured as either two single-ended inputs or a single differential input. The system controller can also put the ADC 10 into shutdown to save power.

The programmable gain amplifier 12 follows the analog multiplexer 550. The gain can be set in software from 0.5 to 16 in powers of 2. The gain stage can be especially useful when different ADC input channels have widely varied input voltage signals, or when it is necessary to "zoom in" on a signal with a large DC offset (in differential mode, a DAC could be used to provide the DC offset).

Conversions can be started in four ways; a software command, an overflow on Timer 2, an overflow on Timer 3, or an external signal input. This flexibility allows the start of conversion to be triggered by software events, external HW signals, or convert continuously. A completed conversion causes an interrupt, or a status bit can be polled in software to determine the end of conversion. The resulting 12-bit data word is latched into two SFRs upon completion of a conversion. The data can be right or left justified in these registers under software control.

Compare registers for the ADC data can be configured to interrupt the controller when ADC data is within a specified window. The ADC can monitor a key voltage continuously in background mode, but not interrupt the controller unless the converted data is within the specified window. The ADC is described in U.S. patent application Ser. No. 09/595,959, filed Jun. 19, 2000, and entitled DIFFERENTIAL/SINGLE ENDED ANALOG-TO-DIGITAL CONVERTER, and in U.S. patent application Ser. No. 09/638,095, filed Aug. 11, 2000, entitled PROGRAMMABLE GAIN ADC, and in U.S. patent application Ser. No. 09/637,493, filed Aug. 11, 2000, and entitled COMPARATOR-AMPLIFIER CONFIGURATION IN AN ADC, and in U.S. patent Ser. No. 09/419,148, filed Oct. 15, 1999, and entitled A/D CONVERTER WITH VOLTAGE/CHARGE SCALING, all of which are incorporated herein by reference.

Comparators and DACs

Figure 9:
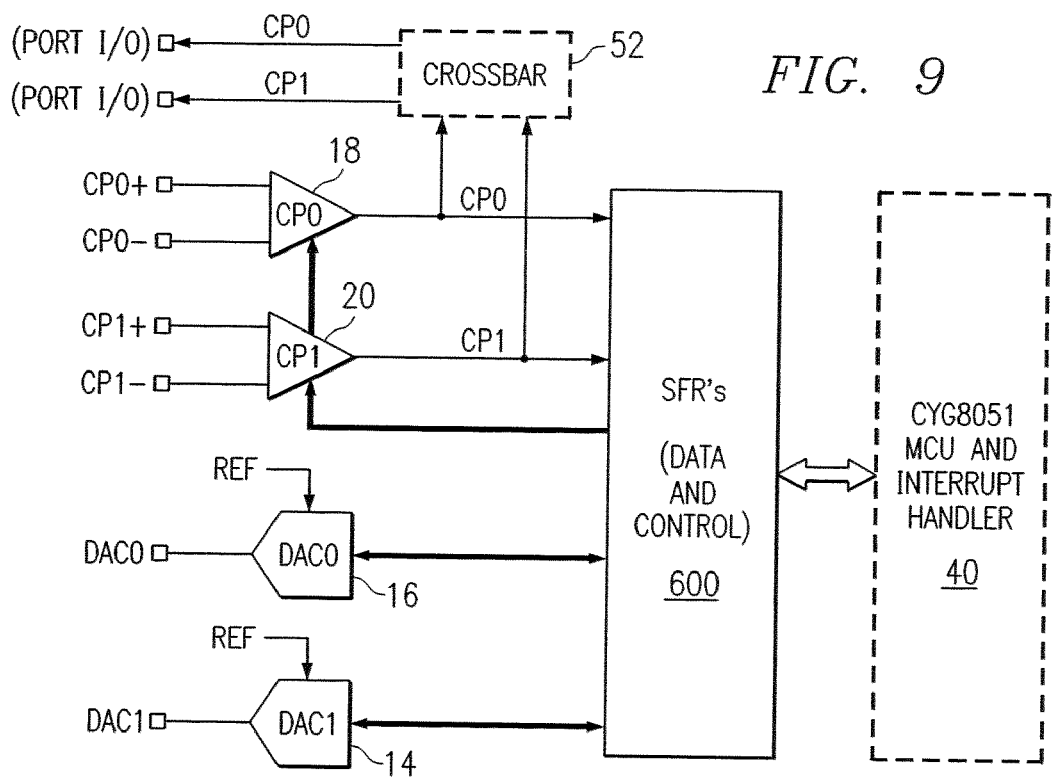
FIG. 9 illustrates the comparator and DAC diagrams.
Figure 12:
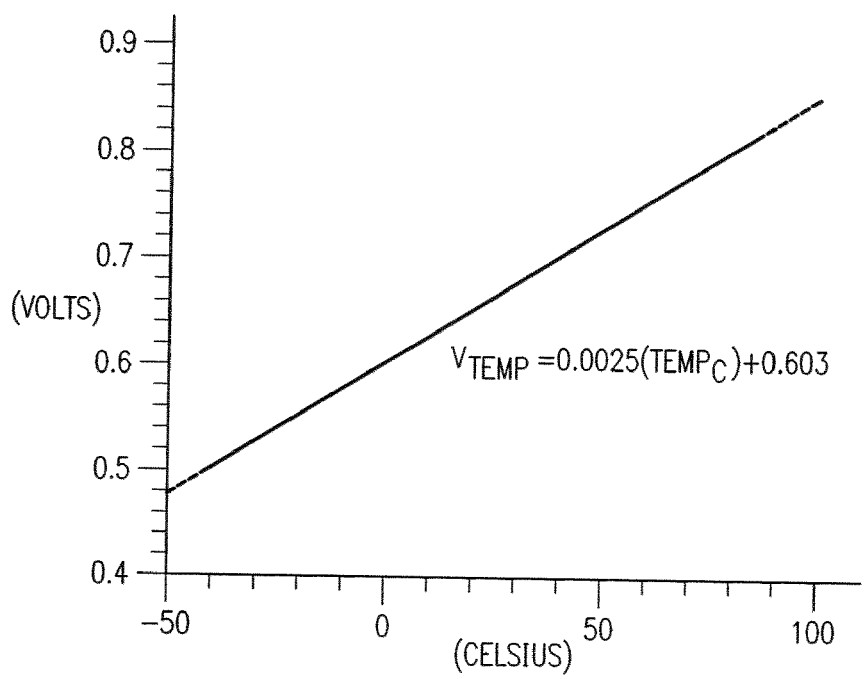
FIG. 12 illustrates a diagram for the temperature sensor.

Referring now to FIG. 9, there is illustrated a block diagram of the Comparator/DAC function. The integrated circuit has two 12-bit DACs 14 and 16 and two comparators 18 and 20 on chip. The MCU data and control interface to each comparator and DAC is via Special Function Registers 600. The MCU can place any DAC or comparator in low power shutdown mode. The comparators have software programmable hysteresis. Each comparator can generate an interrupt on its rising edge, falling edge, or both. The comparators' output state can also be polled in software. These interrupts are capable of waking up the MCU from sleep mode. The comparator outputs can be programmed to appear on the Port I/O pins via the Crossbar 52.

The DACs are voltage output mode and use the same voltage reference as the ADC 10. They are especially useful as references for the comparators or offsets for the differential inputs of the ADC 10. The operation of the DACs 14 and 16 is described in U.S. patent application Ser. No. 09/583,341, filed May 31, 2000, and entitled SEGMENTED D/A CONVERTER WITH ENHANCED DYNAMIC RANGE, and in U.S. patent application Ser. No. 09/584,311, filed May 31, 2000, and entitled D/A CONVERTER STREET EFFECT COMPENSATION, all of which are incorporated herein by reference.

Pinout and Package Definitions

The following are the pin definitions for various configurations.

| | | | | | Pin Definitions |
|---|---|---|---|---|---|
| Name | 'F000 64-Pin | 'F001 48-Pin | 'F002 32-Pin | Type | Description |
| $V_{DD}$ | 31, 40, 62 | 23, 32 | 18, 20 | | Digital Voltage Supply. |
| DGND | 30, 41, 61 | 22, 33, 27, 19 | 17, 21 | | Digital Ground. |
| AV+ | 16, 17 | 13, 43 | 9, 29 | | Positive Analog Voltage Supply. |
| AGND | 5, 15 | 44, 12 | 8, 30 | | Analog Ground. |
| TCK | 22 | 18 | 14 | D In | JTAG Test Clock with internal pull-up. |
| TMS | 21 | 17 | 13 | D In | JTAG Test-Mode Select with internal pull-up. |
| TDI | 28 | 20 | 15 | D In | JTAG Test Data Input with internal pull-up. TDI is latched on a rising edge of TCK. |
| TDO | 29 | 21 | 16 | D Out | JTAG Test Data Output. Data is shifted out on TDO on the falling edge of TCK. TDO output is a tri-state driver. |
| XTAL1 | 18 | 14 | 10 | D In | Crystal Input. This pin is the return for the internal oscillator circuit for a crystal or ceramic resonator. For a precision internal clock, connect a crystal or ceramic resonator from XTAL1 to XTAL2. If overdriven by an external CMOS clock, this becomes the system clock. |
| XTAL2 | 19 | 15 | 11 | D Out | Crystal Output. This pin is the excitation driver for a crystal or ceramic resonator. |
| /RST | 20 | 16 | 12 | D I/O | Chip Reset. Open-drain output of internal Voltage Supply monitor. Is driven low when VDD is <2.7 V. An external source can force a system reset by driving this pin low. |
| VREF | 6 | 3 | 3 | A I/O | Voltage Reference. When configured as an input, this pin is the voltage reference for the MCU. Otherwise, the internal reference drives this pin. |
| CP0+ | 4 | 2 | 2 | A In | Comparator 0 Non-Inverting Input. |
| CP0− | 3 | 1 | 1 | A In | Comparator 0 Inverting Input. |
| CP1+ | 2 | 45 | | A In | Comparator 1 Non-Inverting Input. |
| CP1− | 1 | 46 | | A In | Comparator 1 Inverting Input. |
| DAC0 | 64 | 48 | 32 | A Out | Digital to Analog Converter Output 0. The DAC0 voltage output. |
| DAC1 | 63 | 47 | 31 | A Out | Digital to Analog Converter Output 1. The DAC1 voltage output. |
| AIN0 | 7 | 4 | 4 | A In | Analog Mux Channel Input 0. |
| AIN1 | 8 | 5 | 5 | A In | Analog Mux Channel Input 1. |
| AIN2 | 9 | 6 | 6 | A In | Analog Mux Channel Input 2. |
| AIN3 | 10 | 7 | 7 | A In | Analog Mux Channel Input 3. |
| AIN4 | 11 | 8 | | A In | Analog Mux Channel Input 4. |
| AIN5 | 12 | 9 | | A In | Analog Mux Channel Input 5. |
| AIN6 | 13 | 10 | | A In | Analog Mux Channel Input 6. |
| AIN7 | 14 | 11 | | A In | Analog Mux Channel Input 7. |
| P0.0 | 39 | 31 | 19 | D I/O | Port0 Bit0. |
| P0.1 | 42 | 34 | 22 | D I/O | Port0 Bit1. |

-continued

Pin Definitions

| Name | 'F000 64-Pin | 'F001 48-Pin | 'F002 32-Pin | Type | Description |
|---|---|---|---|---|---|
| P0.2 | 47 | 35 | 23 | D I/O | Port0 Bit2. |
| P0.3 | 48 | 36 | 24 | D I/O | Port0 Bit3. |
| P0.4 | 49 | 37 | 25 | D I/O | Port0 Bit4. |
| P0.5 | 50 | 38 | 26 | D I/O | Port0 Bit5. |
| P0.6 | 55 | 39 | 27 | D I/O | Port0 Bit6. |
| P0.7 | 56 | 40 | 28 | D I/O | Port0 Bit7. |
| P1.0 | 38 | 30 | | D I/O | Port1 Bit0. |
| P1.1 | 37 | 29 | | D I/O | Port1 Bit1. |
| P1.2 | 36 | 28 | | D I/O | Port1 Bit2. |
| P1.3 | 35 | 26 | | D I/O | Port1 Bit3. |
| P1.4 | 34 | 25 | | D I/O | Port1 Bit4. |
| P1.5 | 32 | 24 | | D I/O | Port1 Bit5. |
| P1.6 | 60 | 42 | | D I/O | Port1 Bit6. |
| P1.7 | 59 | 41 | | D I/O | Port1 Bit7. |
| P2.0 | 33 | | | D I/O | Port2 Bit0. |
| P2.1 | 27 | | | D I/O | Port2 Bit1. |
| P2.2 | 54 | | | D I/O | Port2 Bit2. |
| P2.3 | 53 | | | D I/O | Port2 Bit3. |
| P2.4 | 52 | | | D I/O | Port2 Bit4. |
| P2.5 | 51 | | | D I/O | Port2 Bit5. |
| P2.6 | 44 | | | D I/O | Port2 Bit6. |
| P2.7 | 43 | | | D I/O | Port2 Bit7. |
| P3.0 | 26 | | | D I/O | Port3 Bit0. |
| P3.1 | 25 | | | D I/O | Port3 Bit1. |
| P3.2 | 24 | | | D I/O | Port3 Bit2. |
| P3.3 | 23 | | | D I/O | Port3 Bit3. |
| P3.4 | 58 | | | D I/O | Port3 Bit4. |
| P3.5 | 57 | | | D I/O | Port3 Bit5. |
| P3.6 | 46 | | | D I/O | Port3 Bit6. |
| P3.7 | 45 | | | D I/O | Port3 Bit7. |

Analog to Digital Converter

Figure 10:
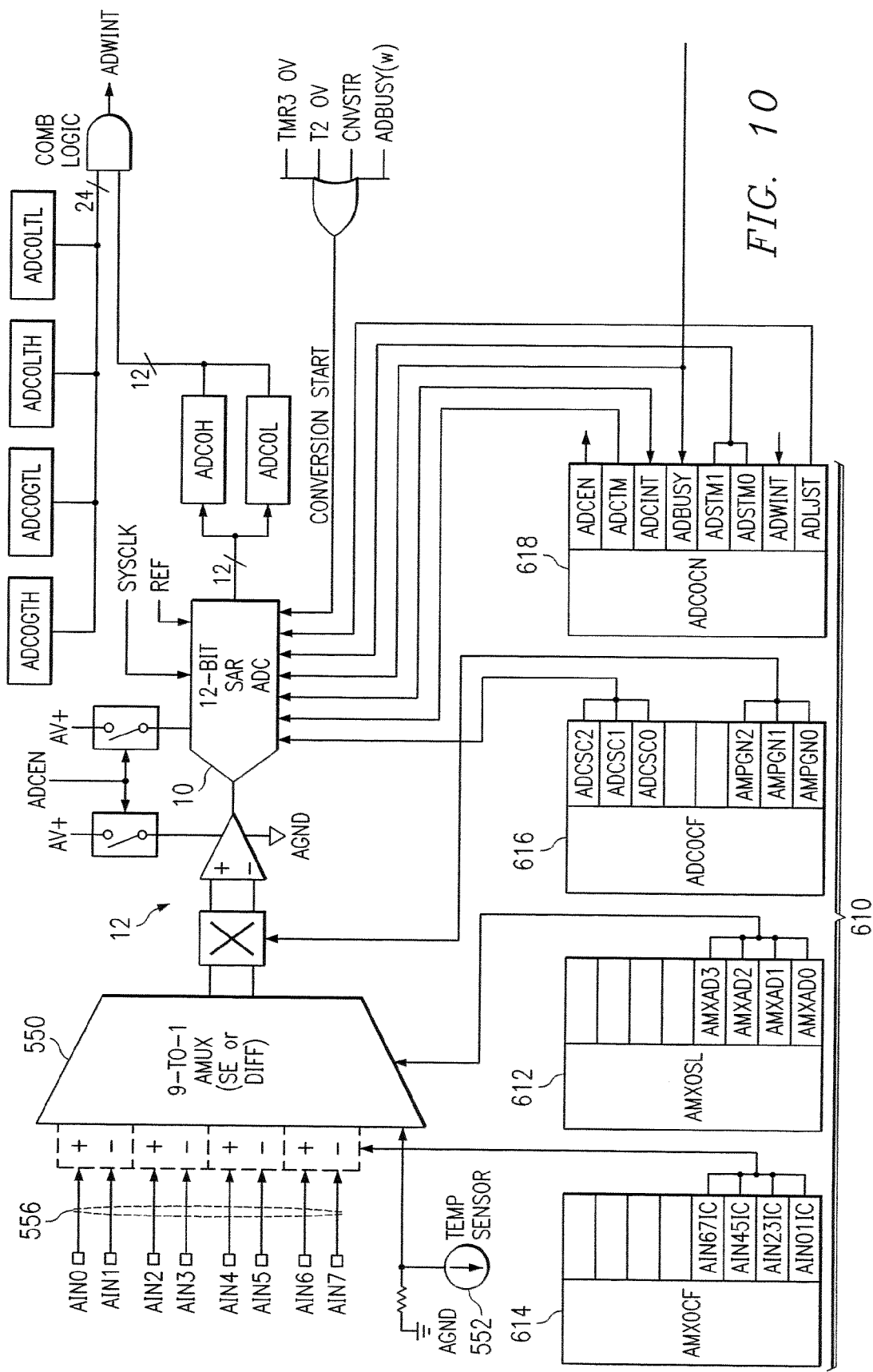
FIG. 10 illustrates the ADC.
Figure 11A:
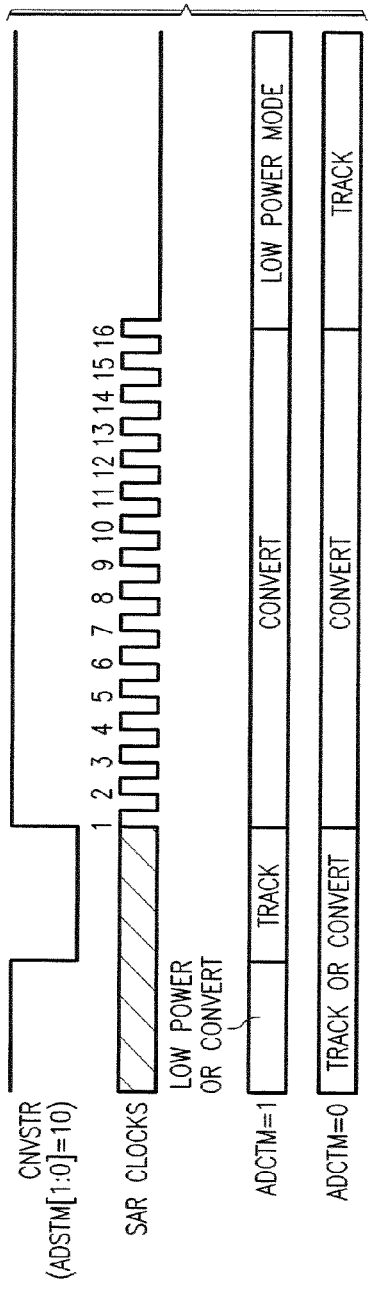
FIGS. 11A and 11B illustrate a timing diagram for the ADC.
Figure 11B:
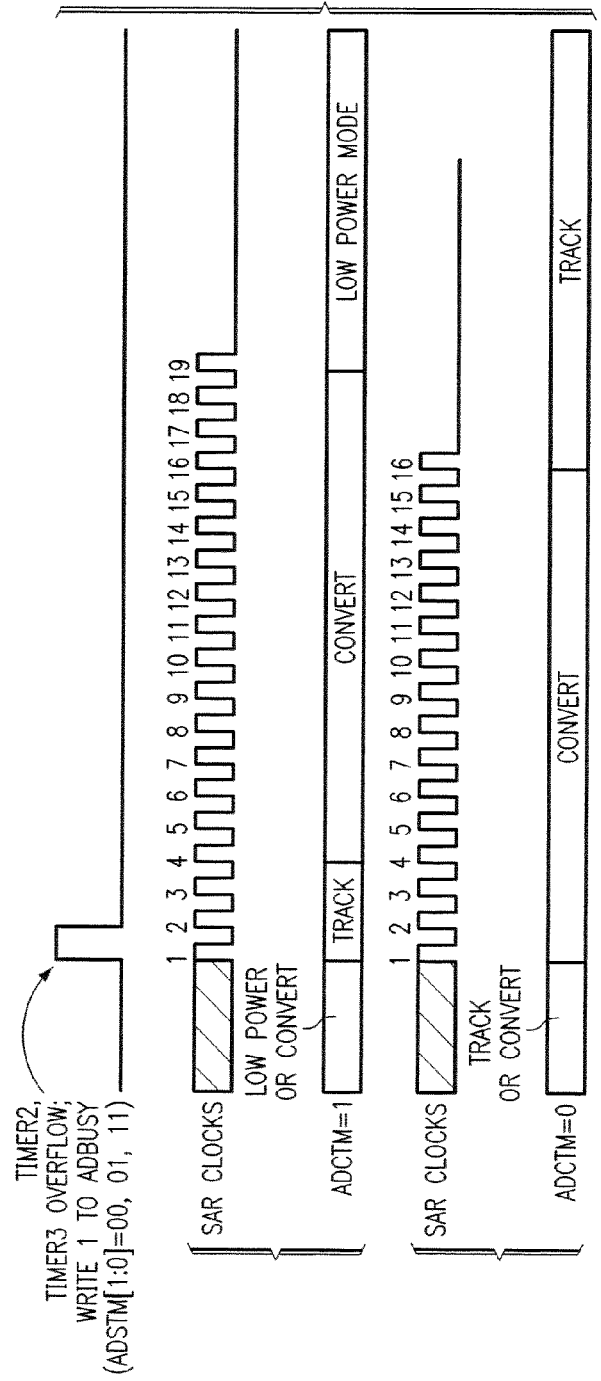

Referring now to FIG. 10, there is illustrated a more detailed diagram of the ADC 10. The ADC subsystem consists of the 9-channel, configurable analog multiplexer (AMUX) 350, the programmable gain amplifier (PGA) 12, and a 100 ksps, 12-bit successive-approximation-register ADC with integrated track-and-hold and programmable window detector. The AMUX, PGA, Data Conversion Modes, and Window Detector are all configurable under software control via the Special Function Register's 610. The ADC subsystem (ADC, track-and-hold and PGA) is enabled only when the ADCEN bit in the ADC Control register (ADC0CN,) is set to 1 as illustrated in timing diagrams in FIGS. 11A and 11B. The ADC subsystem is in low power shutdown when this bit is 0.

Analog Multiplexer and PGA

Eight of the AMUX channels are available for external measurements while the ninth channel is internally connected to an on-board temperature sensor 552 (temperature transfer function is shown in FIGS. 13A and 13B). AMUX input pairs can be programmed to operate in either the differential or single-ended mode. This allows the user to select the best measurement technique for each input channel, and even accommodates mode changes "on-the-fly". The AMUX defaults to all single-ended inputs upon reset. There are two registers associated with the AMUX: a Channel Selection register AMX0SL 612, and a Configuration register AMX0CF 614. Table 2 shows AMUX functionality by channel, for each possible configuration with Table 3 illustrating the AMX0CF functionality. The PGA 12 amplifies the AMUX output signal by an amount determined by the states of the AMPGN2-0 bits in the ADC Configuration register, ADC0CF, illustrated in Table 4. The PGA can be software-programmed for gains of 0.5, 2, 4, 8 or 16. It defaults to unity gain on reset.

ADC Modes of Operation

The ADC has a maximum conversion speed of 100 ksps. The ADC conversion clock is derived from the system clock. Conversion speed can be reduced by a factor of 2, 4, 8 or 16 via the ADCSC bits in the ADC0CF Register 616. This is useful to adjust conversion speed to accommodate different system clock speeds.

A conversion can be initiated in one of four ways, depending on the programmed states of the ADC Start of Conversion Mode bits (ADSTM1, ADSTM0) in an ADC0CN register 618. Conversions may be initiated by:

Writing a 1 to the ADBUSY bit of ADC0CN;
A Timer 3 overflow (i.e. timed continuous conversions);
A rising edge detected on the external ADC convert start signal, CNVSTR;
A Timer 2 overflow (i.e. timed continuous conversions).

Writing a 1 to ADBUSY provides software control of the ADC whereby conversions are performed "on-demand". During conversion, the ADBUSY bit is set to 1 and restored to 0 when conversion is complete. The falling edge of ADBUSY triggers an interrupt (when enabled) and sets the interrupt flag in ADC0CN. Converted data is available in the ADC data word MSB and LSB registers, ADC0H, ADC0L. Converted data can be either left or right justified in the ADC0H:ADC0L register pair depending on the programmed state of the ADL-JST bit in the ADC0CN register. This is illustrated in Table 5.

The ADCTM bit in register ADC0CN 618 controls the ADC track-and-hold mode. In its default state, the ADC input is continuously tracked, except when a conversion is in progress. Setting ADCTM to 1 allows one of four different low power track-and-hold modes to be specified by states of the ADSTM1-0 bits (also in ADC0CN):

Tracking begins with a write of 1 to ADBUSY and lasts for 3 SAR clocks;

Tracking starts with an overflow of Timer 3 and lasts for 3 SAR clocks;

Tracking is active only when the CNVSTR input is low;

Tracking starts with an overflow of Timer 2 and lasts for 3 SAR clocks.

Modes 1, 2 and 3 (above) are useful when the start of conversion is triggered in software command or when the ADC is operated continuously. Mode 4 is used when the start of conversion is triggered by external hardware. In this case, the track-and-hold is in its low power mode at times when the CNVSTR input is high. Tracking can also be disabled (shutdown) when the entire chip is in low power standby or sleep modes.

ADC Programmable Window Detector

The ADC programmable window detector is very useful in many applications. It continuously compares the ADC output to user-programmed limits and notifies the system when an out-of-band condition is detected. This is especially effective in an interrupt-driven system, saving code space and CPU bandwidth while delivering faster system response times. The window detector interrupt flag (ADWINT in ADC0CN) can also be used in polled mode. The high and low bytes of the reference words are loaded into the ADC Greater-Than and ADC Less-Than registers (ADC0GTH, ADC0GTL, ADC0LTH, and ADC0LTL). FIGS. 13A, 13B, 14A and 14B show example comparisons for reference. Notice that the window detector flag can be asserted when the measured data is inside or outside the user-programmed limits, depending on the programming of the ADC0GTx and ADC0LTx registers.

DACs 12 Bit Voltage Mode

Figure 15:
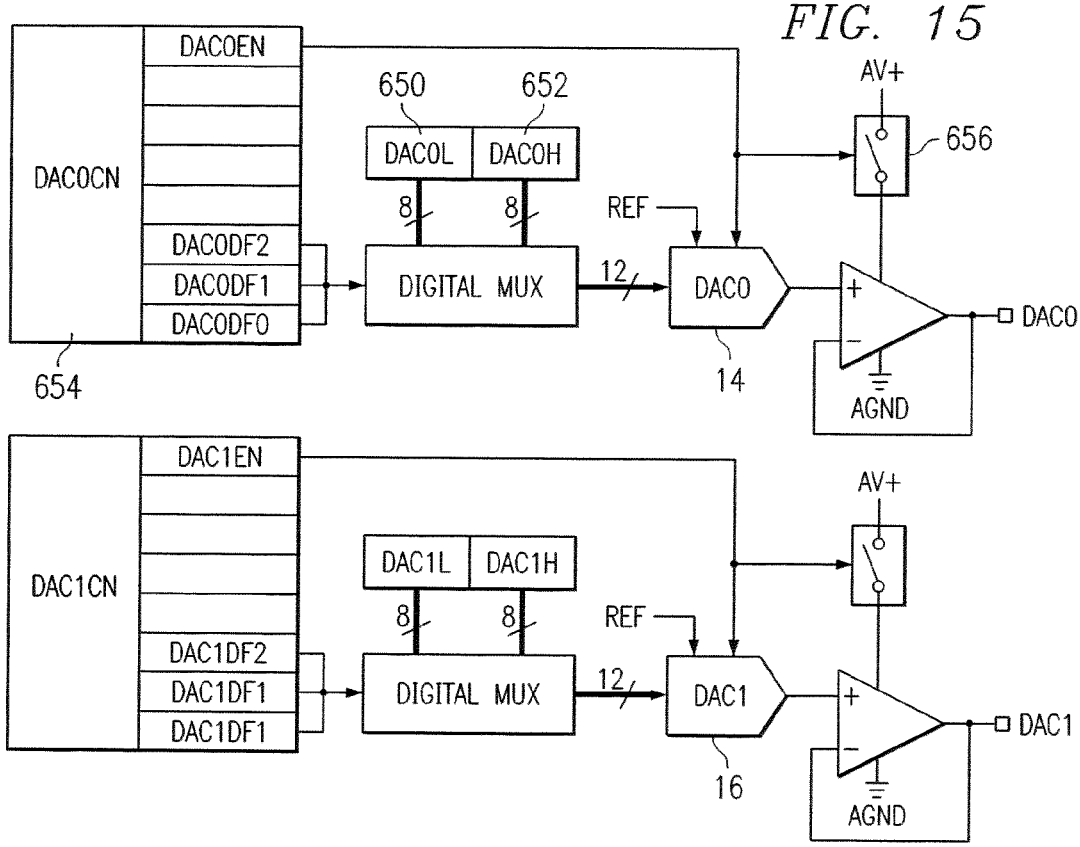
FIG. 15 illustrates the DAC functional block diagram.

Referring now to FIG. 15, there is illustrated a clock diagram of the DAC section. The MCU has two 12-bit voltage-mode Digital to Analog Converters 14 and 16. Each DAC has an output swing of 0V to VREF-1LSB for a corresponding input code range of 0x000 to 0xFFF. Using DAC0 14 as an example, the 12-bit data word is written to the low byte (DAC0L) and high byte (DAC0H) data registers 650 and 652. Data is latched into DAC0 after a write to the corresponding DAC0H register, so the write sequence should be DAC0L followed by DAC0H if the full 12-bit resolution is required. The DAC can be used in 8-bit mode by initializing DAC0L to the desired value (typically 0x00), and writing data to only DAC0H. DAC0 Control Register (DAC0CN) 654 provides for enabling/disabling DAC0 and to modify its input data formatting.

The DAC0 enable/disable function is controlled by the DAC0EN bit (DAC0CN.7). Writing a 1 to DAC0EN enables DAC0 while writing a 0 to DAC0EN disables DAC0 with switch 656. While disabled, the output of DAC0 is maintained in a high-impedance state, and the DAC0 supply current falls to 1 uA or less.

In some instances, input data should be shifted prior to a DAC0 write operation to properly justify data within the DAC input registers. This action would typically require one or more load and shift operations, adding software overhead and slowing DAC throughput. To alleviate this problem, the data-formatting feature provides a means for the user to program the orientation of the DAC0 data word within data registers DAC0H and DAC0L. The three DAC0DF bits (DAC0CN.[2: 0]) allow the user to specify one of five data word orientations as shown in the DAC0CN register definition. DAC1 is functionally the same as DAC0 described above. DAC1 is functionally the same as DAC0 described above in Tables 8-13.

Comparators

Figure 16:
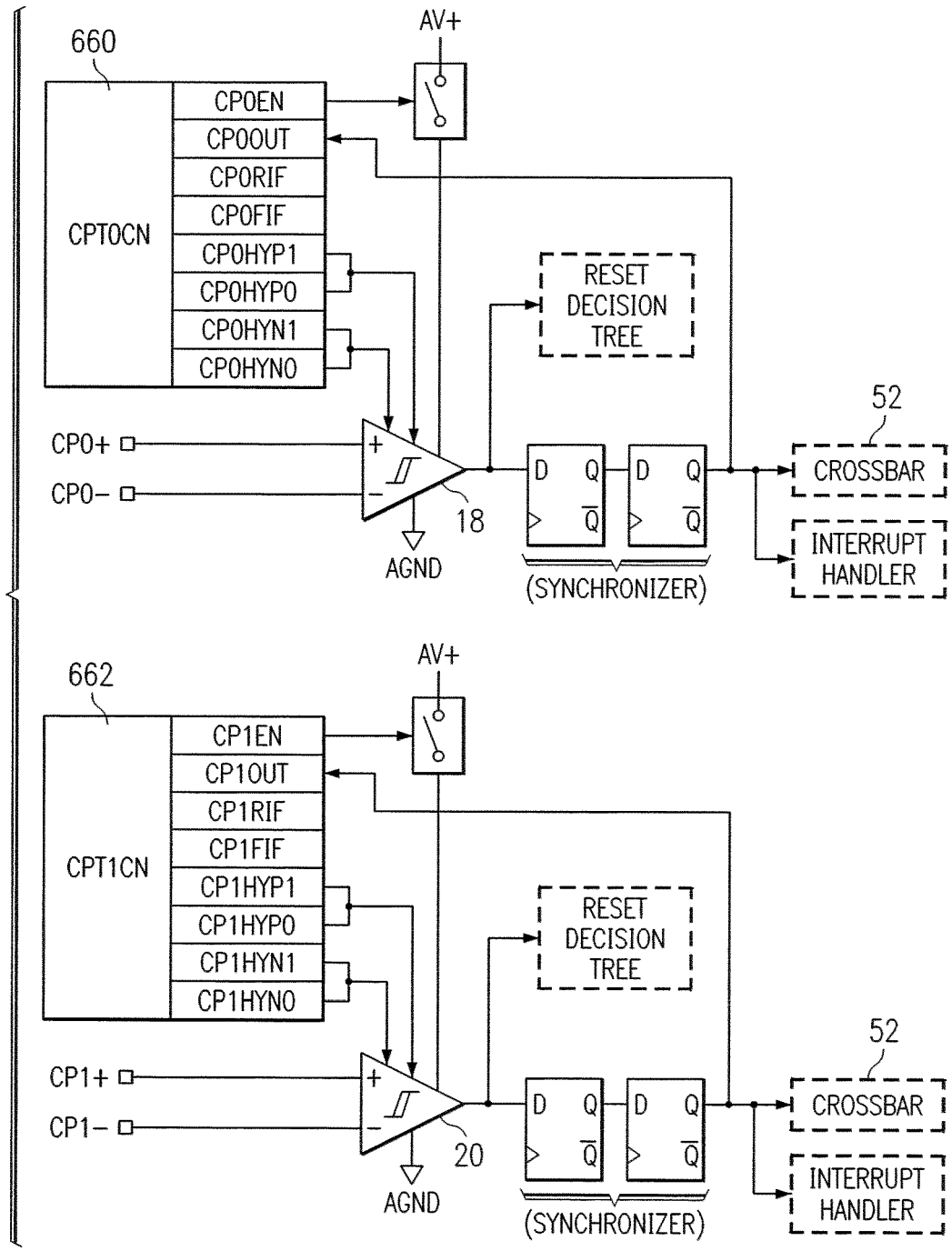
FIG. 16 illustrates the comparator diagram.

Referring now to FIG. 16, there is illustrated a block diagram of the comparator section. The MCU has two on-board voltage comparators 18 and 20. The inputs of each Comparator are available at the package pins. The output of each comparator is optionally available at the package pins via the I/O crossbar 52. When assigned to package pins, each comparator output can be programmed to operate in open drain or push-pull modes.

The hysteresis of each comparator is software-programmable via its respective Comparator control register (CPT0CN 660, CPT1CN 662). The user can program both the amount of hysteresis voltage (referred to the input voltage) and the positive and negative-going symmetry of this hysteresis around the threshold voltage. The output of the comparator can be polled in software, or can be used as an interrupt source. Each comparator can be individually enabled or disabled (shutdown). When disabled, the comparator output (if assigned to a Port I/O pin via the Crossbar) defaults to the logic low state, its interrupt capability is suspended and its supply current falls to less than 1 uA. Comparator 0 inputs can be externally driven from −0.25V to (AV+)+0.25V without damage or upset.

Figure 17:
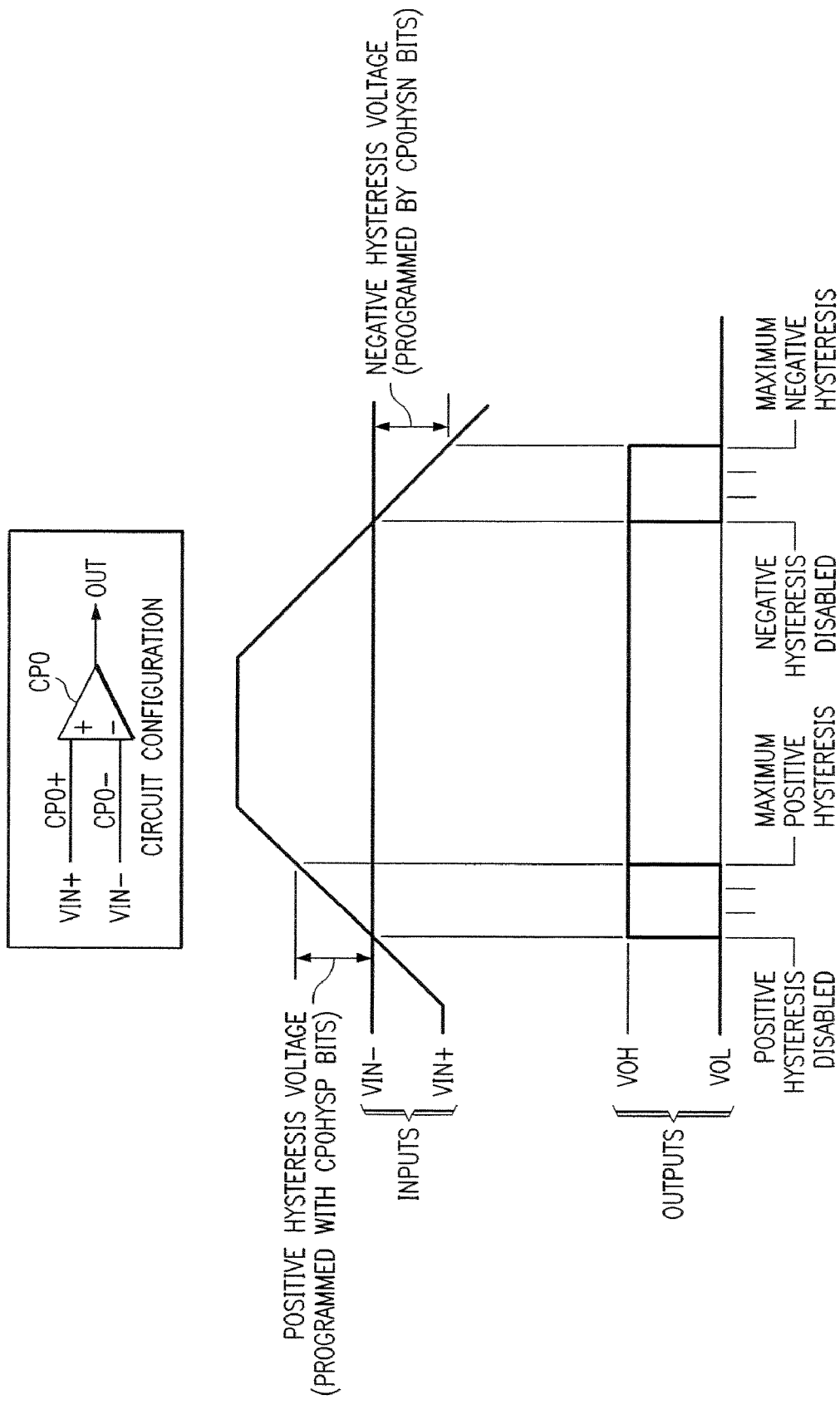
FIG. 17 illustrates the comparator hysteresis plot.

The Comparator 0 hysteresis is programmed using bits 3-0 in the Comparator 0 Control Register CPT0CN (shown in Table 11). The amount of negative hysteresis voltage is determined by the settings of the CP0HYN bits. As shown in FIG. 17, settings of 20, 10 or 5 mV of negative hysteresis can be programmed, or negative hysteresis can be disabled. In a similar way, the amount of positive hysteresis is determined by the setting the CP0HYP bits.

Comparator interrupts can be generated on both rising-edge and falling-edge output transitions. The CP0FIF flag is set upon a Comparator 0 falling-edge interrupt, and the CP0RIF flag is set upon the Comparator 0 rising-edge interrupt. Once set, these bits remain set until cleared by the CPU. The Output State of Comparator 0 can be obtained at any time by reading the CP0OUT bit. Comparator 0 is enabled by setting the CP0EN bit, and is disabled by clearing this bit. Comparator 0 can also be programmed as a reset source.

The operation of Comparator 1 is identical to that of Comparator 0, except the Comparator 1 is controlled by the CPT1CN Register as set forth in Table 12. Also, Comparator 1 can not be programmed as a reset source.

Voltage Reference

Figure 18:
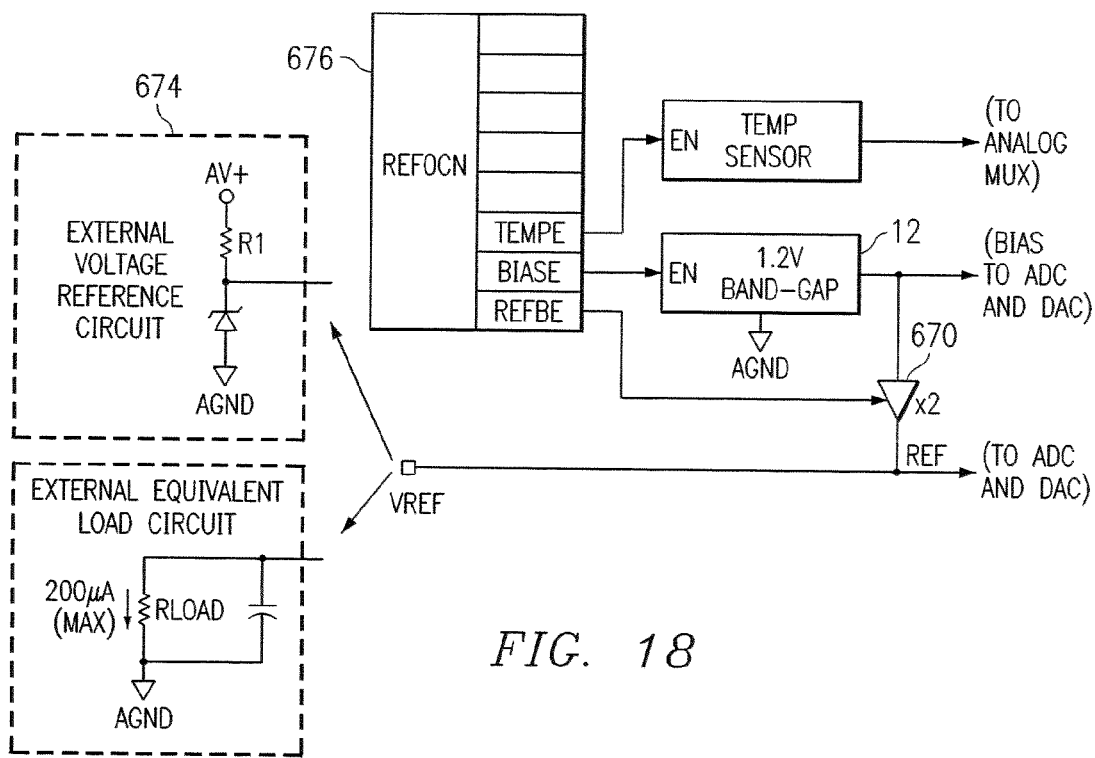
FIG. 18 illustrates a voltage reference functional block diagram.

Referring now to FIG. 18, the voltage reference circuit consists of a 1.2V, 30 ppm/° C. (typical) bandgap voltage reference generator and a gain-of-two output buffer amplifier. The reference voltage on VREF can be connected to external devices in the system, as long as the maximum load seen by the VREF pin is less than 10 uA to AGND.

If a different reference voltage is required, an external reference 674 can be connected to the VREF pin and the internal bandgap and buffer amplifier disabled in software. The external reference voltage must still be less than AV+− 0.3V. A Reference Control Register 676, REF0CN (defined in Table 13), provides for enabling or disabling the bandgap and buffer amplifier 670. The BIASE bit in REF0CN enables the on-board bandgap reference while the REFBE bit enables the buffer amplifier 670 which drives the VREF pin. When dis abled, the supply current drawn by the bandgap and buffer amplifier falls to less than 1 uA (typical) and the output of the buffer amplifier 670 enters a high impedance state. If the internal bandgap is used as the reference voltage generator, BIASE and REFBE must both be set to 1. If an external reference 674 is used, REFBE must be set to 0 and BIASE must be set to 1. If neither the ADC nor the DAC are being used, both of these bits can be set to 0 to conserve power.

The temperature sensor connects to the highest order input of the A/D converter's input multiplexer. The TEMPE bit within REF0CN enables and disables the temperature sensor. While disabled, the temperature sensor defaults to a high impedance state and any A/D measurements performed on the sensor while disabled result in meaningless data.

Microcontroller

Figure 19:
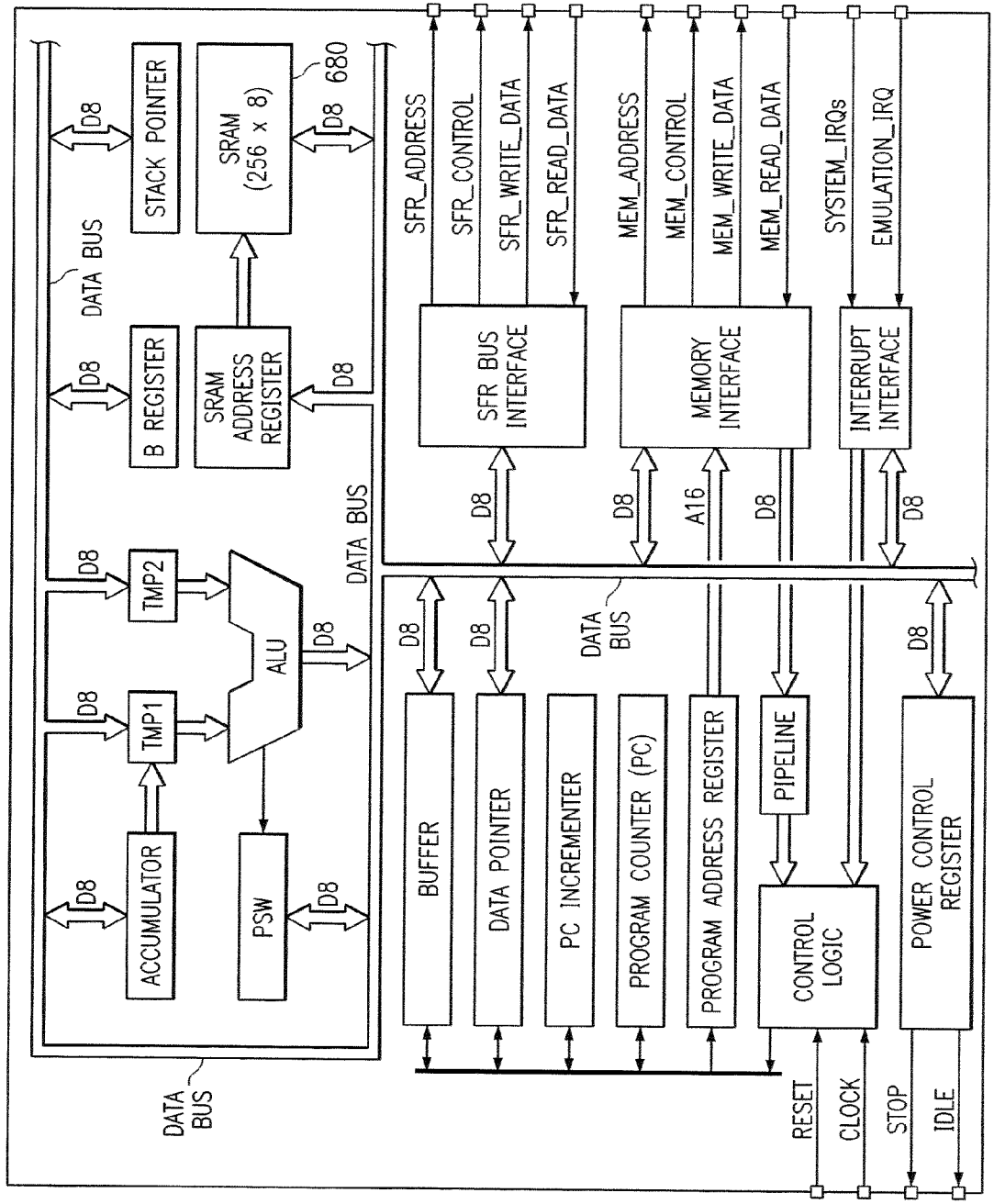
FIG. 19 illustrates a block diagram of the microcontroller core.

Referring now to FIG. 19, there is illustrated a block diagram of the Microcontroller 40. The MCU's system controller core is the Microcontroller 40. The Microcontroller 40 is fully compatible with the MCS-51™ instruction set. Standard 803x/805x assemblers and compilers can be used to develop software. The MCU has a superset of all the peripherals included with a standard 8051. Included are four 16-bit counter/timers, a full-duplex UART, 256 bytes of internal RAM 680, 128 byte Special Function Register (SFR) address space, and four byte-wide I/O Ports. The Microcontroller 40 also includes on-chip emulation hardware, and interfaces directly with the MCU's analog and digital subsystems providing a complete data acquisition or control-system solution in a single integrated circuit.

Features

The Microcontroller 40 core implements the standard 8051 organization and peripherals as well as additional custom peripherals and functions to extend its capability. The Microcontroller 40 includes the following features:

Fully Compatible with MCS-51 Instruction Set
    20 MIPS Peak Throughput with 20 MHz Clock
    0 to 20 MHz Clock Frequency
    256 Bytes of Internal RAM
    32 k Byte Flash Program Memory
    Four Byte-Wide I/O Ports
    Extended Interrupt Handler
    Reset Input
    Power Management Modes
    On-chip Emulation Logic
    Program and Data Memory Security Performance The Microcontroller 40 employs a pipelined architecture that greatly increases its instruction throughput over the standard 8051 architecture. In a standard 8051, all instructions except for MUL and DIV take 12 or 24 system clock cycles to execute, and usually have a maximum system clock of 12 MHz. By contrast, the Microcontroller 40 core executes seventy percent (70%) of its instructions in one or two system clock cycles, with no instructions taking more than eight system clock cycles.

With the Microcontroller 40's maximum system clock at 20 MHz, it has a peak throughput of 20 MIPS. The Microcontroller 40 has a total of 109 instructions. The number of instructions versus the system clock cycles required to execute them is as follows:

| Instructions | | | | | | | | |
|---|---|---|---|---|---|---|---|---|
| 26 | 50 | 5 | 14 | 7 | 3 | 1 | 2 | 1 |
| Clocks to Execute 1 | 2 | 2/3 | 3 | 3/4 | 4 | 4/5 | 5 | 8 |

Programming and Debugging Support

A JTAG-based serial interface is provided for in-system programming of the Flash program memory and communication with on-chip emulation support logic. The reprogrammable Flash can also be read and changed a single byte at a time by the application software using the MOVC and MOVX instructions. This feature allows program memory to be used for non-volatile data storage as well as updating program code under software control.

The on-chip emulation support logic facilitates full speed in-circuit debugging, allowing the setting of hardware breakpoints and watch points, starting, stopping and single stepping through program execution (including interrupt service routines), examination of the program's call stack, and reading/writing the contents of registers and memory. This method of on-chip emulation is completely non-intrusive and non-evasive, requiring no RAM, Stack, timers, or other on-chip resources.

Instruction Set

The instruction set of the Microcontroller 40 System Controller is fully compatible with the standard MCS-51™ instruction set. Standard 8051 development tools can be used to develop software for the Microcontroller 40. All Microcontroller 40 instructions are the binary and functional equivalent of their MCS-51™ counterparts, including opcodes, addressing modes and effect on PSW flags. However, instruction timing is different than that of the standard 8051.

Instruction and CPU Timing

In many 8051 implementations, a distinction is made between machine cycles and clock cycles, with machine cycles varying from 2 to 12 clock cycles in length. However, the Microcontroller 40 implementation is based solely on clock cycle timing. All instruction timings are specified in terms of clock cycles.

Due to the pipelined architecture of the Microcontroller 40, most instructions execute in the same number of clock cycles as there are program bytes in the instruction. Conditional branch instructions take one less clock cycle to complete when the branch is not taken as opposed to when the branch is taken. Table 14 illustrates the Instruction Set Summary for the Microcontroller 40, which includes the mnemonic, number of bytes, and number of clock cycles for each instruction.

MOVX Instruction and Program Memory

The MOVX instruction is typically used to access external data memory. The Microcontroller 40 does not support external data or program memory. In the Microcontroller 40, the MOVX instruction accesses the on-chip program memory space implemented as re-programmable Flash memory. This feature provides a mechanism for the Microcontroller 40 to update program code and use the program memory space for non-volatile data storage.

TABLE 14

Microcontroller 40 Instruction Set Summary

| Mnemonic | Description | Bytes | Clock Cycles |
|---|---|---|---|
| ARITHMETIC OPERATIONS | | | |
| ADD A,Rn | Add register to A | 1 | 1 |
| ADD A,direct | Add direct byte to A | 2 | 2 |
| ADD A,@Ri | Add indirect RAM to A | 1 | 2 |
| ADD A,#data | Add immediate to A | 2 | 2 |
| ADDC A,Rn | Add register to A with carry | 1 | 1 |
| ADDC A,direct | Add direct byte to A with carry | 2 | 2 |
| ADDC A,@Ri | Add indirect RAM to A with carry | 1 | 2 |
| ADDC A,#data | Add immediate to A with carry | 2 | 2 |
| SUBB A,Rn | Subtract register from A with borrow | 1 | 1 |
| SUBB A,direct | Subtract direct byte from A with borrow | 2 | 2 |
| SUBB A,@Ri | Subtract indirect RAM from A with borrow | 1 | 2 |
| SUBB A,#data | Subtract immediate from A with borrow | 2 | 2 |
| INC A | Increment A | 1 | 1 |
| INC Rn | Increment register | 1 | 1 |
| INC direct | Increment direct byte | 2 | 2 |
| INC @Ri | Increment indirect RAM | 1 | 2 |
| DEC A | Decrement A | 1 | 1 |
| DEC Rn | Decrement register | 1 | 1 |
| DEC direct | Decrement direct byte | 2 | 2 |
| DEC @Ri | Decrement indirect RAM | 1 | 2 |
| INC DPTR | Increment Data Pointer | 1 | 1 |
| MUL AB | Multiply A and B | 1 | 4 |
| DIV AB | Divide A by B | 1 | 8 |
| DA A | Decimal Adjust A | 1 | 1 |
| LOGICAL OPERATIONS | | | |
| ANL A,Rn | AND Register to A | 1 | 1 |
| ANL A,direct | AND direct byte to A | 2 | 2 |
| ANL A,@Ri | AND indirect RAM to A | 1 | 2 |
| ANL A,#data | AND immediate to A | 2 | 2 |
| ANL direct,A | AND A to direct byte | 2 | 2 |
| ANL direct,#data | AND immediate to direct byte | 3 | 3 |
| ORL A,Rn | OR Register to A | 1 | 1 |
| ORL A,direct | OR direct byte to A | 2 | 2 |
| ORL A,@Ri | OR indirect RAM to A | 1 | 2 |
| ORL A,#data | OR immediate to A | 2 | 2 |
| ORL direct,A | OR A to direct byte | 2 | 2 |
| ORL direct,#data | OR immediate to direct byte | 3 | 3 |
| XRL A,Rn | Exclusive-OR Register to A | 1 | 1 |
| XRL A,direct | Exclusive-OR direct byte to A | 2 | 2 |
| XRL A,@Ri | Exclusive-OR indirect RAM to A | 1 | 2 |
| XRL A,#data | Exclusive-OR immediate to A | 2 | 2 |
| XRL direct,A | Exclusive-OR A to direct byte | 2 | 2 |
| XRL direct,#data | Exclusive-OR immediate to direct byte | 3 | 3 |
| CLR A | Clear A | 1 | 1 |
| CPL A | Complement A | 1 | 1 |
| RL A | Rotate A left | 1 | 1 |
| RLC A | Rotate A left through carry | 1 | 1 |
| RR A | Rotate A right | 1 | 1 |
| RRC A | Rotate A right through carry | 1 | 1 |
| SWAP A | Swap nibbles of A | 1 | 1 |
| DATA TRANSFER | | | |
| MOV A,Rn | Move register to A | 1 | 1 |
| MOV A,direct | Move direct byte to A | 2 | 2 |
| MOV A,@Ri | Move indirect RAM to A | 1 | 2 |
| MOV A,#data | Move immediate to A | 2 | 2 |
| MOV Rn,A | Move A to register | 1 | 1 |
| MOV Rn,direct | Move direct byte to register | 2 | 2 |
| MOV Rn,#data | Move immediate to register | 2 | 2 |
| MOV direct,A | Move A to direct byte | 2 | 2 |
| MOV direct,Rn | Move register to direct byte | 2 | 2 |
| MOV direct,direct | Move direct byte to direct | 3 | 3 |
| MOV direct,@Ri | Move indirect RAM to direct byte | 2 | 2 |
| MOV direct,#data | Move immediate to direct byte | 3 | 3 |
| MOV @Ri,A | Move A to indirect RAM | 1 | 2 |
| MOV @Ri,direct | Move direct byte to indirect RAM | 2 | 2 |
| MOV @Ri,#data | Move immediate to indirect RAM | 2 | 2 |
| MOV DPTR,#data16 | Load data pointer with 16-bit constant | 3 | 3 |
| MOVC A,@A+DPTR | Move code byte relative DPTR to A | 1 | 3 |
| MOVC A,@A+PC | Move code byte relative PC to A | 1 | 3 |
| MOVX A,@Ri | Move external data (8-bit address) to A | 1 | 3 |

TABLE 14-continued

Microcontroller 40 Instruction Set Summary

| Mnemonic | Description | Bytes | Clock Cycles |
|---|---|---|---|
| MOVX @Ri,A | Move A to external data (8-bit address) | 1 | 3 |
| MOVX A,@DPTR | Move external data (16-bit address) to A | 1 | 3 |
| MOVX @DPTR,A | Move A to external data (16-bit address) | 1 | 3 |
| PUSH direct | Push direct byte onto stack | 2 | 2 |
| POP direct | Pop direct byte from stack | 2 | 2 |
| XCH A,Rn | Exchange register with A | 1 | 1 |
| XCH A,direct | Exchange direct byte with A | 2 | 2 |
| XCH A,@Ri | Exchange indirect RAM with A | 1 | 2 |
| XCHD A,@Ri | Exchange low nibble of indirect RAM with A | 1 | 2 |
| BOOLEAN MANIPULATION | | | |
| CLR C | Clear carry | 1 | 1 |
| CLR bit | Clear direct bit | 2 | 2 |
| SETB C | Set carry | 1 | 1 |
| SETB bit | Set direct bit | 2 | 2 |
| CPL C | Complement carry | 1 | 1 |
| CPL bit | Complement direct bit | 2 | 2 |
| ANL C,bit | AND direct bit to carry | 2 | 2 |
| ANL C,/bit | AND complement of direct bit to carry | 2 | 2 |
| ORL C,bit | OR direct bit to carry | 2 | 2 |
| ORL C,/bit | OR complement of direct bit to carry | 2 | 2 |
| MOV C,bit | Move direct bit to carry | 2 | 2 |
| MOV bit,C | Move carry to direct bit | 2 | 2 |
| JC rel | Jump if carry is set | 2 | 2/3 |
| JNC rel | Jump if carry not set | 2 | 2/3 |
| JB bit,rel | Jump if direct bit is set | 2 | 3/4 |
| JNB bit,rel | Jump if direct bit is not set | 2 | 3/4 |
| JBC bit,rel | Jump if direct bit is set and clear bit | 3 | 3/4 |
| PROGRAM BRANCHING | | | |
| ACALL addr11 | Absolute subroutine call | 2 | 3 |
| LCALL addr16 | Long subroutine call | 3 | 4 |
| RET | Return from subroutine | 1 | 5 |
| RETI | Return from interrupt | 1 | 5 |
| AJMP addr11 | Absolute jump | 2 | 3 |
| LJMP addr16 | Long jump | 3 | 4 |
| SJMP rel | Short jump (relative address) | 2 | 3 |
| JMP @A+DPTR | Jump indirect relative to DPTR | 1 | 3 |
| JZ rel | Jump if A equals zero | 2 | 2/3 |
| JNZ rel | Jump if A does not equal zero | 2 | 2/3 |
| CJNE A,direct,rel | Compare direct byte to A and jump if not equal | 3 | 3/4 |
| CJNE A,#data,rel | Compare immediate to A and jump if not equal | 3 | 3/4 |
| CJNE Rn,#data,rel | Compare immediate to register and jump if not equal | 3 | 3/4 |
| CJNE @Ri,#data,rel | Compare immediate to indirect and jump if not equal | 3 | 4/5 |
| DJNZ Rn,rel | Decrement register and jump if not zero | 2 | 2/3 |
| DJNZ direct,rel | Decrement direct byte and jump if not zero | 3 | 3/4 |
| NOP | No operation | 1 | 1 |

Notes on Registers, Operands and Addressing Modes:
Rn - Register R0-R7 of the currently selected register bank.
@Ri - Data RAM location addressed indirectly through register R0-R1
rel - 8-bit, signed (two's compliment) offset relative to the first byte of the following instruction. Used by SJMP and all conditional jumps.
Direct - 8-bit internal data location's address. This could be a direct-access Data RAM location (0x00-0x7F) or an SFR (0x80-0xFF).
data - 8-bit constant
data 16 - 16-bit constant
bit - Direct-addressed bit in Data RAM or SFR.
Addr 11 - 11-bit destination address used by ACALL and AJMP. The destination must be within the same 2K-byte page of program memory as the first byte of the following instruction.
Addr 16 - 16-bit destination address used by LCALL and LJMP. The destination may be anywhere within the 64K-byte program memory space.
There is one unused opcode (0xA5) that performs the same function as NOP.
All mnemonics copyrighted © Intel Corporation 1980.

Memory Organization

Figure 20:
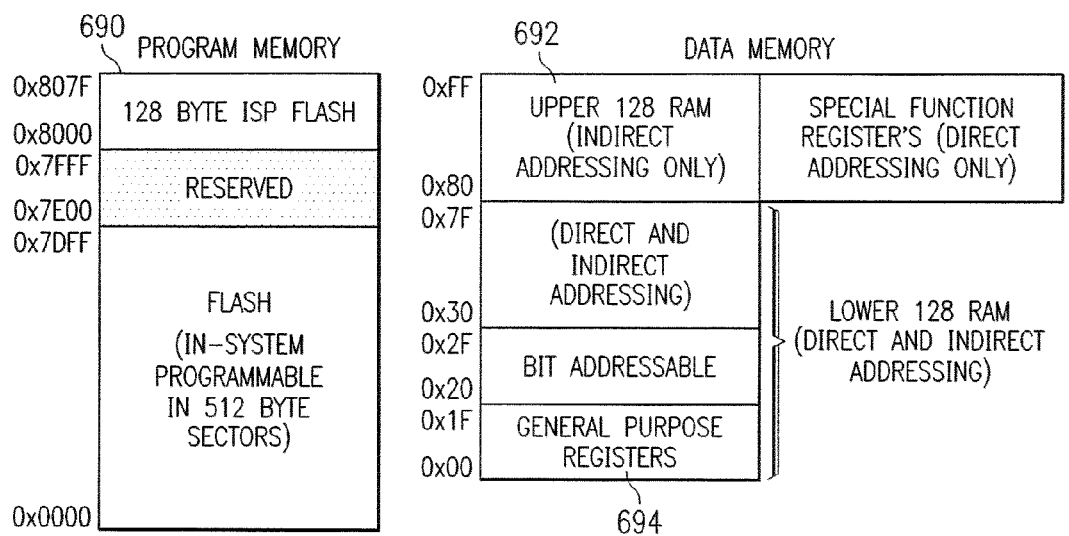
FIG. 20 illustrates a memory map.

Referring now to FIG. 20, there is illustrated a block diagram of the Memory Map for the memory. The memory organization of the Microcontroller 40 System Controller is similar to that of a standard 8051. There are two separate memory spaces: program memory 690 and data memory 692. Program and data memory share the same address space but are accessed via different instruction types. There are 256 bytes of internal data memory and 64K bytes of internal program memory address space implemented within the Microcontroller 40.

Program Memory

The Microcontroller 40 has a 64K-byte program memory space. The MCU implements 32896 bytes of this program memory space as in-system, reprogrammable Flash memory, organized in a contiguous block from addresses 0x0000 to 0x807F. Note: 512 bytes (0x7E00-0x7FFF) of this memory are reserved for factory use and are not available for user program storage.

Program memory is normally assumed to be read-only. However, the Microcontroller 40 can write to program memory by setting the Program Store Write Enable bit (PSCTL.7) and using the MOVX instruction. This feature provides a mechanism for the Microcontroller 40 to update program code and use the program memory space for non-volatile data storage.

Data Memory

The Microcontroller 40 implements 256 bytes of internal RAM mapped into the data memory space from 0x00 through 0xFF. The lower 128 bytes of data memory are used for general purpose registers and scratch pad memory. Either direct or indirect addressing may be used to access the lower 128 bytes of data memory. Locations 0x00 through 0x1F are addressable as four banks of general purpose registers 694, each bank consisting of eight byte-wide registers. The next 16 bytes, locations 0x20 through 0x2F, may either be addressed as bytes or as 128 bit locations accessible with the direct addressing mode.

The upper 128 bytes of data memory are accessible only by indirect addressing. This region occupies the same address space as the Special Function Registers (SFR) but is physically separate from the SFR space. The addressing mode used by an instruction when accessing locations above 0x7F determines whether the CPU accesses the upper 128 bytes of data memory space or the SFRs. Instructions that use direct addressing will access the SFR space. Instructions using indirect addressing above 0x7F access the upper 128 bytes of data memory.

General Purpose Registers

The lower 32 bytes of data memory, locations 0x00 through 0x1F, may be addressed as four banks of general-purpose registers. Each bank consists of eight byte-wide registers designated R0 through R7. Only one of these banks may be enabled at a time. Two bits in the program status word, RS0 (PSW.3) and RS1 (PSW.4), select the active register bank (see description of the PSW in Table 15). This allows fast context switching when entering subroutines and interrupt service routines. Indirect addressing modes use registers R0 and R1 as index registers.

Bit Addressable Locations

In addition to direct access to data memory organized as bytes, the sixteen data memory locations at 0x20 through 0x2F are also accessible as 128 individually addressable bits. Each bit has a bit address from 0x00 to 0x7F. Bit 0 of the byte at 0x20 has bit address 0x00 while bit 7 of the byte at 0x20 has bit address 0x07. Bit 7 of the byte at 0x2F has bit address 0x7F. A bit access is distinguished from a full byte access by the type of instruction used (bit source or destination operands as opposed to a byte source or destination).

The MCS-51™ assembly language allows an alternate notation for bit addressing of the form XX.B where XX is the byte address and B is the bit position within the byte. For example, the instruction:

MOV C, 22.3 h moves the Boolean value at 0x13 (bit 3 of the byte at location 0x22) into the user Carry flag.

Stack

A programmer's stack can be located anywhere in the 256-byte data memory. The stack area is designated using the Stack Pointer (SP, 0x81) SFR. The SP will point to the last location used. The next value pushed on the stack is placed at SP+1 and then SP is incremented. A reset initializes the stack pointer to location 0x07. Therefore, the first value pushed on the stack is placed at location 0x08, which is also the first register (R0) of register bank 1. Thus, if more than one register bank is to be used, the SP should be initialized to a location in the data memory not being used for data storage. The stack depth can extend up to 256 bytes.

The MCU also has built-in hardware for a stack record. The stack record is a 32-bit shift register, where each Push or increment SP pushes one record bit onto the register, and each Call pushes two record bits onto the register. (A Pop or decrement SP pops one record bit, and a Return pops two record bits, also.) The stack record circuitry can also detect an overflow or underflow on the 32-bit shift register, and can notify the emulator software even with the MCU running full-speed emulation.

Special Function Registers

The direct-access data memory locations from 0x80 to 0xFF constitute the special function registers (SFRs). The SFRs provide control and data exchange with the Microcontroller 40's resources and peripherals. The Microcontroller 40 duplicates the SFRs found in a typical 8051 implementation as well as implementing additional SFRs used to configure and access the sub-systems unique to the MCU. This allows the addition of new functionality while retaining compatibility with the MCS-51™ instruction set. Table 16 lists the SFRs implemented in the Microcontroller 40 System Controller. Registers unique to the Microcontroller 40 are shown in bold type.

The SFR registers are accessed anytime the direct addressing mode is used to access memory locations from 0x80 to 0xFF. SFRs with addresses ending in 0x0 or 0x8 (e.g. P0, TCON, P1, SCON, IE, etc.) are bit-addressable as well as byte-addressable. All other SFRs are byte-addressable only. Unoccupied addresses in the SFR space are reserved for future use. Accessing these areas will have an indeterminate effect and should be avoided. Table 17 describes the operation of each register.

TABLE 16

Special Function Register Memory Map

| F8 | SPI0CN | PCA0H |  | PCA0CPH0 | PCA0CPH1 | PCA0CPH2 | PCA0CPH3 | PCA0CPH4 | WDTCN |
| F0 | B |  |  |  |  |  |  | EIP1 | EIP2 |
| E8 | ADC0CN | PCA0L |  | PCA0CPL0 | PCA0CPL1 | PCA0CPL2 | PCA0CPL3 | PCA0CPL4 | RSTSRC |

TABLE 16-continued

Special Function Register Memory Map

|    | 0(8)   | 1(9)   | 2(A)    | 3(B)    | 4(C)    | 5(D)    | 6(E)    | 7(F)    |
|----|--------|--------|---------|---------|---------|---------|---------|---------|
| E0 | ACC    | XBR0   | XBR1    | XBR2    |         |         | EIE1    | EIE2    |
| D8 | PCA0CN | PCA0MD | PCA0CPM0| PCA0CPM1| PCA0CPM2| PCA0CPM3| PCA0CPM4|         |
| D0 | PSW    | REF0CN | DAC0L   | DAC0H   | DAC0CN  | DAC1L   | DAC1H   | DAC1CN  |
| C8 | T2CON  |        | RCAP2L  | RCAP2H  | TL2     | TH2     | DSROP   | SMB0CR  |
| C0 | SMB0CN | SMB0STA| SMB0DAT | SMB0ADR | ADC0GTL | ADC0GTH | ADC0LTL | ADC0LTH |
| B8 | IP     |        | AMX0CF  | AMX0SL  | ADC0CF  |         | ADC0L   | ADC0H   |
| B0 | P3     | OSCXCN | OSCICN  | DSRL    | DSRH    |         | FLASCL  | FLARDL  |
| A8 | IE     |        |         |         |         | PRT1IF  |         |         |
| A0 | P2     |        |         |         | PRT0CF  | PRT1CF  | PRT2CF  | PRT3CF  |
| 98 | SCON   | SBUF   | SPI0CFG | SPI0DAT |         | SPI0CKR | CPT0CN  | CPT1CN  |
| 90 | P1     | TMR3CN | TMR3RLL | TMR3RLH | TMR3L   | TMR3H   |         | DSRFLG  |
| 88 | TCON   | TMOD   | TL0     | TL1     | TH0     | TH1     | CKCON   | PSCTL   |
| 80 | P0     | SP     | DPL     | DPH     |         |         |         | PCON    |

Bit Addressable

TABLE 17

Special Function Registers
SFRs listed in alphabetical order.

| Address | Register | Description |
|---------|----------|-------------|
| 0xE0 | ACC | Accumulator |
| 0xBC | ADC0CF | ADC Configuration |
| 0xE8 | ADC0CN | ADC Control |
| 0xC5 | ADC0GTH | ADC Greater-Than Data Word (High Byte) |
| 0xC4 | ADC0GTL | ADC Greater-Than Data Word (Low Byte) |
| 0xBF | ADC0H | ADC Data Word (High Byte) |
| 0xBE | ADC0L | ADC Data Word (Low Byte) |
| 0xC7 | ADC0LTH | ADC Less-Than Data Word (High Byte) |
| 0xC6 | ADC0LTL | ADC Less-Than Data Word (Low Byte) |
| 0xBA | AMX0CF | ADC MUX Configuration |
| 0xBB | AMX0SL | ADC MUX Channel Selection |
| 0xF0 | B | B Register |
| 0x8E | CKCON | Clock Control |
| 0x9E | CPT0CN | Comparator 0 Control |
| 0x9F | CPT1CN | Comparator 1 Control |
| 0xD4 | DAC0CN | DAC 0 Control |
| 0xD3 | DAC0H | DAC 0 Data Word (High Byte) |
| 0xD2 | DAC0L | DAC 0 Data Word (Low Byte) |
| 0xD7 | DAC1CN | DAC 1 Control |
| 0xD6 | DAC1H | DAC 1 Data Word (High Byte) |
| 0xD5 | DAC1L | DAC 1 Data Word (Low Byte) |
| 0x83 | DPH | Data Pointer (High Byte) |
| 0x82 | DPL | Data Pointer (Low Byte) |
| 0x97 | DSRFLG | DSR Flags *** Not Documented |
| 0xB4 | DSRH | DSR Data Word (High Byte) *** Not Documented |
| 0xB3 | DSRL | DSR Data Word (Low Byte) *** Not Documented |
| 0xCE | DSROP | DSR Options |
| 0xE6 | EIE1 | Extended Interrupt Enable 1 |
| 0xE7 | EIE2 | Extended Interrupt Enable 2 |
| 0xF6 | EIP1 | External Interrupt Priority 1 |
| 0xF7 | EIP2 | External Interrupt Priority 2 |
| 0xB7 | FLACL | Flash Memory Read Limit |
| 0xB6 | FLSCL | Flash Memory Timing Prescaler |
| 0xA8 | IE | Interrupt Enable |
| 0xB8 | IP | Interrupt Priority Control |
| 0xB2 | OSCICN | Internal Oscillator Control |
| 0xB1 | OSCXCN | External Oscillator Control |
| 0x80 | P0 | Port 0 Latch |
| 0x90 | P1 | Port 1 Latch |
| 0xA0 | P2 | Port 2 Latch |
| 0xB0 | P3 | Port 3 Latch |
| 0xD8 | PCA0CN | Programmable Counter Array 0 Control |
| 0xFA | PCA0CPH0 | PCA Capture Module 0 Data Word (High Byte) |
| 0xFB | PCA0CPH1 | PCA Capture Module 1 Data Word (High Byte) |
| 0xFC | PCA0CPH2 | PCA Capture Module 2 Data Word (High Byte) |
| 0xFD | PCA0CPH3 | PCA Capture Module 3 Data Word (High Byte) |
| 0xFE | PCA0CPH4 | PCA Capture Module 4 Data Word (High Byte) |
| 0xEA | PCA0CPL0 | PCA Capture Module 0 Data Word (Low Byte) |
| 0xEB | PCA0CPL1 | PCA Capture Module 1 Data Word (Low Byte) |
| 0xEC | PCA0CPL2 | PCA Capture Module 2 Data Word (Low Byte) |
| 0xED | PCA0CPL3 | PCA Capture Module 3 Data Word (Low Byte) |
| 0xEE | PCA0CPL4 | PCA Capture Module 4 Data Word (Low Byte) |
| 0xDA | PCA0CPM0 | Programmable Counter Array 0 Capture/Compare 0 |
| 0xDB | PCA0CPM1 | Programmable Counter Array 0 Capture/Compare 1 |
| 0xDC | PCA0CPM2 | Programmable Counter Array 0 Capture/Compare 2 |
| 0xDD | PCA0CPM3 | Programmable Counter Array 0 Capture/Compare 3 |
| 0xDE | PCA0CPM4 | Programmable Counter Array 0 Capture/Compare 4 |
| 0xF9 | PCA0H | PCA Counter/Timer Data Word (High Byte) |
| 0xE9 | PCA0L | PCA Counter/Timer Data Word (Low Byte) |
| 0xD9 | PCA0MD | Programmable Counter Array 0 Mode |
| 0x87 | PCON | Power Control |
| 0xA4 | PRT0CF | Port 0 Configuration |
| 0xA5 | PRT1CF | Port 1 Configuration |
| 0xAD | PRT1IF | Port 1 Interrupt Flags |
| 0xA6 | PRT2CF | Port 2 Configuration |
| 0xA7 | PRT3CF | Port 3 Configuration |
| 0x8F | PSCTL | Program Store RW Control |
| 0xD0 | PSW | Program Status Word |
| 0xCB | RCAP2H | Counter/Timer 2 Capture (High Byte) |
| 0xCA | RCAP2L | Counter/Timer 2 Capture (Low Byte) |
| 0xD1 | REF0CN | Voltage Reference Control Register |
| 0x99 | SBUF | Serial Data Buffer (UART) |
| 0x98 | SCON | Serial Port Control (UART) |
| 0xC3 | SMB0ADR | SMBus 0 Address |
| 0xC0 | SMB0CN | SMBus 0 Control |
| 0xCF | SMB0CR | SMBus 0 Clock Rate |
| 0xC2 | SMB0DAT | SMBus 0 Data |
| 0xC1 | SMB0STA | SMBus 0 Status |
| 0x81 | SP | Stack Pointer |
| 0x9A | SPI0CFG | Serial Peripheral Interface Configuration |
| 0x9D | SPI0CKR | SPI Clock Rate |
| 0xF8 | SPI0CN | SPI Bus Control |
| 0x9B | SPI0DAT | SPI Port 1 Data |
| 0xC8 | T2CON | Counter/Timer 2 Control |
| 0x88 | TCON | Counter/Timer Control |
| 0x8C | TH0 | Counter/Timer 0 Data Word (High Byte) |
| 0x8D | TH1 | Counter/Timer 1 Data Word (High Byte) |
| 0xCD | TH2 | Counter/Timer 2 Data Word (High Byte) |
| 0x8A | TL0 | Counter/Timer 0 Data Word (Low Byte) |
| 0x8B | TL1 | Counter/Timer 1 Data Word (Low Byte) |
| 0xCC | TL2 | Counter/Timer 2 Data Word (Low Byte) |
| 0x89 | TMOD | Counter/Timer Mode |
| 0x91 | TMR3CN | Timer 3 Control |

TABLE 17-continued

Special Function Registers
SFRs listed in alphabetical order.

| Address | Register | Description |
|---|---|---|
| 0x95 | TMR3H | Timer 3 High |
| 0x94 | TMR3L | Timer 3 Low |
| 0x93 | TMR3RLH | Timer 3 Reload High |
| 0x92 | TMR3RLL | Timer 3 Reload Low |
| 0xFF | WDTCN | Watchdog Timer Control |
| 0xE1 | XBR0 | Port I/O Crossbar Configuration 1 |
| 0xE2 | XBR1 | Port I/O Crossbar Configuration 2 |
| 0xE3 | XBR2 | Port I/O Crossbar Configuration 3 |
| 0x84-86, 0x96, 0x9C, 0xA1-A3, 0xA9-AC, 0xAE-AF, 0xB5, 0xB9, 0xBD, 0xC9, 0xDF, 0xE4-E5, 0xEF, 0xF1-F5 | | Reserved |

Register Descriptions

In Tables 16-20 are descriptions of SFRs related to the operation of the Microcontroller 40 System Controllers Reserved bits should not be set to logic 1. The system may use these bits to implement additional features in which case the reset value of the bit will be logic 0, selecting the feature's default states Detailed descriptions of the remaining SFRs are included hereinbelow.

Interrupt Handler

The Microcontroller 40 includes an extended interrupt system supporting a total of 22 interrupt sources with two priority levels. The allocation of interrupt sources between on-chip peripherals and external inputs pins varies according to the specific version of the devices. Each interrupt source has one or more associated interrupt-pending flag(s) located in an SFR. When a peripheral or external source meets a valid interrupt condition, the associated interrupt-pending flag is set to logic 1.

If interrupts are enabled for the source, an interrupt request is generated when the interrupt-pending flag is set. As soon as execution of the current instruction is complete, the CPU generates an LCALL to a predetermined address to begin execution of an interrupt service routine (ISR). Each ISR must end with an RETI instruction, which returns program execution to the next instruction that would have been executed if the interrupt request had not occurred. If interrupts are not enabled, the interrupt-pending flag is ignored by the hardware and program execution continues as normal. (The interrupt-pending flag is set to logic 1 regardless of the interrupt's enable/disable state.)

Each interrupt source can be individually enabled or disabled through the use of an associated interrupt enable bit in an SFR (IE-EIE2). However, interrupts must first be globally enabled by setting the EA bit (IE.7) to logic 1 before the individual interrupt enables are recognized. Setting the EA bit to logic 0 disables all interrupt sources regardless of the individual interrupt-enable settings.

Some interrupt-pending flags are automatically cleared by the hardware when the CPU vectors to the ISR. However, most are not cleared by the hardware and must be cleared by software before returning from the ISR. If an interrupt-pending flag remains set after the CPU completes the return-from-interrupt (RETI) instruction, a new interrupt request will be generated immediately and the CPU will re-enter the ISR after the completion of the next instruction.

MCU Interrupt Sources and Vectors

The MCU allocates 12 interrupt sources to on-chip peripherals. Up to 10 additional external interrupt sources are available depending on the I/O pin configuration of the device. Software can simulate an interrupt by setting any interrupt-pending flag to logic 1. If interrupts are enabled for the flag, an interrupt request will be generated and the CPU will vector to the ISR address associated with the interrupt-pending flag. Refer to the datasheet section associated with a particular on-chip peripheral for information regarding valid interrupt conditions for the peripheral and the behavior of its interrupt-pending flag(s).

External Interrupts

Two of the external interrupt sources (/INT0 and /INT1) are configurable as active-low level-sensitive or active-low edge-sensitive inputs depending on the setting of IT0 (TCON.0) and IT1 (TCON.2). IE0 (TCON.1) and IE1 (TCON.3) serve as the interrupt-pending flag for the /INT0 and /INT1 external interrupts, respectively. If an /INT0 or /INT1 external interrupt is configured as edge-sensitive, the corresponding interrupt-pending flag is automatically cleared by the hardware when the CPU vectors to the ISR. When configured as level sensitive, the interrupt-pending flag follows the state of the external interrupt's input pin. The external interrupt source must hold the input active until the interrupt request is recognized. It must then deactivate the interrupt request before execution of the ISR completes or another interrupt request will be generated.

The remaining four external interrupts (External Interrupts 4-7) are active-low, edge-sensitive inputs. The interrupt-pending flags for these interrupts are in the Port 1 Interrupt Flag Register shown in Table 21.

TABLE 21

Interrupt Summary

| Interrupt Source | Interrupt Vector | Priority Order | Interrupt-Pending Flag | Enable |
|---|---|---|---|---|
| Reset | 0x0000 | Top | None | Always enabled |
| External Interrupt 0 (/INT0) | 0x0003 | 0 | IE0 (TCON.1) | EX0 (IE.0) |
| Timer 0 Overflow | 0x000B | 1 | TF0 (TCON.5) | ET0 (IE.1) |
| External Interrupt 1 (/INT1) | 0x0013 | 2 | IE1 (TCON.3) | EX1 (IE.2) |
| Timer 1 Overflow | 0x001B | 3 | TF1 (TCON.7) | ET1 (IE.3) |
| Serial Port (UART) | 0x0023 | 4 | RI (SCON.0) TI (SCON.1) | ES (IE.4) |

TABLE 21-continued

Interrupt Summary

| Interrupt Source | Interrupt Vector | Priority Order | Interrupt-Pending Flag | Enable |
|---|---|---|---|---|
| Timer 2 Overflow (or EXF2) | 0x002B | 5 | TF2 (T2CON.7) | ET2 (IE.5) |
| Serial Peripheral Interface | 0x0033 | 6 | SPIF (SPI0STA.7) | ESPI0 (EIE1.0) |
| SMBus Interface | 0x003B | 7 | SI (SMB0CN.3) | ESMB0 (EIE1.1) |
| ADC0 Window Comparison | 0x0043 | 8 | ADWINT (ADC0CN.2) | EWADC0 (EIE1.2) |
| Programmable Counter Array 0 | 0x004B | 9 | CF (PCA0CN.7) CCFn (PCA0CN.n) | EPCA0 (EIE1.3) |
| Comparator 0 Falling Edge | 0x0053 | 10 | CP0FIF (CPT0CN.4) | ECP0F (EIE1.4) |
| Comparator 0 Rising Edge | 0x005B | 11 | CP0RIF (CPT0CN.3) | ECP0R (EIE1.5) |
| Comparator 1 Falling Edge | 0x0063 | 12 | CP1FIF (CPT1CN.4) | ECP1F (EIE1.6) |
| Comparator 1 Rising Edge | 0x006B | 13 | CP1RIF (CPT1CN.3) | ECP1R (EIE1.7) |
| Timer 3 Overflow | 0x0073 | 14 | TF3 (TMR3CN.7) | ET3 (EIE2.0) |
| ADC0 End of Conversion | 0x007B | 15 | ADCINT (ADC0CN.5) | EADC0 (EIE2.1) |
| External Interrupt 4 | 0x0083 | 16 | IE4 (PRT1IF.4) | EX4 (EIE2.2) |
| External Interrupt 5 | 0x008B | 17 | IE5 (PRT1IF.5) | EX5 (EIE2.3) |
| External Interrupt 6 | 0x0093 | 18 | IE6 (PRT1IF.6) | EX6 (EIE2.4) |
| External Interrupt 7 | 0x009B | 19 | IE7 (PRT1IF.7) | EX7 (EIE2.5) |
| JTAG Interface | 0x00A3 | 20 | JI (JTAG.X) | EJ (EIE2.6) |
| External Crystal OSC Ready | 0x00AB | 21 | XVLD (OSCXCN.7) | EXVLD (EIE2.7) |

Interrupt Priorities

Each interrupt source can be individually programmed to one of two priority levels: low or high. A low priority interrupt service routine can be preempted by a high priority interrupt. A high priority interrupt cannot be preempted. Each interrupt has an associated interrupt priority bit in an SFR (IP-EIP2) used to configure its priority level. Low priority is the default. If two interrupts are recognized simultaneously, the interrupt with the higher priority is serviced first. If both interrupts have the same priority level, a fixed priority order is used to arbitrate.

Interrupt Latency

Interrupt response time depends on the state of the CPU when the interrupt occurs. Pending interrupts are sampled and priority decoded each system clock cycle. Therefore, the fastest possible response time is 5 system clock cycles: 1 clock cycle to detect the interrupt and 4 clock cycles to complete the LCALL to the ISR. If an interrupt is pending when a RETI is executed, a single instruction is executed before an LCALL is made to service the pending interrupt. Therefore, the maximum response time for an interrupt (when no other interrupt is currently being serviced or the new interrupt is of greater priority) occurs when the CPU is performing an RETI instruction followed by a DIV as the next instruction. In this case, the response time is 18 system clock cycles: 1 clock cycle to detect the interrupt, 5 clock cycles to execute the RETI, 8 clock cycles to complete the DIV instruction and 4 clock cycles to execute the LCALL to the ISR. If the CPU is executing an ISR for an interrupt with equal or higher priority, the new interrupt will not be serviced until the current ISR completes, including the RETI and following instruction.

Interrupt Register Descriptions

The SFRs used to enable the interrupt sources and set their priority level are described herein in Tables 22-27 below.

Power Management Modes

The Microcontroller 40 core has two software programmable power management modes: Idle and Stop. Idle mode halts the CPU while leaving the external peripherals and internal clocks active. In Stop mode, the CPU is halted, all interrupts and timers (except the Missing Clock Detector) are inactive, and the system clock is stopped. Since clocks are running in Idle mode, power consumption is dependent upon the system clock frequency and the number of peripherals left in active mode before entering Idle. Stop mode consumes the least power. Table 28 describes the Power Control Register (PCON) used to control the Microcontroller 40's power management modes.

Although the Microcontroller 40 has Idle and Stop modes built in (as with any standard 8051 architecture), power management of the entire MCU is better accomplished by enabling/disabling individual peripherals as needed. Each analog peripheral can be disabled when not in use and put into low power mode. Digital peripherals, such as timers or serial buses, draw little power whenever they are not in use. Turning off the Flash memory saves power, similar to entering Idle mode. Turning off the oscillator saves even more power, but requires a reset to restart the MCU.

Idle Mode

Setting the Idle Mode Select bit (PCON.0) causes the Microcontroller 40 to halt the CPU and enter Idle mode as soon as the instruction that sets the bit completes. All internal registers and memory maintain their original data. All analog and digital peripherals can remain active during Idle mode.

Idle mode is terminated when an enabled interrupt or /RST is asserted. The assertion of an enabled interrupt will cause the Idle Mode Selection bit (PCON.0) to be cleared and the CPU will resume operation. The pending interrupt will be serviced and the next instruction to be executed after the return from interrupt (RETI) will be the instruction immediately following the one that set the Idle Mode Select bit. If Idle mode is terminated by an internal or external reset, the Microcontroller 40 performs a normal reset sequence and begins program execution at address 0x0000.

If enabled, the WDT will eventually cause an internal watchdog reset and thereby terminate the Idle mode. This feature protects the system from an unintended permanent shutdown in the event of an inadvertent write to the PCON register. If this behavior is not desired, the WDT may be disabled by software prior to entering the Idle mode if the WDT was initially configured to allow this operation. This provides the opportunity for additional power savings, allowing the system to remain in the Idle mode indefinitely, waiting for an external stimulus to wake up the system.

Stop Mode

Setting the Stop Mode Select bit (PCON.1) (Table 28) causes the Microcontroller 40 to enter Stop mode as soon as the instruction that sets the bit completes. In Stop mode, the CPU and oscillators are stopped, effectively shutting down all digital peripherals. Each analog peripheral must be shut down individually prior to entering Stop Mode. Stop mode can only be terminated by an internal or external reset. On reset, the Microcontroller 40 performs the normal reset sequence and begins program execution at address 0x0000.

If enabled, the Missing Clock Detector will cause an internal reset and thereby terminate the Stop mode. The Missing Clock Detector should be disabled if the CPU is to be put to sleep for longer than the MCD timeout of 100 usec.

Flash Memory

Referring now to FIG. 21, there is illustrated a block diagram of the Flash memory. This MCU includes 32 k+128 bytes of on-chip, reprogrammable Flash memory for program code and non-volatile data storage. The Flash memory can be programmed in-system, a single byte at a time, through the JTAG interface or by software using the MOVX instruction. Once cleared to 0, a Flash bit must be erased to set it back to 1. The bytes would typically be erased (set to 0xFF) before being reprogrammed. The write and erase operations are automatically timed by hardware for proper execution. Data polling to determine the end of the write/erase operation is not required. The Flash memory is designed to withstand at least 10,000 write/erase cycles.

Programming the Flash Memory

The simplest technique of programming the Flash memory is through the JTAG interface using programming tools provided by manufacturer or a third party vendor. This is the only means for programming a non-initialized device. For details on the JTAG commands to program Flash memory.

The Flash memory can be programmed by software using the MOVX instruction with the address and data byte to be programmed provided as normal operands. Before writing to Flash memory using MOVX, write operations must be enabled by setting the PSWE Program Store Write Enable bit (PSCTL.0) to logic 1. Writing to Flash remains enabled until the PSWE bit is cleared by software.

Writes to Flash memory can clear bits but cannot set them. Only an erase operation can set bits in Flash. Therefore, the byte location to be programmed must be erased before a new value can be written. The 32 kbyte Flash memory is organized in 512-byte sectors. The erase operation applies to an entire sector (setting all bytes in the sector to 0xFF). Setting the PSEE Program Store Erase Enable bit (PSCTL.1) to logic 1 and then using the MOVX command to write a data byte to any byte location within the sector will erase an entire 512-byte sector. The data byte written can be of any value because it is not actually written to the Flash. Flash erasure remains enabled until the PSEE bit is cleared by software. The following sequence illustrates the algorithm for programming the Flash memory by software:

1. Enable Flash Memory write/erase in FLSCL Register using FLASCL bits.
2. Set PSEE (PSCTL.1) to enable Flash sector erase.
3. Set PSWE (PSCTL.0) to enable Flash writes.
4. Use MOVX to write a data byte to any location within the 512-byte sector to be erased.
5. Clear PSEE to disable Flash sector erase.
6. Use MOVX to write a data byte to the desired byte location within the erased 512-byte sector. Repeat until finished. (Any number of bytes can be written from a single byte to and entire sector.)
7. Clear the PSWE bit to disable Flash writes.

Write/Erase timing is automatically controlled by hardware based on the prescaler value held in the Flash Memory Timing Prescaler register (FLSCL). The 4-bit prescaler value FLASCL determines the time interval for write/erase operations. The FLASCL value required for a given system clock is shown in Table 30, along with the formula used to derive the FLASCL values. When FLASCL is set to 1111b, the write/erase operations are disabled. Note that code execution in the 8051 is stalled while the Flash is being programmed or erased.

Non-volatile Data Storage

The Flash memory can be used for non-volatile data storage as well as program code. This allows data such as calibration coefficients to be calculated and stored at run time. Data is written using the MOVX instruction and read using the MOVC instruction.

The MCU incorporates an additional 128-byte sector of Flash memory located at 0x8000–0x807F. This sector can be used for program code or data storage. However, its smaller sector size makes it particularly well suited as general purpose, non-volatile scratchpad memory. Even though Flash memory can be written a single byte at a time, an entire sector must be erased first. In order to change a single byte of a multi-byte data set, the data must be moved to temporary storage. Next, the sector is erased, the data set updated and the data set returned to the original sector. The 128-byte sector-size facilitates updating data without wasting program memory space by allowing the use of internal data RAM for temporary storage. (A normal 512-byte sector is too large to be stored in the 256-byte internal data memory.)

Security Options

The Microcontroller 40 provides security options to protect the Flash memory from inadvertent modification by software as well as prevent the viewing of proprietary program code and constants. The Program Store Write Enable (PSCTL.0) (Table 29) and the Program Store Erase Enable (PSCTL.1) bits protect the Flash memory from accidental modification by software. These bits must be explicitly set to logic 1 before software can modify the Flash memory. Additional security features prevent proprietary program code and data constants from being read or altered across the JTAG interface or by software running on the system controller. Tables 30 and 31 illustrate these features.

A set of security lock bytes stored at 0x7DFE and 0x7DFF protect the Flash program memory from being read or altered across the JTAG interface. Each bit in a security lock-byte protects one 4 kbyte block of memory. Clearing a bit to logic 0 in a Read lock byte prevents the corresponding block of Flash memory from being read across the JTAG interface. Clearing a bit in the Write/Erase lock byte protects the block from JTAG erasures and/or writes. The Read lock byte is at location 0x7DFF. The Write/Erase lock byte is located at 0x7DFE. FIG. 21 shows the location and bit definitions of the security bytes. The sector containing the lock byte cannot be erased by software.

The lock bits can always be read and cleared to logic 0 regardless of the security setting applied to the block containing the security bytes. This allows additional blocks to be protected after the block containing the security bytes has been locked. However, the only means of removing a lock once set is to erase the entire program memory space by performing a JTAG erase operation. It is noted that erasing the Flash memory block containing the security bytes will automatically initiate erasure of the entire program memory space (except for the reserved area). This erasure can only be performed via the JTAG.

The Flash Access Limit security feature protects proprietary program code and data from being read by software running on the Microcontroller 40. This feature provides support for OEMs that wish to program the MCU with proprietary value-added firmware before distribution. The value-added firmware can be protected while allowing additional code to be programmed in remaining program memory space later.

The Software Read Limit (SRL) is a 16-bit address that establishes two logical partitions in the program memory space. The first is an upper partition consisting of all the program memory locations at or above the SRL address, and the second is a lower partition consisting of all the program memory locations starting at 0x0000 up to (but excluding) the SRL address. Software in the upper partition can execute code in the lower partition, but is prohibited from reading locations in the lower partition using the MOVC instruction. (Executing a MOVC instruction from the upper partition with a source address in the lower partition will always return a data value of 0x00.) Software running in the lower partition can access locations in both the upper and lower partition without restrictions.

The Value-added firmware should be placed in the lower partition. On reset, control is passed to the value-added firmware via the reset vector. Once the value-added firmware completes its initial execution, it branches to a predetermined location in the upper partition. If entry points are published, software running in the upper partition may execute program code in the lower partition, but it cannot read the contents of the lower partition. Parameters may be passed to the program code running in the lower partition either through the typical method of placing them on the stack or in registers before the call or by placing them in prescribed memory locations in the upper partition.

The SRL address is specified using the contents of the Flash Access Register. The 16-bit SRL address is calculated as 0xNN00, where NN is the contents of the SRL Security Register. Thus, the SRL can be located on 256-byte boundaries anywhere in program memory space. However, the 512-byte erase sector size essentially requires that a 512 boundary be used. The contents of a non-initialized SRL security byte is 0x00, thereby setting the SRL address to 0x0000 and allowing read access to all locations in program memory space by default.

Reset Sources

Referring back to FIG. 3, the reset circuitry of the MCU allows the controller to be easily placed in a predefined default condition. On entry to this reset state, the Microcontroller 40 halts program execution, forces the external port pins to a known state and initializes the SFRs to their defined reset values. Interrupts and timers are disabled. On exit, the program counter (PC) is reset, and program execution starts at location 0x0000.

All of the SFRs are reset to predefined values. The reset values of the SFR bits are defined in the SFR detailed descriptions. The contents of internal data memory are not changed during a reset and any previously stored data is preserved. However, since the stack pointer SFR is reset, the stack is effectively lost even though the data on the stack are not altered.

The I/O port latches are reset to 0xFF (all logic ones), activating internal weak pull-ups which take the external I/O pins to a high state. The external I/O pins do not go high immediately, but will go high within 4 system clock cycles after entering the reset state. If the source of reset is from the VDD Monitor, the /RST pin is driven low until the end of the VDD reset timeout.

On exit from the reset state, the Core 40 uses the internal oscillator running at 1.9 MHz as the system clock by default. The Watchdog Timer 102 is enabled using its longest timeout interval. Once the system clock source is stable, program execution begins at location 0x0000.

There are seven sources for putting the MCU into the reset state: power-on/power-fail, external /RST pin, external CNVSTR signal, software commanded, Comparator 0, Missing Clock Detector, and Watchdog Timer. Each reset source is described below:

Power-on Reset

The Microcontroller 40 incorporates a power supply monitor that holds the MCU in the reset state until VDD rises above the $V_{RST}$ level during power-up. The /RST pin is asserted (low) until the end of the 100 msec VDD Monitor timeout in order to allow the VDD supply to become stable.

On exit from a power-on reset, the PORSF flag (RSTSRC.1) is set by hardware to logic 1. All of the other reset flags in the RSTSRC Register are indeterminate. It is cleared by all other resets. Since all resets cause program execution to begin at the same location (0x0000) software can read the PORSF flag to determine if a power-up was the cause of reset. The content of internal data memory should be assumed to be undefined after a power-on reset.

Software Forced Reset

Writing a 1 to the PORSF bit forces a Power-On Reset.

Power-fail Reset

Figure 22:
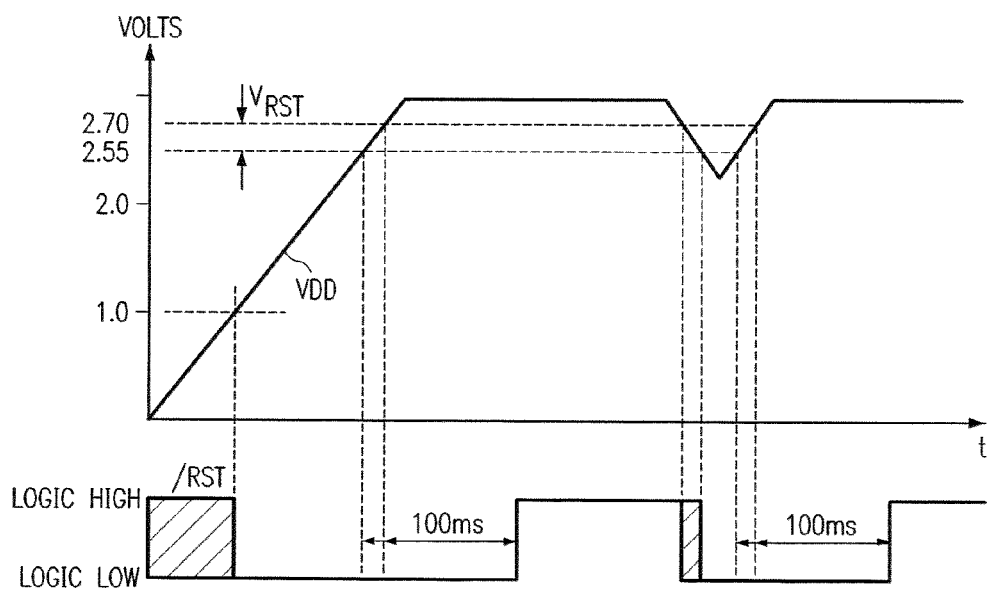
FIG. 22 illustrates a plot of the $V_{DD}$ monitor timing diagram.

When a power-down transition or power irregularity causes $V_{DD}$ to drop below $V_{RST}$, the power supply monitor will drive the /RST pin low and return the Microcontroller 40 to the reset state (see FIG. 22). When $V_{DD}$ returns to a level above $V_{RST}$, the Microcontroller 40 will leave the reset state in the same manner as that for the power-on reset. Note that even though internal data memory contents are not altered by the power-fail reset, it is impossible to determine if VDD dropped below the level required for data retention. If the PORSF flag is set, the data may no longer be valid.

External Reset

The external /RST pin provides a means for external circuitry to force the Microcontroller 40 into a reset state. Asserting an active-low signal on the /RST pin will cause the Microcontroller 40 to enter the reset state. It may be desirable to provide an external pull-up and/or decoupling of the /RST pin to avoid erroneous noise-induced resets. The Microcontroller 40 will remain in reset until at least 12 clock cycles after the active-low /RST signal is removed. The PINRSF flag (RSTSRC.0) is set on exit from an external reset.

Missing Clock Detector Reset

The Missing Clock Detector is essentially a one-shot circuit that is triggered by the MCU system clock. If the system clock goes away for more than 100 usec, the one-shot will time out and generate a reset. After a Missing Clock Detector reset, the MCDRSF flag (RSTSRC.2) will be set, signifying the MSD as the reset source; otherwise, this bit reads 0. The state of the /RST pin is unaffected by this reset. Setting the MSCLKE bit in the OSCICN register enables the Missing Clock Detector.

Comparator 0 Reset

Comparator 0 can be configured as a reset input by writing a 1 to the C0RSEF flag (RSTSRC.5). Comparator 0 should be enabled using CPT0CN.7 (see Table 11) prior to writing to C0RSEF to prevent any turn-on chatter on the output from generating an unwanted reset. When configured as a reset, if the non-inverting input voltage (on CP0+) is less than the inverting input voltage (on CP0−), the MCU is put into the reset state. After a Comparator 0 Reset, the C0RSEF flag (RSTSRC.5) will read 1 signifying Comparator 0 as the reset source; otherwise, this bit reads 0. The state of the /RST pin is unaffected by this reset.

External CNVSTR Pin Reset

The external CNVSTR signal can be configured as a reset input by writing a 1 to the CNVRSEF flag (RSTSRC.6). The CNVSTR signal can appear on any of the P0, P1, or P2 I/O pins. (Note that the Crossbar 52 must be configured for the CNVSTR signal to be routed to the appropriate Port I/O.) The Crossbar 52 should be configured and enabled before the CNVRSEF is set to configure CNVSTR as a reset source. When configured as a reset, CNVSTR is active-low and level sensitive. After a CNVSTR reset, the CNVRSEF flag (RSTSRC.6) will read 1 signifying CNVSTR as the reset source; otherwise, this bit reads 0. The state of the /RST pin is unaffected by this reset.

Watchdog Timer Reset

The MCU includes a programmable Watchdog Timer (WDT) running off the system clock. The WDT will force the MCU into the reset state when the watchdog timer overflows. To prevent the reset, the WDT must be restarted by application software before overflow. If the system experiences a software/hardware malfunction preventing the software from restarting the WDT, the WDT will overflow and cause a reset. This should prevent the system from running out of control.

The WDT is automatically enabled and started with the default maximum time interval on exit from all resets. If desired the WDT can be disabled by system software or locked on to prevent accidental disabling. Once locked, the WDT cannot be disabled until the next system reset. The state of the /RST pin is unaffected by this reset.

Watchdog Usage

The WDT consists of a 21-bit timer running from the programmed system clock. The timer measures the period between specific writes to its control register. If this period exceeds the programmed limit, a WDT reset is generated. The WDT can be enabled and disabled as needed in software, or can be permanently enabled if desired. Watchdog features are controlled via the Watchdog Timer Control Register (WDTCN) shown in Table 32.

Enable/Reset WDT

The watchdog timer is both enabled and reset by writing 0xA5 to the WDTCN register. The user's application software should include periodic writes of 0xA5 to WDTCN as needed to prevent a watchdog timer overflow. The WDT is enabled and reset as a result of any system reset.

Disable WDT

Writing 0xDE followed by 0xAD to the WDTCN register disables the WDT. The following code segment illustrates disabling the WDT.
CLR EA ;disable all interrupts
MOV WDTCN,#0DEh ;disable software
MOV WDTCN,#0ADh ;watchdog timer
SETB EA ;re-enable interrupts The writes of 0xDE and 0xAD must occur within 4 clock cycles of each other, or the disable operation is ignored. Interrupts should be disabled during this procedure to avoid delay between the two writes.

Disable WDT Lockout

Writing 0xFF to WDTCN locks out the disable feature. Once locked out, the disable operation is ignored until the next system reset. Writing 0xFF does not enable or reset the watchdog timer. Applications always intending to use the watchdog should write 0xFF to WDTCN in their initialization code.

Setting WDT Interval

WDTCN.[2:0] control the watchdog timeout interval. The interval is given by the following equation:

$$4^{3+WDTCN[2:0]} \times T_{SYSCLK}, \text{(where } T_{SYSCLK} \text{ is the system clock period).}$$

For a 1.9 MHz system clock, this provides an interval range of 0.0337 msec to 552 msec. WDTCN.7 must be a 0 when setting this interval. Reading WDTCN returns the programmed interval. WDTCN.[2:0] is 111b after a system reset.

Oscillator

Figure 23:
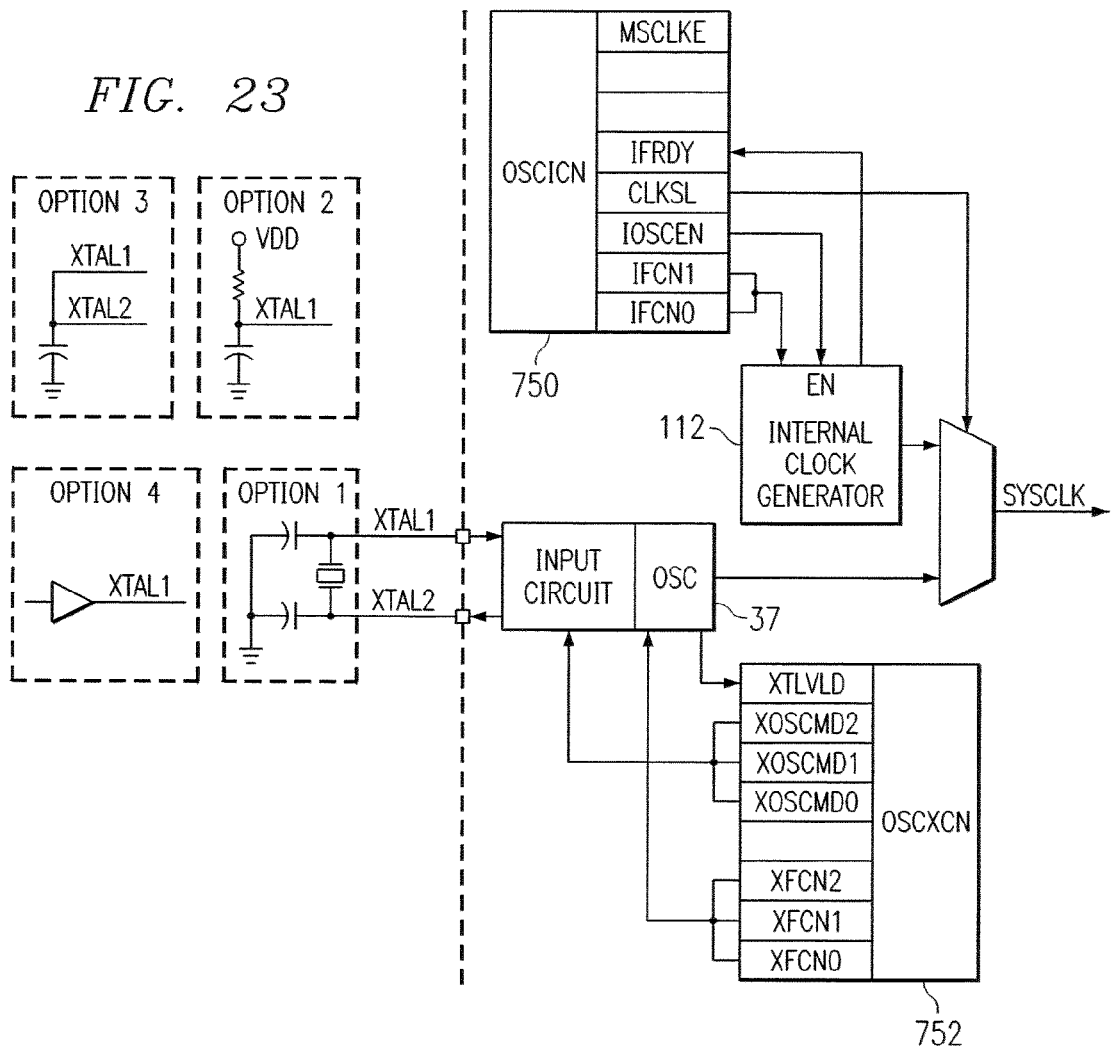
FIG. 23 illustrates a block diagram of the oscillator.

Referring now to FIG. 23, there is illustrated a block diagram of the internal oscillator 112 and an external oscillator drive circuit 37, either of which can generate the system clock. The MCU boots from the internal oscillator after any reset. This internal oscillator 112 can be enabled/disabled and its frequency can be set using an Internal Oscillator Control Register (OSCICN) as shown in [Table].

Both oscillators are disabled when the /RST pin is held low. The MCU can run from the internal oscillator 112 permanently, or it can switch to the external oscillator 37 if desired using CLKSL bit in the OSCICN Register 750 (Table 36). The external oscillator requires an external resonator, crystal, capacitor, or RC network connected to the XTAL1/XTAL2 pins. The oscillator circuit must be configured for one of these sources in the OSCXCN register 752 (Table 37). An external CMOS clock can also provide the system clock via overdriving the XTAL1 pin.

External Crystal Example

If a crystal were used to generate the system clock for the MCU, the circuit would be as shown in FIG. 23, Option 1. For an ECS-110.5-20-4 crystal, the resonate frequency is 11.0592 MHz, the intrinsic capacitance is 7 pF, and the ESR is 60 W. The compensation capacitors should be 33 pF each, and the PWB parasitic capacitance is estimated to be 2 pF. To find the appropriate External Oscillator Frequency Control value (XFCN) in the OSCXCN Register 752, the Power Factor must be calculated. First, find the equivalent load capacitance as follows:

$$C_L = C0 + [(C1 * C2)/(C1+C2)] + CP/2$$

$$C_L = 7 + (33*33)/(33+33) + 2/2$$

$$C_L = 7 + 16.5 + 1$$

$$C_L = 24.5 \text{ pF}$$

The Power Factor is calculated as follows:

$$F=5*ESR*f^2*C_L^2$$

$$PF=5*60*(11.0592)^2*(24.5)^2$$

$$PF=22(10^6)$$

From the Crystal column in Table 37, the first PF value which is greater than $22(10^6)$ is $6.6(10^6)$, so the XFCN value to use is 110.

External RC Example

If an external RC network were used to generate the system clock for the MCU, the circuit would be as shown in FIG. 23, Option 2. The capacitor must be no greater than 100 pF, but using a very small capacitor will increase the frequency drift due to the PWB parasitic capacitance. To determine the required External Oscillator Frequency Control value (XFCN) in the OSCXCN Register 752, first select the RC network value to produce the desired frequency of oscillation. If the frequency desired is 100 kHz, let R=246 kW and C=50 pF:

$$f=1.23(10^3)/RC=1.23(10^3)/[246*50]=0.1 \text{ MHz}=100 \text{ kHz}$$

$$XFCN^3 \log_2(f/25 \text{ kHz})$$

$$XFCN^3 \log_2(100 \text{ kHz}/25 \text{ kHz})=\log_2(4)$$

$$XFCN^3 2, \text{ or code } 010$$

External Capacitor Example

If an external capacitor were used to generate the system clock for the MCU, the circuit would be as shown in FIG. 23, Option 3. The capacitor must be no greater than 100 pF, but using a very small capacitor will increase the frequency drift due to the PWB parasitic capacitance. To determine the required External Oscillator Frequency Control value (XFCN) in the OSCXCN Register 752, select the capacitor to be used and find the frequency of oscillation from the equations below. Assume AV+=3.0V and C=50 pF:

$$f=KF/(C*VDD)=KF/(50*3)$$

$$f=KF/150$$

If a frequency of roughly 400 kHz is desired, select the K Factor as KF=60.8:

$$f=60.8/150=0.405 \text{ MHz, or } 405 \text{ kHz}$$

Therefore, the XFCN value to use in this example is 011.

RT Input/Output

Description

Referring back to FIG. 6, there is illustrated a diagram of the Port I10 functionality. The MCU has a wide array of digital resources, which are available through four digital I/O ports, P0, P1, P2 and P3. Each port pin can be defined as its corresponding port I/O or it can have one of the internal digital resources. The designer has complete control over which functions are assigned, limited only by the number of physical I/O pins available on the selected package. This is achieved through the use of the Priority CrossBar Decoder 404. (Note that the state of a Port I/O pin can always be read in the corresponding Port latch regardless of the Crossbar settings).

The CrossBar 52 assigns the selected internal digital resources to the I/O pins based on the Priority Decode Table 38. The registers XBR0, XBR1, and XBR2, defined in Tables 39, 40 and 41 are used to select an internal digital function or let an I/O pin default to being a Port I/O.

Figure 24:
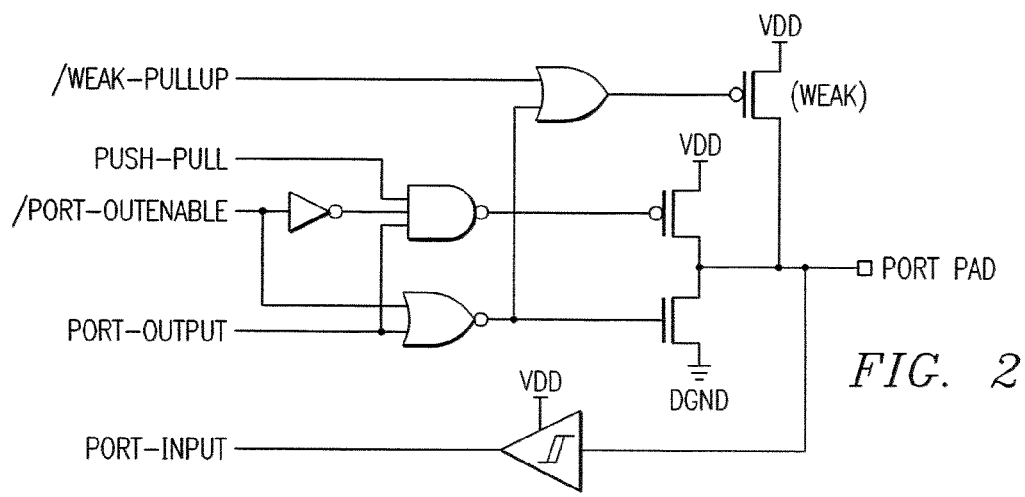
FIG. 24 illustrates a diagram of the Port I/O Cell.

All Port I/Os are 5V tolerant (FIG. 24 illustrates a Cell Block Diagram.) The Port I/O cells are configured as either push-pull or open-drain in the Port Configuration Registers (PRT0CF, PRT1CF, PRT2CF, PRT3CF).

Priority Cross Bar Decoder

The Priority CrossBar Decode 404 assigns a priority to each I/O function, starting at the top with the SMBus. When selected, its two signals will be assigned to Pin 0 and 1 of I/O Port 0. The decoder always fills I/O bits from LSB to MSB starting with Port 0, then Port 1, finishing if necessary with Port 2. If the designer chooses not to use a resource, the next function will fill the priority slot. In this way, it is possible to choose only the functions required by the design making full use of the available I/O pins. Also, any extra Port I/O are grouped together for more convenient use in application code.

Registers XBR0, XBR1 and XBR2 are used to assign the digital I/O resources to the physical I/O Port pins. When the SMBus, SPI Bus, or UART is selected, the crossbar 52 assigns all pins associated with the selected bus. It would be impossible for instance to assign the RX pin from the UART function without also assigning the TX function. Standard Port I/Os appear contiguously after the prioritized functions have been assigned. For example, if you choose functions that take the first 14 Port I/O (P0.[7:0], P1.[5:0]), you would have 18 Port I/O left over (P1.[7:6], P2 and P3). The crossbar circuit is described in U.S. patent application Ser. No. 09/583, 260, filed May 31, 2000, entitled "Cross-Bar Matrix for Connecting Digital Resources to I10 Pairs of an Integrated Circuit," which is incorporated herein by reference.

Port I/O Initialization

Port I/O initialization is straightforward. Registers XBR0, XBR1 and XBR2 must be loaded with the appropriate values to select the digital I/O functions required by the design. Setting XBR2.7 to 1 enables the CrossBar 52. Until the Crossbar 52 is enabled, the external pins remain as standard Ports in input mode regardless of the XBRn Register settings. For given XBRn Register settings, one can determine the I/O pin-out using the Priority Decode Table; as an alternative, the Configuration Code Generator function of the IDE software will determine the Port I/O pin-assignments based on the XBRn Register settings.

The output driver characteristics of the I/O pins are defined using the Port Configuration Registers PRT0CF, PRT1CF, PRT2CF and PRT3CF (see Tables 43, 45, 48 and 50). Each Port Output driver can be configured as either Open Drain or Push-Pull. This is required even for the digital resources selected in the XBRn registers and is not automatic. The only exception to this is the SMBus (SDA, SCL) and UART Receive (RX) pins which are Open-drain regardless of the PRTnCF settings.

The third and final step is to initialize the individual resources selected using the appropriate setup registers. Initialization procedures for the various digital resources may be found in the detailed explanation of each available function. The reset state of each register is shown in Tables 42-50 that describe each individual register.

TABLE 38

Crossbar Priority Decode

| PIN I/O | P0.0 | P0.1 | P0.2 | P0.3 | P0.4 | P0.5 | P0.6 | P0.7 | P1.0 | P1.1 | P1.2 | P1.3 | P1.4 | P1.5 | P1.6 | P1.7 | P2.0 | P2.1 | P2.2 | P2.3 | P2.4 | P2.5 | P2.6 | P2.7 |
|---|---|---|---|---|---|---|---|---|---|---|---|---|---|---|---|---|---|---|---|---|---|---|---|---|
| SDA | ● | | | | | | | | | | | | | | | | | | | | | | | |
| SCL | | ● | | | | | | | | | | | | | | | | | | | | | | |
| SCK | ● | | ● | | | | | | | | | | | | | | | | | | | | | |
| MISO | | ● | | ● | | | | | | | | | | | | | | | | | | | | |
| MOSI | | | ● | | ● | | | | | | | | | | | | | | | | | | | |
| NSS | | | | ● | | ● | | | | | | | | | | | | | | | | | | |
| TX | ● | | ● | | ● | | ● | | | | | | | | | | | | | | | | | |
| RX | | ● | | ● | | ● | | ● | | | | | | | | | | | | | | | | |
| CEX0 | ● | | ● | | ● | | ● | | ● | | | | | | | | | | | | | | | |
| CEX1 | | ● | | ● | | ● | | ● | | ● | | | | | | | | | | | | | | |
| CEX2 | | | ● | | ● | | ● | | ● | | ● | | | | | | | | | | | | | |
| CEX3 | | | | ● | | ● | | ● | | ● | | ● | | | | | | | | | | | | |
| CEX4 | | | | | ● | | ● | | ● | | ● | | ● | | | | | | | | | | | |
| ECI | ● | ● | ● | ● | ● | ● | ● | ● | ● | ● | ● | ● | ● | ● | | | | | | | | | | |
| CP0 | ● | ● | ● | ● | ● | ● | ● | ● | ● | ● | ● | ● | ● | ● | ● | | | | | | | | | |
| CP1 | ● | ● | ● | ● | ● | ● | ● | ● | ● | ● | ● | ● | ● | ● | ● | ● | | | | | | | | |
| T0 | ● | ● | ● | ● | ● | ● | ● | ● | ● | ● | ● | ● | ● | ● | ● | ● | ● | | | | | | | |
| /INT0 | ● | ● | ● | ● | ● | ● | ● | ● | ● | ● | ● | ● | ● | ● | ● | ● | ● | ● | | | | | | |
| T1 | ● | ● | ● | ● | ● | ● | ● | ● | ● | ● | ● | ● | ● | ● | ● | ● | ● | ● | ● | | | | | |
| /INT1 | ● | ● | ● | ● | ● | ● | ● | ● | ● | ● | ● | ● | ● | ● | ● | ● | ● | ● | ● | ● | | | | |
| T2 | ● | ● | ● | ● | ● | ● | ● | ● | ● | ● | ● | ● | ● | ● | ● | ● | ● | ● | ● | ● | ● | | | |
| T2EX | ● | ● | ● | ● | ● | ● | ● | ● | ● | ● | ● | ● | ● | ● | ● | ● | ● | ● | ● | ● | ● | ● | | |
| /SYSCLK | ● | ● | ● | ● | ● | ● | ● | ● | ● | ● | ● | ● | ● | ● | ● | ● | ● | ● | ● | ● | ● | ● | ● | |
| CNVSTR | ● | ● | ● | ● | ● | ● | ● | ● | ● | ● | ● | ● | ● | ● | ● | ● | ● | ● | ● | ● | ● | ● | ● | ● |

In the Priority Decode Table 38, a dot (•) is used to show the external Port I/O pin (column) to which each signal (row) can be assigned by the user application code via programming registers XBR2, XBR1, and XBR0.

General Purpose Port I/O

The MCU has four byte-wide, bi-directional parallel ports that can be used general purpose I/O. Each port is accessed through a corresponding special function register (SFR) that is both byte addressable and bit addressable. When writing to a port, the value written to the SFR is latched to maintain the output data value at each pin. When reading, the logic levels of the port's input pins are returned regardless of the XBRn settings (i.e. even when the pin is assigned to another signal by the Crossbar, the Port Register can always still read its corresponding Port I/O pin). The exception to this is the execution of the read-modify-write instructions. The read-modify-write instructions when operating on a port SFR are the following: ANL, ORL, XRL, JBC, CPL, INC, DEC, DJNZ and MOV, CLR or SET, when the destination is an individual bit in a port SFR. For these instructions, the value of the register (not the pin) is read, modified, and written back to the SFR.

Serial I/O

Description

Figure 25A:
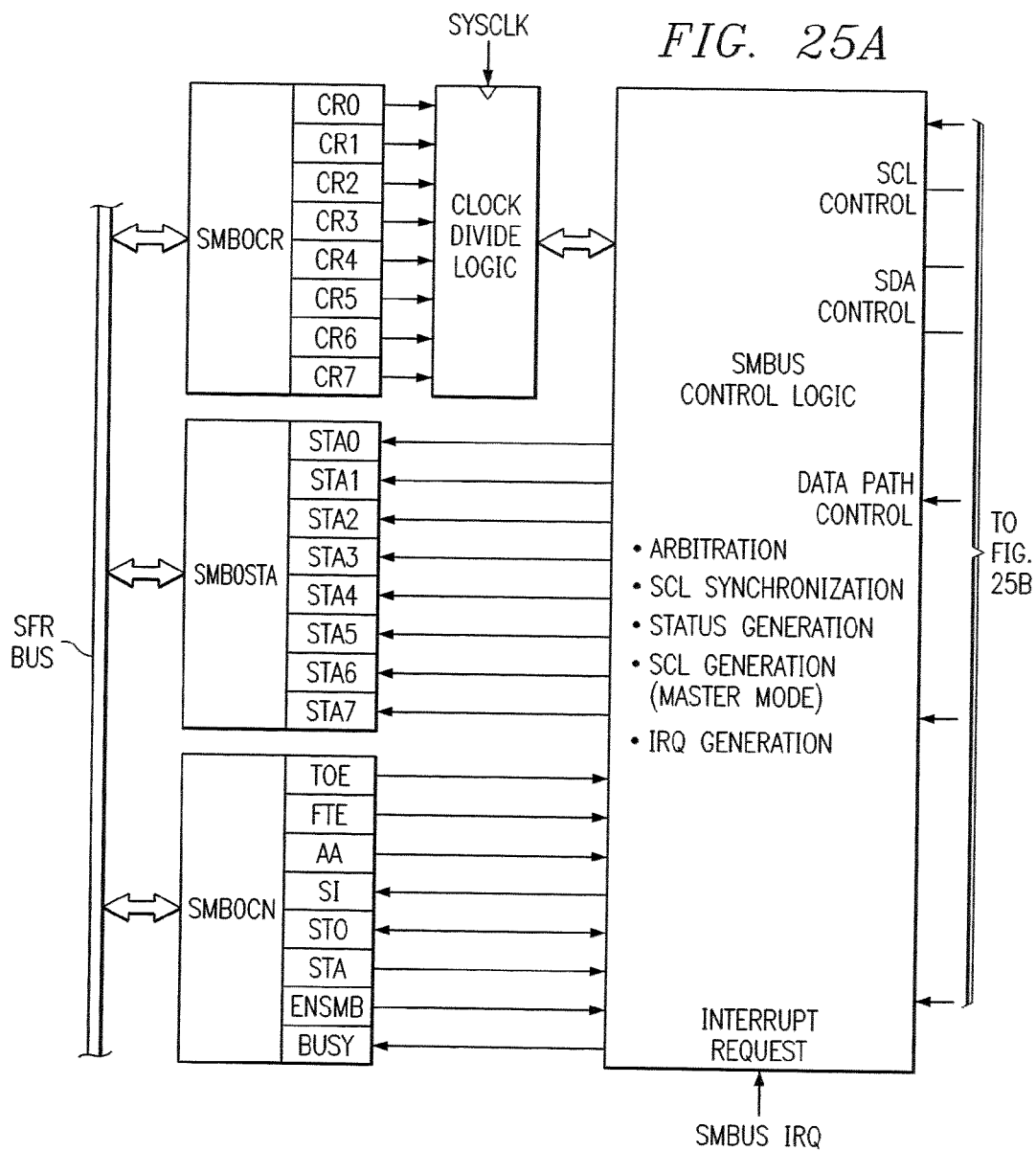
FIGS. 25A and 25B illustrate a diagram of the SMBUS.
Figure 25B:
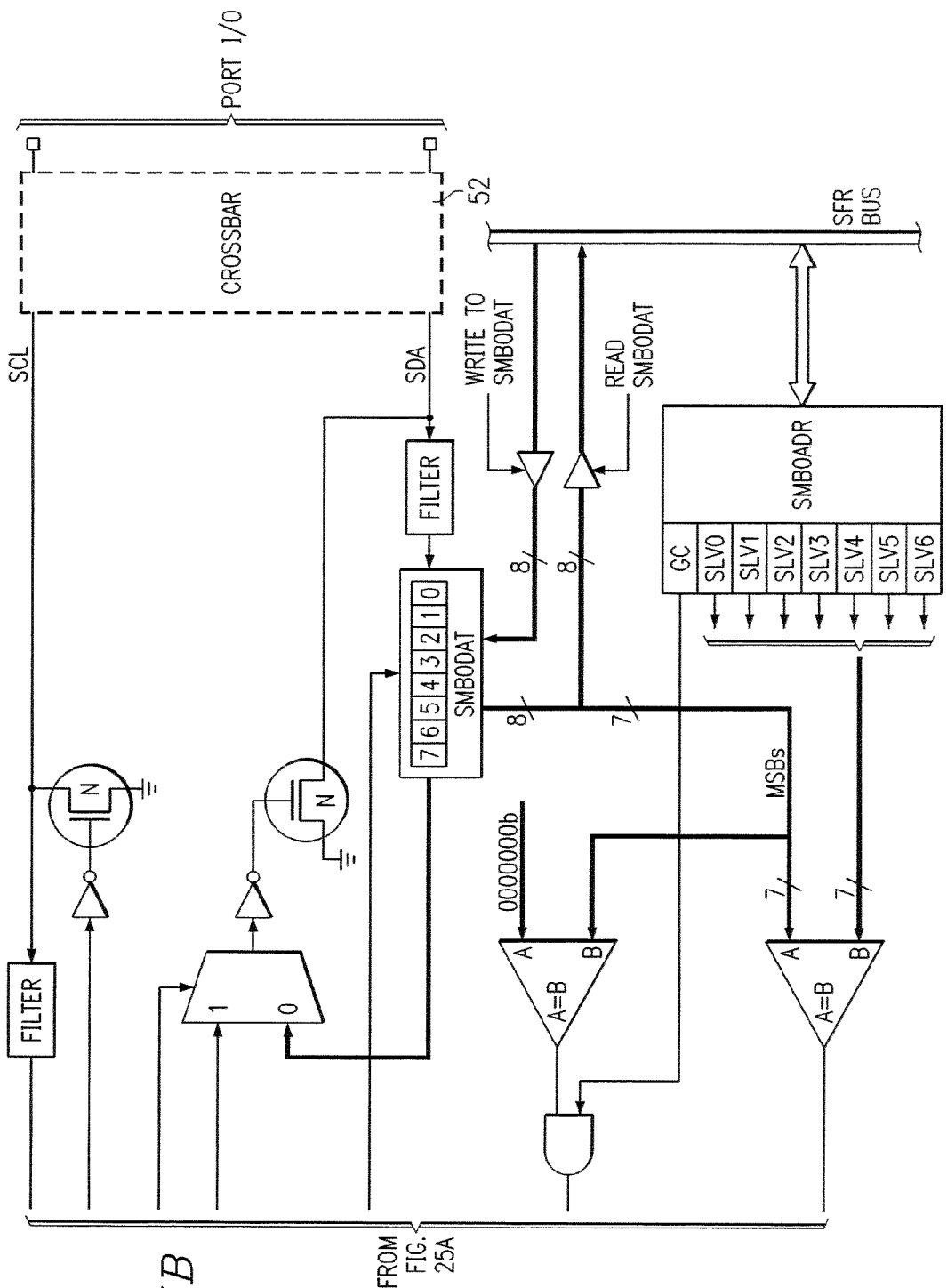

Referring now to FIGS. 25A and 25B, there is illustrated a block diagram of the SMBus. The SMBus serial I/O interface is compliant with the System Management Bus Specification, version 1.1. It is a two-wire, bi-directional serial bus, which is also compatible with the I²C serial bus. Reads and writes to the interface by the system controller are byte oriented with the SMBus interface autonomously controlling the serial transfer of the data. Data can be transferred at up to ⅛$^{th}$ of the system clock if desired (this can be faster than allowed by the SMBus specification, depending on the system clock used). A method of extending the clock-low duration is used to accommodate devices with different speed capabilities on the same bus.

Two types of data transfers are possible: data transfers from a master transmitter to an addressed slave receiver, and data transfers from an addressed slave transmitter to a master receiver. The master device initiates both types of data transfers and provides the serial clock pulses. The SMBus interface may operate as a master or a slave. Multiple master devices on the same bus are also supported. If two or more masters attempt to initiate a data transfer simultaneously, an arbitration scheme is employed with a single master always winning the arbitration.

Figure 26:
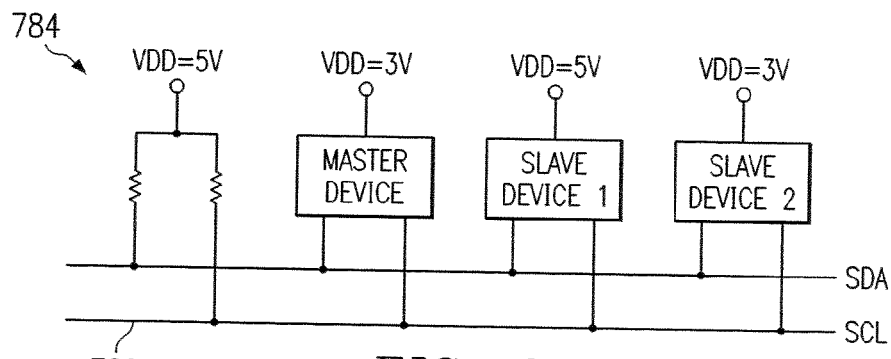
FIG. 26 illustrates a configuration for the SMBUS.

FIG. 26 shows a typical SMBus configuration. The SMBus interface will work at any voltage between 3.0V and 5.0V and different devices on the bus may operate at different voltage levels. The SCL (serial clock) on line 780 and SDA (serial data) on line 782 are bi-directional. They must be connected to a positive power supply voltage through a pull-up resistor or similar circuit 784. When the bus is free, both lines are pulled high. Every device connected to the bus must have an open-drain or open-collector output for both the SCL and SDA lines. The maximum number of devices on the bus is limited only by the requirement that the rise and fall times on the bus will not exceed 300 ns and 1000 ns, respectively.

Operation

A typical SMBus transaction consists of a START condition, followed by an address byte, one or more bytes of data, and a STOP condition. The address byte and each of the data bytes are followed by an ACKNOWLEDGE bit from the receiver. The address byte consists of a 7-bit address plus a direction bit. The direction bit (R/W) occupies the least-significant bit position of the address. The direction bit is set to logic 1 to indicate a "READ" operation and cleared to logic 0 to indicate a "WRITE" operation. A general call address (0x00+R/W) is recognized by all slave devices allowing a master to address multiple slave devices simultaneously.

All transactions are initiated by the master with one or more addressed slave devices as the target. The master generates the START condition and then transmits the address and direction bit. If the transaction is a WRITE operation from the master to the slave, the master transmits the data a byte at a time waiting for an ACKNOWLEDGE from the slave at the end of each byte. If it is a READ operation, the slave transmits the data waiting for an ACKNOWLEDGE from the master at the end of each byte. At the end of the data transfer, the master generates a STOP condition to terminate the transaction and free the bus. FIG. 27 illustrates a typical SMBus transaction. The SMBus interface may be configured to operate as either a master or a slave. At any particular time, it will be operating in one of the following four modes:

Serial data is transmitted on SDA while the serial clock is output on SCL. The first byte transmitted contains the address of the target slave device and the data direction bit. In this case the data direction bit (R/W) will be logic 0 to indicate a "WRITE" operation. The master then transmits one or more bytes of serial data. After each byte is transmitted, an acknowledge bit is generated by the slave. START and STOP conditions are output by the master device to indicate the beginning and the end of the serial transfer.

Serial data is received on SDA while the serial clock is output on SCL. The first byte is transmitted by the master and contains the address of the target slave and the data direction bit. In this case the data direction bit (R/W) will be logic 1 to indicate a "READ" operation. Serial data is then received from the slave on SDA while the master outputs the serial clock. One or more bytes of serial data are transmitted by the slave. After each byte is received, an acknowledge bit is transmitted by the master. START and STOP conditions are output by the master to indicate the beginning and end of the serial transfer.

Serial data is transmitted on SDA while the serial clock is received on SCL. First, a byte is received that contains an address and data direction bit. In this case the data direction bit (R/W) will be logic 1 to indicate a "READ" operation. If the received address matches the slave's assigned address (or a general call address is received) one or more bytes of serial data are transmitted to the master. After each byte is received, an acknowledge bit is transmitted by the master. The master outputs START and STOP conditions to indicate the beginning and end of the serial transfer.

Serial data is received on SDA while the serial clock is received on SCL. First, a byte is received that contains an address and data direction bit. In this case the data direction bit (R/W) will be logic 0 to indicate a "WRITE" operation. If the received address matches the slave's assigned address (or a general call address is received) one or more bytes of serial data are received from the master. After each byte is received, an acknowledge bit is transmitted by the slave. START and STOP conditions are output by the master to indicate the beginning and end of the serial transfer.

A master may start a transfer only if the bus is free. The bus is free after a STOP condition or after the SCL and SDA lines remains high for a specified time. Two or more master devices may attempt to generate a START condition at the same time. Since the devices that generated the START condition may not be aware that other masters are contending for the bus, an arbitration scheme is employed. The master devices continue to transmit until one of the masters transmits a HIGH level, while the other(s) master transmits a LOW level on SDA. The first master(s) transmitting the HIGH level on SDA looses the arbitration and is required to give up the bus.

SMBus provides a clock synchronization mechanism, similar to I2C, which allows devices with different speed capabilities to coexist on the bus. A clock-low extension is used during a transfer in order to allow slower slave devices to communicate with faster masters. The slave can hold the SCL line LOW to extend the clock low period, effectively decreasing the serial clock frequency.

If the SCL line is held low by a slave device on the bus, no further communication is possible. Furthermore, the master cannot force the SCL line high to correct the error condition. To solve this problem, the SMBus protocol specifies that devices participating in a transfer must detect any clock cycle held low longer than 25 ms as a "timeout" condition. Devices that have detected the timeout condition must reset the communication no later than 10 ms after detecting the timeout condition.

One of the MCU's general-purpose timers, operating in 16-bit auto-reload mode, can be used to monitor the SCL line for this timeout condition. Timer 3 is specifically designed for this purpose.

The SMBus specification stipulates that if a device holds the SCL and SDA lines high for more that 50 usec, the bus is designated as free. The SMB0CR register is used to detect this condition when the FTE bit in SMB0CN is set, thereby setting the SI bit in SMB0CN if this event is detected.

SMBus Special Function Registers

The SMBus serial interface is accessed and controlled through five SFRs: SMB0CN Control Register, SMB0CR Clock Rate Register, SMB0ADR Address Register, SMB0DAT Data Register and SMB0STA Status Register. The system device may have one or more SMBus serial interfaces implemented. The five special function registers related to the operation of the SMBus interface are described in the following section.

Control Register

The SMBus Control register SMB0CN (Table 51) is used to configure and control the SMBus interface. All of the bits in the register can be read or written by software. Two of the control bits are also affected by the SMBus hardware. The Serial Interrupt flag (SI, SMB0CN.3) is set to logic 1 by the hardware when a valid serial interrupt condition occurs. It can only be cleared by software. The Stop flag (STO, SMB0CN.4) is cleared to logic 0 by hardware when a STOP condition is present on the bus.

Setting the ENSMS flag to logic 1 enables the SMBus interface. Clearing the ENSMB flag to logic 0 disables the SMBus interface and removes it from the bus. Momentarily clearing the ENSMB flag and then resetting it to logic 1 will reset a SMBus communication. However, ENSMB should not be used to temporarily remove a device from the bus since the bus state information will be lost. Instead, the Assert Acknowledge (AA) flag should be used to temporarily remove the device from the bus (see description of AA flag below).

Setting the Start flag (STA, SMB0CN.5) to logic 1 will put the SMBus in a master mode. If the bus is free, the SMBus hardware will generate a START condition. If the bus is not free, the SMBus hardware waits for a STOP condition to free the bus and then generates a START condition after a 5 us delay per the SMB0CR value. (In accordance with the SMBus protocol, the SMBus interface also considers the bus free if the bus is idle for 50 us and no STOP condition was recognized.) If STA is set to logic 1 while the SMBus is in master mode and one or more bytes have been transferred, a repeated START condition will be generated.

When the Stop flag (STO, SMB0CN.4) is set to logic 1 while the SMBus interface is in master mode, the hardware generates a STOP condition on the SMBus. In a slave mode, the STO flag may be used to recover from an error condition. In this case, a STOP condition is not generated on the SMBus, but the SMBus hardware behaves as if a STOP condition has been received and enters the "not addressed" slave receiver mode. The SMBus hardware automatically clears the STO flag to logic 0 when a STOP condition is detected on the bus.

The Serial Interrupt flag (SI, SMB0CN.3) is set to logic 1 by hardware when the SMBus interface enters one of 27 possible states. If interrupts are enabled for the SMBus interface, an interrupt request is generated when the SI flag is set. The SI flag must be cleared by software. If SI is set to logic 1 while the SCL line is low, the clock-low period of the serial clock will be stretched and the serial transfer is suspended. A high level on SCL is not affected by the setting of the SI flag.

The Assert Acknowledge flag (AA, SMB0CN.2) is used to set the level of the SDA line during the acknowledge clock cycle on the SCL line. Setting the AA flag to logic 1 will cause an ACKNOWLEDGE (low level on SDA) to be sent during the acknowledge cycle if the device has been addressed. Setting the AA flag to logic 0 will cause a NOT ACKNOWLEDGE (high level on SDA) to be sent during acknowledge cycle. After the transmission of a byte in slave mode, the slave can be temporarily removed from the bus by clearing the AA flag. The slave's own address and general call address will be ignored. To resume operation on the bus, the AA flag must be reset to logic 1 to allow the slave's address to be recognized.

Setting the SMBus Free Timer Enable bit (FTE, SMB0CN.1) to logic 1 enables the timer in SMB0CR. When SCL goes high, the timer in SMB0CR counts up. If it overflows, the bus will be freed from being be driven by the master. The bus free period should be less than 50 usec (see Table 52, SMBus Clock Rate Register).

Setting the SMBus timeout enable bit to logic 1 enables Timer 3 to count up when the SCL line is high and Timer 3 is enabled. If Timer 3 overflows, a Timer 3 interrupt will be generated, which will alert the CPU that a SMBus SCL low timeout has occurred.

Clock Rate Register

Data Register

The SMBus Data register SMB0DAT (Table 53) holds a byte of serial data to be transmitted or one that has just been received. Software can read or write to this register while the SI flag is set to logic 1. Data remains stable in the register as long as SI is set to logic 1. Software can safely read or write to the data register when the SI flag is set. Software should not attempt to access the SMB0DAT register when the SMBus is enabled and the SI flag is cleared to logic 0 since the hardware may be in the process of shifting a byte of data in or out of the register.

Data in SMB0DAT is always shifted out MSB first. After a byte has been received, the first bit of received data is located at the MSB of SMB0DAT. While data is being shifted out, data on the bus is simultaneously being shifted in. Therefore, SMB0DAT always contains the last data byte present on the bus. Thus, in the event of lost arbitration, the transition from master transmitter to slave receiver is made with the correct data in SMB0DAT.

Address Register

The SMB0ADR Address register (Table 54) holds the slave address for the SMBus interface. In slave mode, the seven most-significant bits hold the 7-bit slave address. The least significant bit, bit 0, is used to enable the recognition of the general call address (0x00). If bit 0 is set to logic 1, the general call address will be recognized. Otherwise, the general call address is ignored. The contents of this register are ignored when the SMBus hardware is operating in master mode.

Status Register

The SMB0STA Status register (Table 55) holds an 8-bit status code indicating the current state of the SMBus. There are 28 possible SMBus states, each with a corresponding unique status code. The five most significant bits of the status code vary while the three least-significant bits of a valid status code are fixed at zero when SI=1. Therefore, all possible status codes are multiples of eight. This facilitates the use of status codes in software as an index used to branch to appropriate service routines (allowing 8 bytes of code to service the state or jump to a more extensive service routine).

For the purposes of user software, the contents of the SMB0STA register is only defined when the SI flag is logic 1. Software should never write to the SMB0STA register. Doing so will yield indeterminate results. The 28 SMBus states, along with their corresponding status codes, are given in Table 56.

TABLE 56

SMBus Status Codes

| Status Code (SMB0STA) | Mode | SMBus State |
| --- | --- | --- |
| 0x00 | All | Bus Error (i.e. illegal START, illegal STOP, . . . ) |
| 0x08 | Master Transmitter/Receiver | START condition transmitted. |
| 0x10 | Master Transmitter/Receiver | Repeated START condition transmitted. |
| 0x18 | Master Transmitter | Slave address + W transmitted. ACK received. |
| 0x20 | Master Transmitter | Slave address + W transmitted. NACK received. |
| 0x28 | Master Transmitter | Data byte transmitted. ACK received. |
| 0x30 | Master Transmitter | Data byte transmitted. NACK received. |
| 0x38 | Master Transmitter | Arbitration lost |
| 0x40 | Master Receiver | Slave address + R transmitted. ACK received. |
| 0x48 | Master Receiver | Slave address + R transmitted. NACK received |
| 0x50 | Master Receiver | Data byte received. ACK transmitted. |
| 0x58 | Master Receiver | Data byte received. NACK transmitted. |
| 0x60 | Slave Receiver | SMB0's own slave address + W received. ACK transmitted. |
| 0x68 | Slave Receiver | Arbitration lost in transmitting slave address + R/W as master. Own slave address + W received. ACK transmitted. |

TABLE 56-continued

SMBus Status Codes

| Status Code (SMB0STA) | Mode | SMBus State |
|---|---|---|
| 0x70 | Slave Receiver | General call address (0x00) received. ACK returned. |
| 0x78 | Slave Receiver | Arbitration lost in transmitting slave address + R/W as master. General call address received. ACK transmitted. |
| 0x80 | Slave Receiver | SMB0's own slave address + W received. Data byte received. ACK transmitted. |
| 0x88 | Slave Receiver | SMB0's own slave address + W received. Data byte received. NACK transmitted. |
| 0x90 | Slave Receiver | General call address (0x00) received. Data byte received. ACK transmitted. |
| 0x98 | Slave Receiver | General call address (0x00) received. Data byte received. NACK transmitted. |
| 0xA0 | Slave Receiver | A STOP or repeated START received while addressed as a slave. |
| 0xA8 | Slave Transmitter | SMB0's own slave address + R received. ACK transmitted. |
| 0xB0 | Slave Transmitter | Arbitration lost in transmitting slave address + R/W as master. Own slave address + R received. ACK transmitted. |
| 0xB8 | Slave Transmitter | Data byte transmitted. ACK received. |
| 0xC0 | Slave Transmitter | Data byte transmitted. NACK received. |
| 0xC8 | Slave Transmitter | Last data byte transmitted (AA = 0). ACK received. |
| 0xD0 | Slave Transmitter/Receiver | SCL Clock High Timer per SMB0CR timed out (FTE = 1) |
| 0xF8 | All | Idle |

Serial Peripheral Interface Bus

Description

Figure 29:
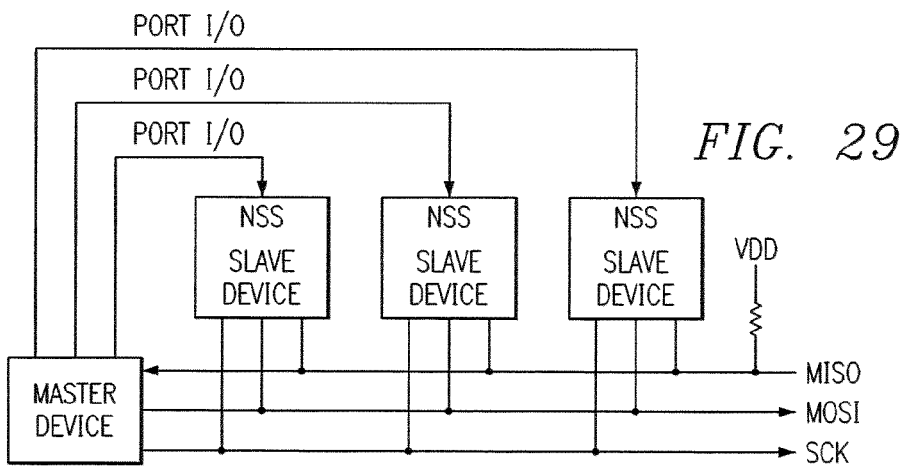
FIG. 29 illustrates a diagram of a typical SPI interconnection.

Referring now to FIG. 28, there is illustrated a block diagram of the SPI. The Serial Peripheral Interface (SPI) provides access to a four-wire, full-duplex, serial bus. SPI supports the connection of multiple slave devices to a master device on the same bus. A separate slave-select signal (NSS) is used to select a slave device and enable a data transfer between the master and the selected slave. Multiple masters on the same bus are also supported. Collision detection is provided when two or more masters attempt a data transfer at the same time. The SPI can operate as either a master or a slave, as illustrated in the Interconnection scheme of FIG. 29. Data may be transferred at up to a maximum bit rate of one-eighth the system clock frequency.

The four signals used by the SPI on lines 800 (MOSI, MISO, SCK, NSS) are described below.

The master-out, slave-in (MOSI) signal is an output from a master device and an input to slave devices. It is used to serially transfer data from the master to the slave. Data is transferred most-significant bit first.

The master-in, slave-out (MISO) signal is an output from a slave device and an input to the master device. It is used to serially transfer data from the slave to the master. Data is transferred most-significant bit first. A SPI slave places the MISO pin in a high-impedance state when the slave is not selected.

The serial clock (SCK) signal is an output from the master device and an input to slave devices. It is used to synchronize the transfer of data between the master and slave on the MOSI and MISO lines.

The slave select (NSS) signal is an input used to select the SPI module when in slave mode by a master, or to disable the SPI module when in master mode. When in slave mode, it is pulled low to initiate a data transfer and remains low for the duration of the transfer.

Operation

Only a SPI master device can initiate a data transfer. The SPI is placed in master mode by setting the Master Enable flag (MSTEN, SPI0CN.1). Writing a byte of data to the SPI data register (SPI0DAT) 802 (Table 60) when in Master Mode starts a data transfer. The SPI master immediately shifts out the data serially on the MOSI line while providing the serial clock on SCK. The SPIF (SPI0CN.7) flag from register 804 (Table 58) is set to logic 1 at the end of the transfer. If interrupts are enabled, an interrupt request is generated when the SPIF flag is set. The SPI master can be configured to shift in/out from one to eight bits in a transfer operation in order to accommodate slave devices with different word lengths. The SPIFRS bits in an SPI Configuration Register 806 (Table 57) (SPI0CFG[2:0]) are used to select the number of bits to shift in/out in a transfer operation.

Figure 30:
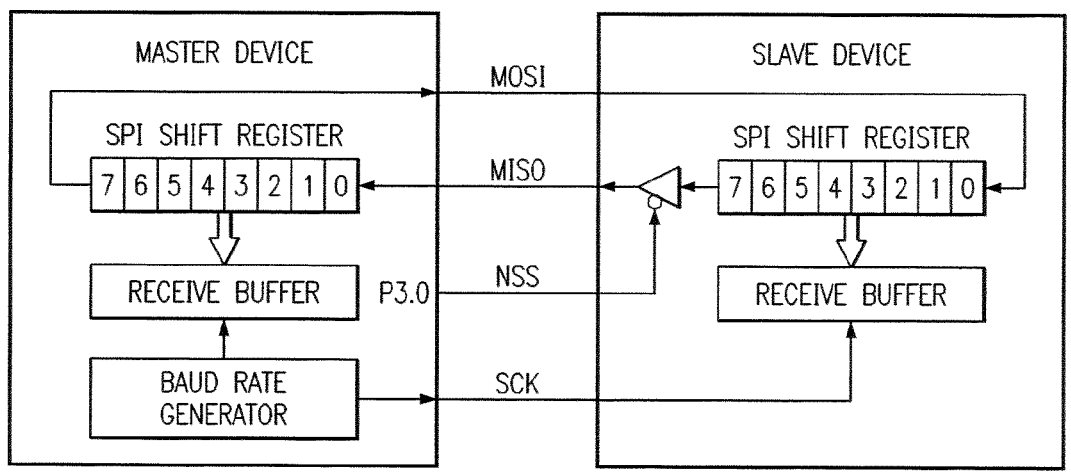
FIG. 30 illustrates a diagram of the full duplex operation.

While the SPI master transfers data to a slave on the MOSI line, the addressed SPI slave device simultaneously transfers the contents of its shift register to the SPI master on the MISO line in a full-duplex operation. The data byte received from the slave replaces the data in the master's data register. Therefore, the SPIF flag serves as both a transmit-complete and receive-data-ready flag. The data transfer in both directions is synchronized with the serial clock generated by the master. FIG. 30 illustrates the full-duplex operation of an SPI master and an addressed slave.

The SPI data register is double buffered on reads, but not on a write. If a write to SPI0DAT 802 is attempted during a data transfer, the WCOL flag (SPI0CN.6) will be set to logic 1 and the write is ignored. The current data transfer will continue uninterrupted. A read of the SPI data register by the system controller actually reads the receive buffer. If the receive buffer still holds unread data from a previous transfer when the last bit of the current transfer is shifted into the SPI shift register, a receive overrun occurs and the RXOVRN flag (SPI0CN.4) is set to logic 1. The new data is not transferred to the receive buffer, allowing the previously received data byte to be read. The data byte causing the overrun is lost.

When the SPI is enabled and not configured as a master, it will operate as an SPI slave. Another SPI device acting as a master will initiate a transfer by driving the NSS signal low. The master then shifts data out of the shift register on the MISO pin using the serial clock. The SPIF flag is set to logic 1 at the end of a data transfer (when the NSS signal goes high). The slave can load its shift register for the next data transfer by writing to the SPI data register. The slave must make the write to the data register at least one SPI serial clock cycle before the master starts the next transmission. Otherwise, the byte of data already in the slave's shift register will be transferred.

Multiple masters may reside on the same bus. A Mode Fault flag (MODF, SPI0CN.5) is set to logic 1 when the SPI is configured as a master (MSTEN=1) and its slave select signal NSS is pulled low. In a multiple-master environment, the system controller should check the state of the SLVSEL flag (SPI0CN.2) to ensure the bus is free before setting the MSTEN bit and initiating a data transfer.

Serial Clock Timing

Figure 31:
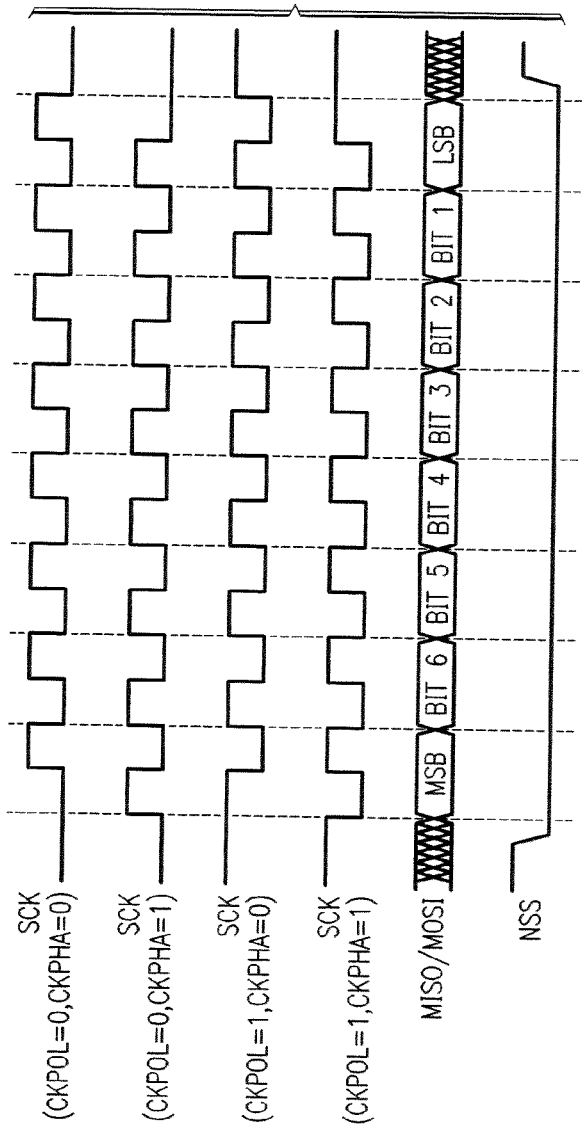
FIG. 31 illustrates a diagram of the data clock timing diagram.

As shown in FIG. 31, four combinations of serial clock phase and polarity can be selected using the clock control bits in the SPI Configuration Register (SPI0CFG) 806. The CKPHA bit (SPI0CFG.7) selects one of two clock phases (edge used to latch the data). The CKPOL bit (SPI0CFG.6) selects between an active-high or active-low clock. Both master and slave devices must be configured to use the same clock phase and polarity. Note: the SPI should be disabled (by clearing the SPIEN bit, SPI0CN.0) while changing the clock phase and polarity.

The SPI Clock Rate Register (SPI0CKR) 810 (Table 59) controls the master mode serial clock frequency. This register is ignored when operating in slave mode.

SPI Special Function Registers

The SPI is accessed and controlled through four special function registers in the system controller: SPI0CN Control Register 800, SPI0DAT Data Register 802, SPI0CFG Configuration Register 806, and SPI0CKR Clock Rate Register 810.

UART

Description

Figure 32A:
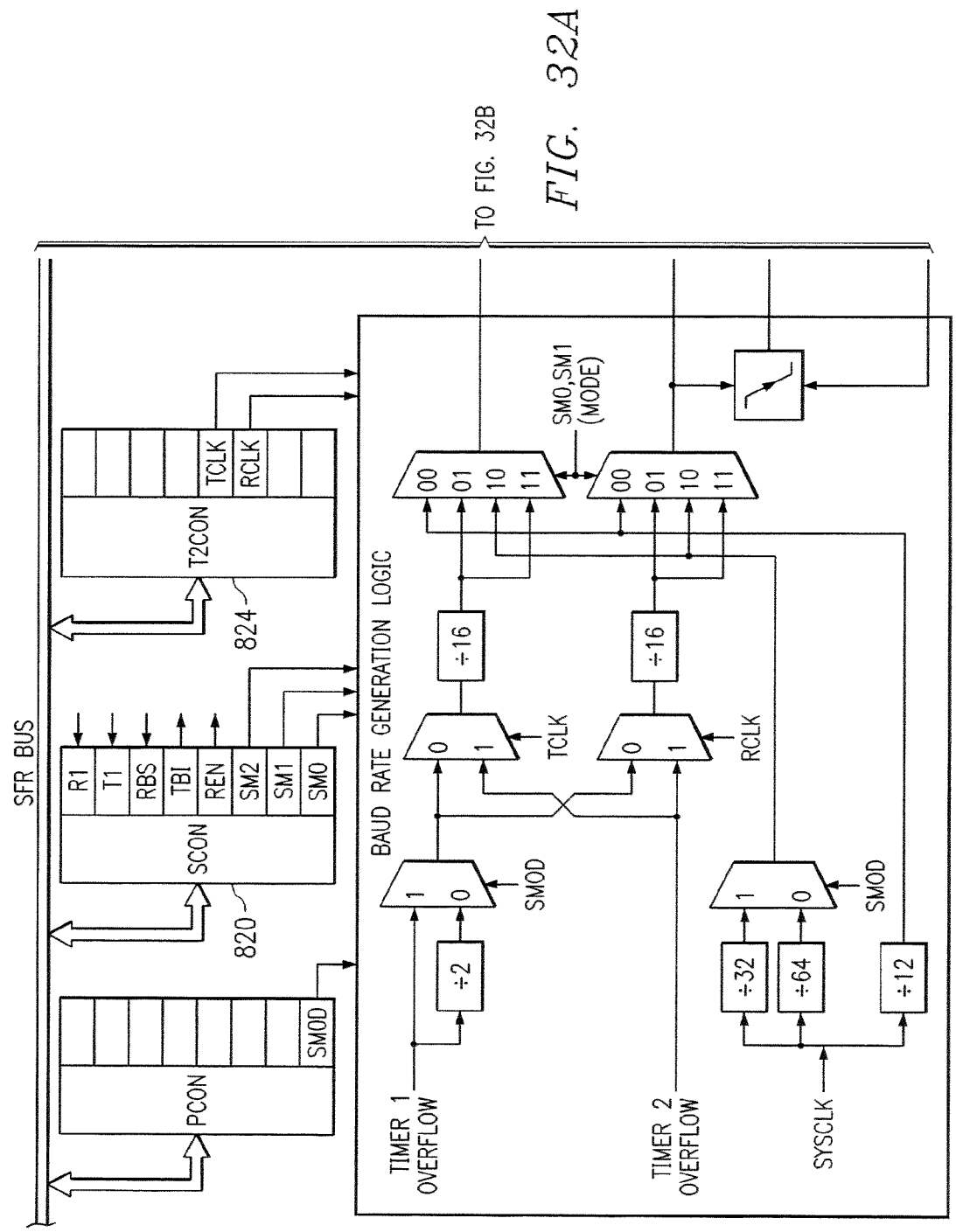
FIGS. 32A and 32B illustrates a diagram of the UART.
Figure 32B:
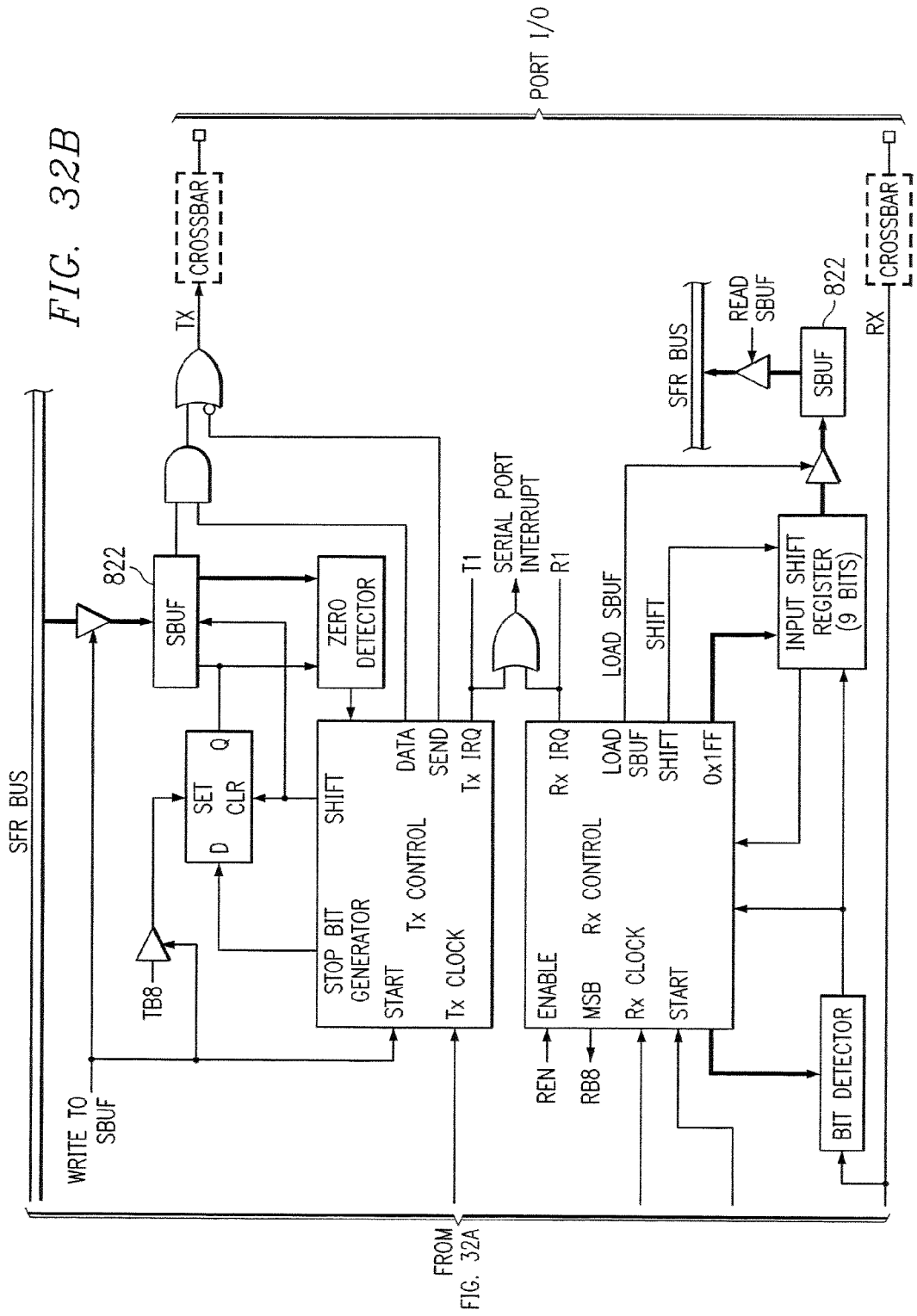

Referring now to FIGS. 32A and 32B, there is illustrated a block diagram of the UART, which is capable of asynchronous transmission. The UART can function in full duplex mode. In all modes, receive data is buffered in a holding register. This allows the UART to start reception of a second incoming data byte before software has finished reading the previous data byte.

The UART has an associated Serial Control Register (SCON) 820 (Table 62) and a Serial Data Buffer (SBUF) 822 in the SFRs. The single SBUF 822 location provides access to both transmit and receive registers. Reads access the Receive register and writes access the Transmit register automatically.

The UART is capable of generating interrupts if enabled. The UART has two sources of interrupts: a Transmit Interrupt flag, TI (SCON.1) set when transmission of a data byte is complete, and a Receive Interrupt flag, RI (SCON.0) set when reception of a data byte is complete. The UART interrupt flags are not cleared by hardware when the CPU vectors to the interrupt service routine. They must be cleared manually by software. This allows software to determine the cause of the UART interrupt (transmit complete or receive complete).

UART Operational Modes

The UART provides four operating modes (one synchronous and three asynchronous) selected by setting configuration bits in the SCON register. These four modes offer different baud rates and communication protocols. The four modes are summarized in Table 15.1 below.

| Mode | Synchronization | Baud Clock | Data Bits | Start/Stop Bits |
|---|---|---|---|---|
| 0 | Sync | SYSCLK or ½ | | |
| 1 | ASync | T1 on 72 Over | | |
| 2 | ASync | SYSCLK/32 or 164 | | |
| 3 | ASync | | | |

Mode 0: Synchronous Mode

Figure 33:
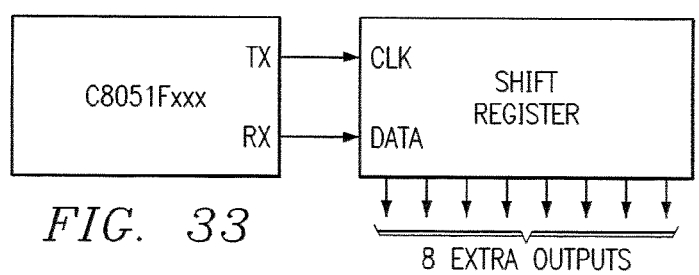
FIGS. 33, 34 and 35 illustrate diagrams for the UART diagrams.

Mode 0 provides synchronous, half-duplex communication. Serial data is transmitted and received on the RX pin. The TX pin provides the shift clock for both transmit and receive. The MCU must be the master since it generates the shift clock for transmission in both directions (FIG. 33 illustrates this.)

Figure 34:
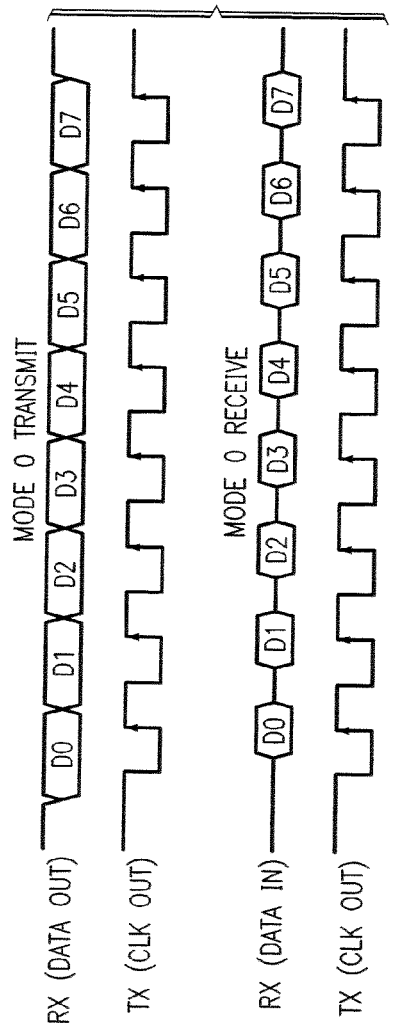

Eight data bits are transmitted/received, LSB first (FIG. 34 illustrates this timing diagram.) Data transmission begins when an instruction writes a data byte to the SBUF register 822. The TI Transmit Interrupt Flag (SCON.1) is set at the end of the eighth bit time. Data reception begins when the REN Receive Enable bit (SCON.4) is set to logic 1 and the RI Receive Interrupt Flag (SCON.0) is cleared. One cycle after the eighth bit is shifted in, the FT flag is set and reception stops until software clears the RI bit. An interrupt will occur if enabled when either TI or RI are set.

Mode 1: 8-Bit UART, Variable Baud Rate

Figure 35:
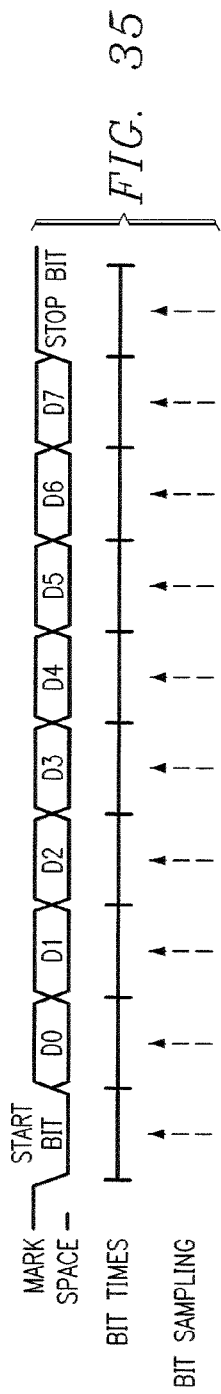
Figure 36:
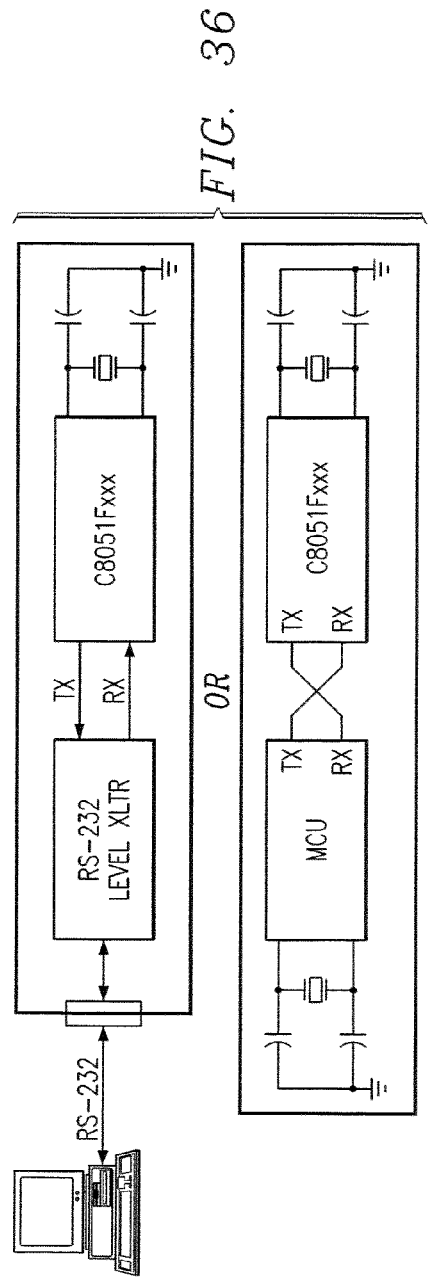
FIG. 36 illustrates a diagram for interconnects for the UART.

Mode 1 provides standard asynchronous, full duplex communication using a total of 10 bits per data byte: one start bit, eight data bits (LSB first), and one stop bit; the timing diagram illustrated in FIG. 35. Data are transmitted from the TX pin and received at the RX pin. On receive, the eight data bits are stored in SBUF and the stop bit goes into RB8 (SCON.2).

Data transmission begins when an instruction writes a data byte to the SBUF register. The TI Transmit Interrupt Flag (SCON.1) is set at the end of the transmission (the beginning of the stop-bit time). Data reception can begin any time after the REN Receive Enable bit (SCON.4) is set to logic 1. After the stop bit is received, the data byte will be loaded into the SBUF receive register if the following conditions are met: RI must be logic 0, and if SM2 is logic 1, the stop bit must be logic 1.

If these conditions are met, the eight bits of data is stored in SBUF, the stop bit is stored in RB8 and the RI flag is set. If these conditions are not met, SBUF and RB8 will not be loaded and the RI flag will not be set. An interrupt will occur if enabled when either TI or RI are set.

The baud rate generated in Mode 1 is a function of timer overflow. The UART can use either Timer 1 or Timer 2 operating in auto-reload mode to generate the baud rate. On each timer overflow event (a rollover from all ones—0xFF for Timer 1, 0xFFFF for Timer 2—to zero) a clock is sent to the baud rate circuit. This clock is divided by 16 to generate the baud rate.

Timer 1 should be configured for 8-bit Counter/Timer with Auto-Reload mode and its interrupt disabled when used as a baud rate generator. The combination of system clock fre quency and the reload value stored in TH1 determine the baud rate as follows:

Mode 1 Baud Rate=$(2^{SMOD}/32)*(SYSCLK*12^{(T1M-1)}/(256-TH1))$

The SMOD bit (PCON.7) selects whether or not to divide the Timer 1 overflow rate by two. On reset, the SMOD bit is logic 0, thus selecting the lower speed baud rate by default. Selecting the timebase used by Timer 1 allows further control of baud rate generation. Using the system clock divided by one (setting T1M in CKCON) changes the twelve in the denominator of the equation above to a one.

To use Timer 2 for baud rate generation, configure the timer Baud Rate Generator mode and set RCLK and/or TCLK to logic 1. Setting RCLK and/or TCLK automatically disables Timer 2 interrupts and configures Timer 2 to use the system clock divided by two as its timebase. If a different timebase is required, setting the C/T2 bit to logic 1 will allow the timebase to be derived from a clock supplied to the external input pin T2. The combination of clock frequency and the reload value stored in capture registers determine the baud rate as follows:

Mode 1 Baud Rate=$SYSCLK/[32*(65536-[RCAP2H:RCAP2L])]$, where [RCAP2H:RCAP2L] is the 16-bit value held in the capture registers.

Mode 2: 9-Bit UART, Fixed Baud Rate

Figure 37:
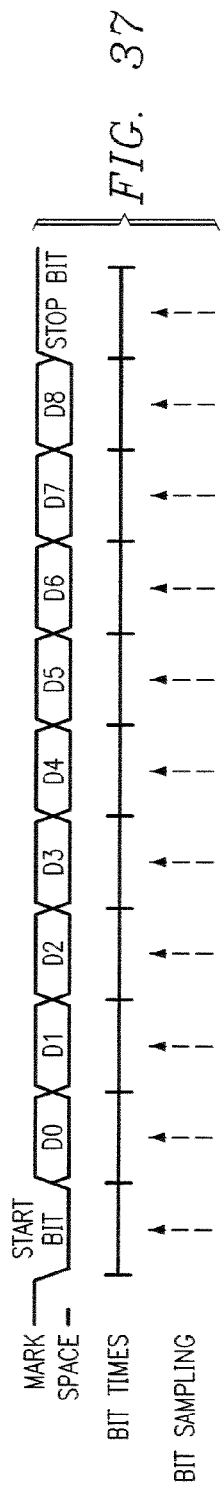
FIG. 37 illustrates a timing diagram for the UART.

Mode 2 provides asynchronous, full-duplex communication using a total of eleven bits per data byte: a start bit, 8 data bits (LSB first), a programmable ninth data bit, and a stop bit, the timing diagram therefore illustrated in FIG. 37. On transmit, the ninth data bit is determined by the value in TB8 (SCON.3). It can be assigned the value of the parity flag P in the PSW or used in multiprocessor communications. On receive, the ninth data bit goes into RB8 (SCON.2) and the stop bit is ignored.

Data transmission begins when an instruction writes a data byte to the SBUF register. The TI Transmit Interrupt Flag (SCON.1) is set at the end of the transmission (the beginning of the stop-bit time). Data reception can begin any time after the REN Receive Enable bit (SCON.4) is set to logic 1. After the stop bit is received, the data byte will be loaded into the SBUF receive register if the following conditions are met: RI must be logic 0, and if SM2 is logic 1, the $9^{th}$ bit must be logic 1.

If these conditions are met, the eight bits of data is stored in SBUF, the ninth bit is stored in RB8 and the RI flag is set. If these conditions are not met, SBUF and RB8 will not be loaded and the RI flag will not be set. An interrupt will occur if enabled when either TI or RI are set.

The baud rate in Mode 2 is a direct function of the system clock frequency as follows:

Mode 2 Baud Rate=$2^{SMOD}*(SYSCLK/64)$.

The SMOD bit (PCON.7) selects whether to divide SYSCLK by 32 or 64. In the formula, 2 is raised to the power SMOD, resulting in a baud rate of either 1/32 or 1/64 of the system clock frequency. On reset, the SMOD bit is logic 0, thus selecting the lower speed baud rate by default.

Mode 3: 9-Bit UART, Variable Baud Rate

Mode 3 is the same as Mode 2 in all respects except the baud rate is variable. The baud rate is determined in the same manner as for Mode 1. Mode 3 operation transmits 11 bits: a start bit, 8 data bits (LSB first), a programmable ninth data bit, and a stop bit. Timer 1 or Timer 2 overflows generate the baud rate just as with Mode 1. In summary, Mode 3 transmits using the same protocol as Mode 2 but with Mode 1 baud rate generation.

The Timer Mode Register (T2CON) 824 is illustrated in Table 64.

Multiprocessor Communications

Figure 38:
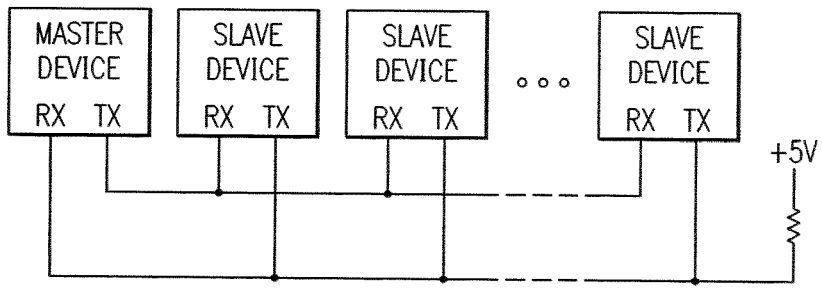
FIG. 38 illustrates and interconnect diagram for the UART.

Modes 2 and 3 support multiprocessor communication between a master processor and one or more slave processors by special use of the ninth data bit, as illustrated in FIG. 38. When a master processor wants to transmit to one or more slaves, it first sends an address byte to select the target(s). An address byte differs from a data byte in that its ninth bit is logic 1; in a data byte, the ninth bit is always set to logic 0.

Setting the SM2 bit (SCON.5) of a slave processor configures its UART such that when a stop bit is received, the UART will generate an interrupt only if the ninth bit is logic one (RB8=1) signifying an address byte has been received. In the UART's interrupt handler, software will compare the received address with the slave's own assigned 8-bit address. If the addresses match, the slave will clear its SM2 bit to enable interrupts on the reception of the following data byte(s). Slaves that weren't addressed leave their SM2 bits set and do not generate interrupts on the reception of the following data bytes, thereby ignoring the data. Once the entire message is received, the addressed slave resets its SM2 bit to ignore all transmissions until it receives the next address byte.

Multiple addresses can be assigned to a single slave and/or a single address can be assigned to multiple slaves, thereby enabling "broadcast" transmissions to more than one slave simultaneously. The master processor can be configured to receive all transmissions or a protocol can be implemented such that the master/slave role is temporarily reversed to enable half-duplex transmission between the original master and slave(s).

Timers

The Microcontroller 40 implements four counter/timers: three are 16-bit counter/timers compatible with those found in the standard 8051, and one is a 16-bit timer for use with the ADC, SMBus, or for general purpose use. These can be used to measure time intervals, count external events and generate periodic interrupt requests. Timer 0 and Timer 1 are nearly identical and have four primary modes of operation. Timer 2 offers additional capabilities not available in Timers 0 and 1. Timer 3 is similar to Timer 2, but without the capture or Baud Rate Generator modes. Table 65 illustrates the timers.

TABLE 65

| Timer 0 and Timer 1: | Timer 2: | Timer 3: |
| --- | --- | --- |
| 13-bit counter/timer | 16-bit counter/timer with auto-reload | 16-bit timer with auto-reload |
| 16-bit counter/timer | 16-bit counter/timer with capture | |
| 8-bit counter/timer with auto-reload | Baud rate generator | |
| two 8-bit counter/timers (Timer 0 only) | | |

When functioning as a timer, the counter/timer registers are incremented on each clock tick. Clock ticks are derived from the system clock divided by either one or twelve as specified by the Timer Clock Select bits (T2M-T0M) in CKCON. The twelve-clocks-per-tick option provides compatibility with the older generation of the 8051 family. Applications that require a faster timer can use the one-clock-per-tick option.

When functioning as a counter, a counter/timer register is incremented on each high-to-low transition at the selected input pin. Events with a frequency of up to one-fourth the system clock's frequency can be counted. The input signal need not be periodic, but it should be held at a given level for at least two full system clock cycles to ensure the level is sampled.

Timer 0 and Timer 1

Timer 0 and Timer 1 are accessed and controlled through SFRs. Each counter/timer is implemented as a 16-bit register accessed as two separate bytes: a low byte (TL0 or TL1) and a high byte (TH0 or TH1). The Counter/Timer Control (TCON) register 830 (Table 66) is used to enable Timer 0 and Timer 1 as well as indicate their status. Both counter/timers operate in one of four primary modes selected by setting the Mode Select bits M1-M0 in the Counter/Timer Mode (TMOD) register. Each timer can be configured independently. Following is a detailed description of each operating mode.

Mode 0: 13-bit Counter/Timer

Figure 39:
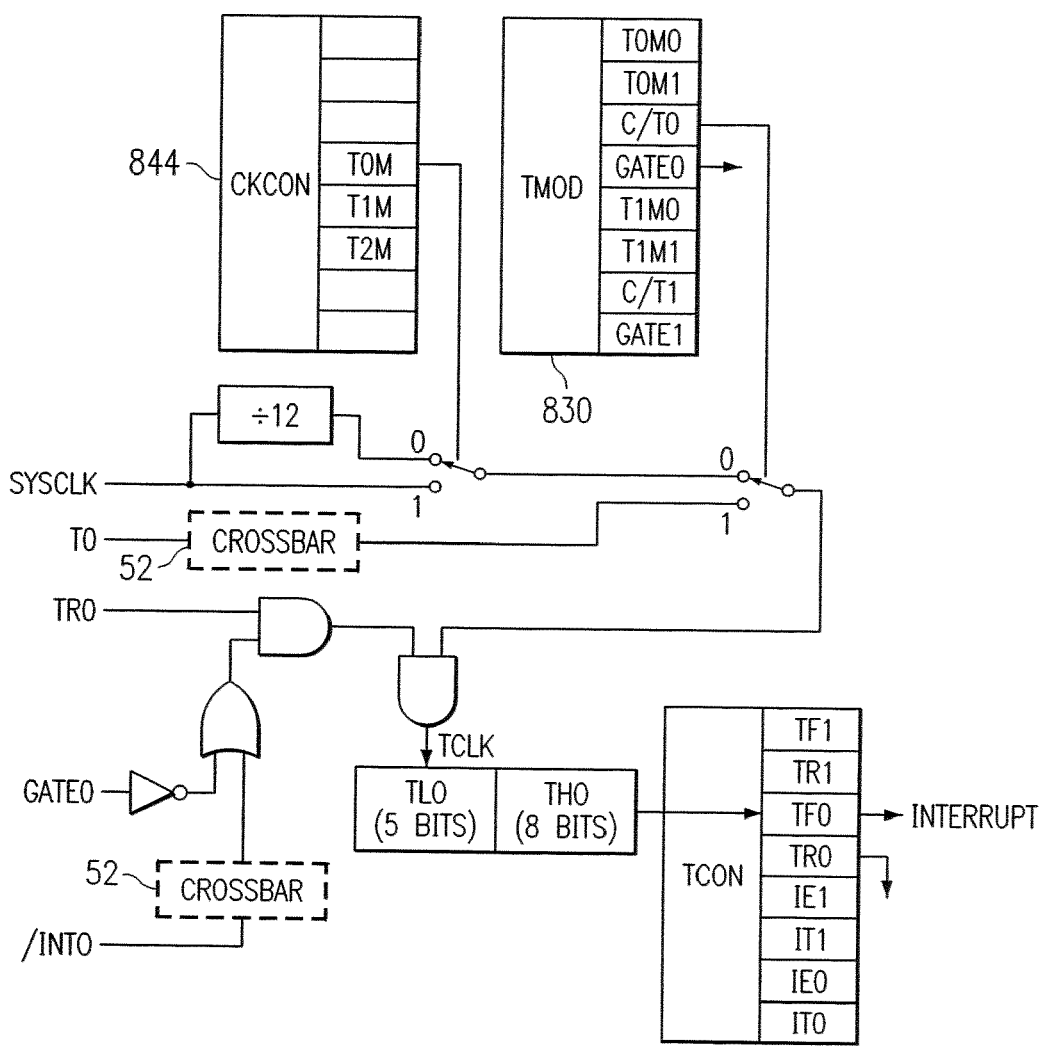
FIGS. 39-44 illustrates block diagrams for the T0 and T1 modes.

Timer 0 and Timer 1 operate as a 13-bit counter/timer in Mode 0. The following describes the configuration and operation of Timer 0, illustrated in FIG. 39. However, both timers operate identically and Timer 1 is configured in the same manner as described for Timer 0.

The TH0 register holds the eight MSBs of the 13-bit counter/timer. TL0 holds the five LSBs in bit positions TL0.4-TL0.0. The three upper bits of TL0 (TL0.7-TL0.5) are indeterminate and should be masked out or ignored when reading. As the 13-bit timer register increments and overflows from 0x1FFF (all ones) to 0x0000, the timer overflow flag TF0 (TCON.5) is set and an interrupt will occur if enabled.

The C/T0 bit (TMOD.2) selects the counter/timer's clock source. Clearing C/T selects the system clock as the input for the timer. When C/T0 is set to logic 1, high-to-low transitions at the selected input pin increment the timer register.

Setting the TR0 bit (TCON.4) enables the timer when either GATE0 (TMOD.3) is 0 or the input signal /INT0 is logic-level one. Setting GATE 0 to logic 1 allows the timer to be controlled by the external input signal /INT0, facilitating pulse width measurements. Table 67 illustrates the TR0 bit/Gate lists.

TABLE 67

| TR0 | GATE0 | /INT0 | Counter/Timer |
|---|---|---|---|
| 0 | X | X | Disabled |
| 1 | 0 | X | Enabled |
| 1 | 1 | 0 | Disabled |
| 1 | 1 | 1 | Enabled |

X = Don't Care

Setting TR0 does not reset the timer register. The timer register should be initialized to the desired value before enabling the timer.

TL1 and TH1 form the 13-bit register for Timer 1 in the same manner as described above for TL0 and TH0. Timer 1 is configured and controlled using the relevant TCON and TMOD bits just as with Timer 0.

Mode 1: 16-bit Counter/Timer

Mode 1 operation is the same as Mode 0, except that the counter/timer registers use all 16 bits. The counter/timers are enabled and configured in Mode 1 in the same manner as for Mode 0.

Mode 2: 8-bit Counter/Timer with Auto-Reload

Figure 40:
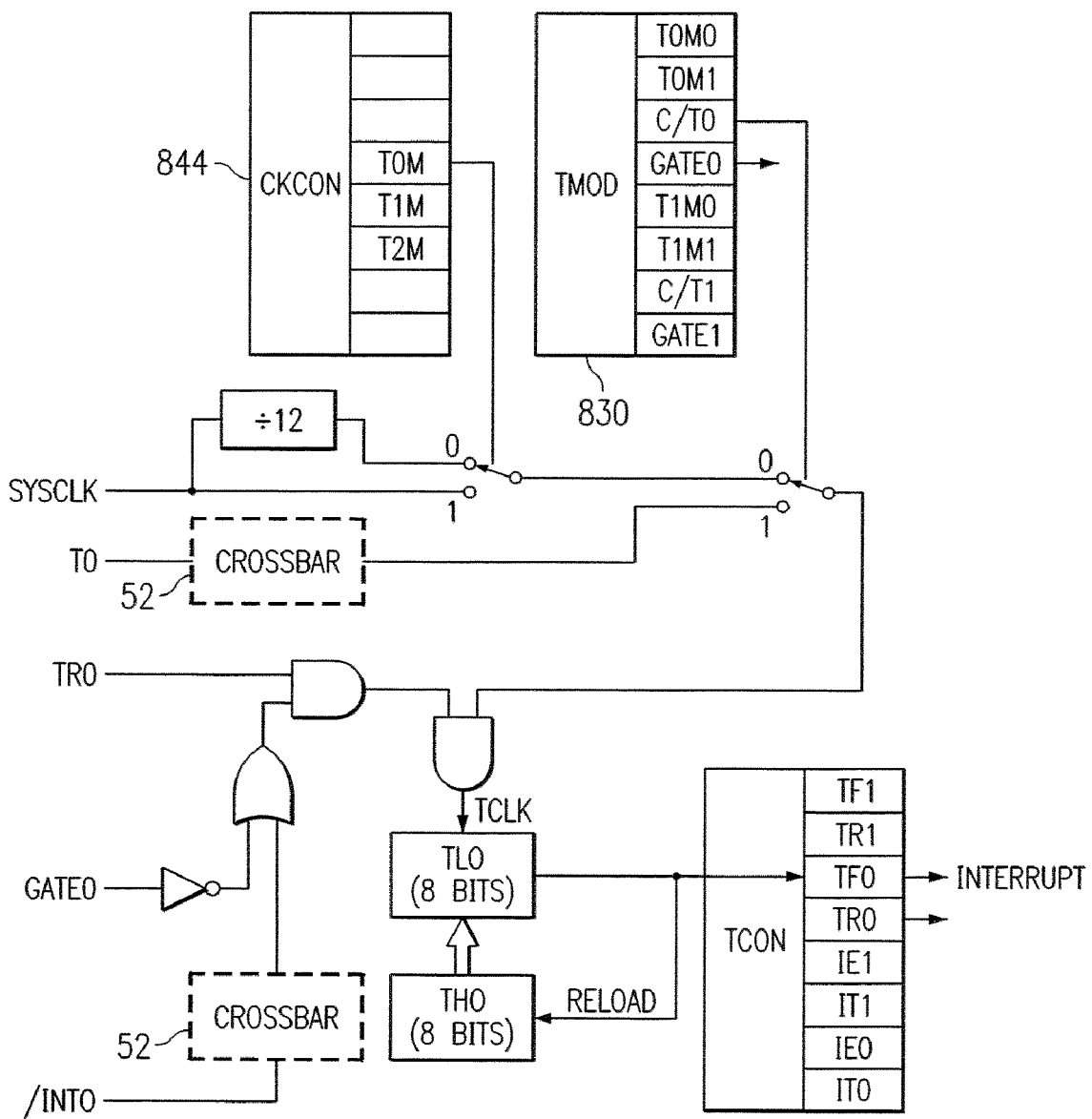

Mode 2 configures Timer 0 and Timer 1 to operate as 8-bit counter/timers with automatic reload of the start value, and is illustrated in FIG. 40. The TL0 holds the count and TH0 holds the reload value. When the counter in TL0 overflows from all ones to 0x00, the timer overflow flag TF0 (TCON.5) is set and the counter in TL0 is reloaded from TH0. If enabled, an interrupt will occur when the TF0 flag is set. The reload value in TH0 is not changed. TL0 must be initialized to the desired value before enabling the timer for the first count to be correct. When in Mode 2, Timer 1 operates identically to Timer 0. Both counter/timers are enabled and configured in Mode 2 in the same manner as Mode 0.

Mode 3: Two 8-Bit Counter/Timers (Timer 0 Only)

Figure 41:
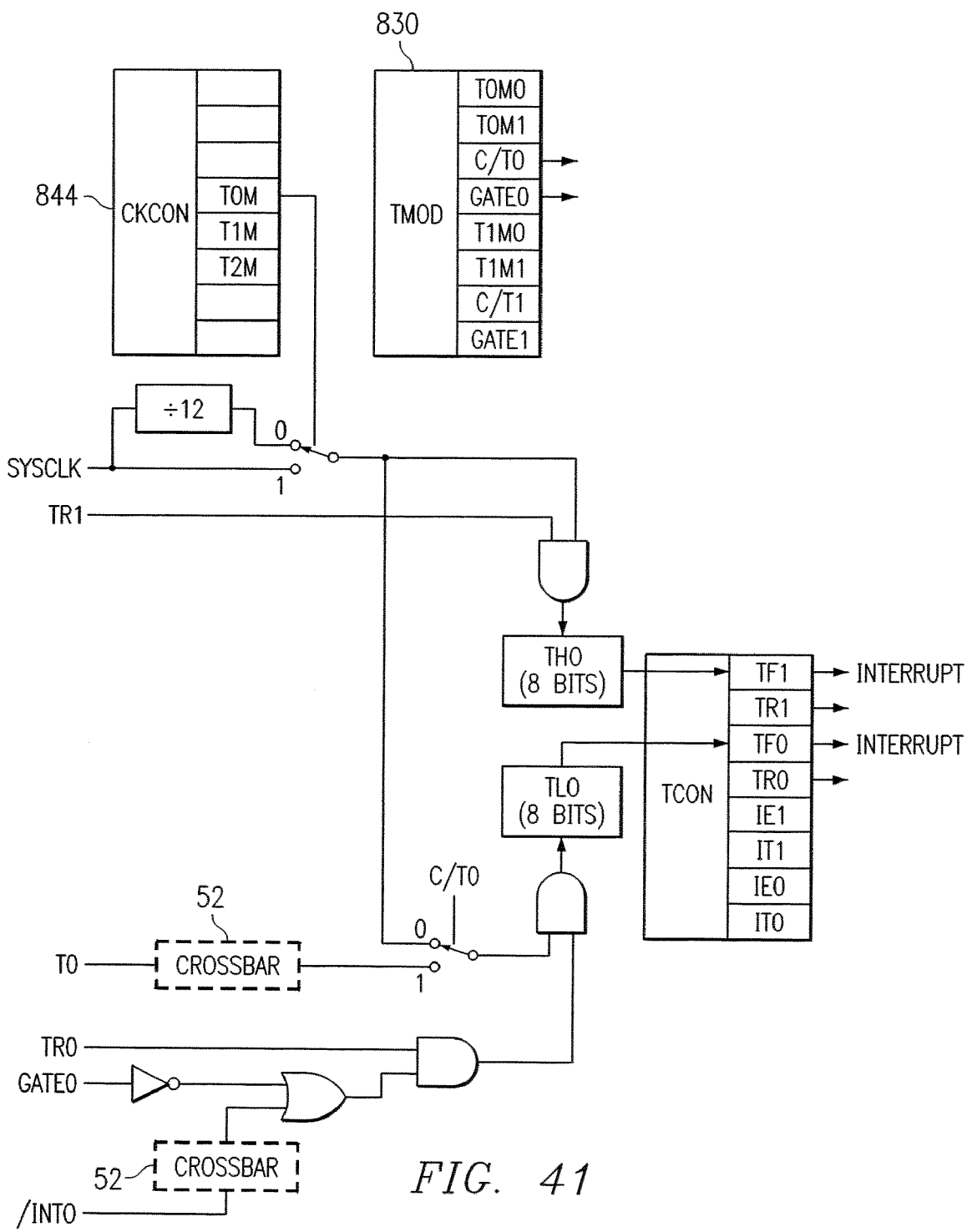

Timer 0 and Timer 1 behave differently in Mode 3. Timer 0 is configured as two separate 8-bit counter/timers held in TL0 and TH0, and is illustrated in FIG. 41. The counter/timer in TL0 is controlled using the Timer 0 control/status bits in TCON and TMOD: TR0, C/T0, GATE 0 and TF0. It can use either the system clock or an external input signal as its timebase. The TH0 register is restricted to a timer function sourced by the system clock. TH0 is enabled using the Timer 1 run control bit TR1. TH0 sets the Timer 1 overflow flag TF1 on overflow and thus controls the Timer 1 interrupt.

Timer 1 is inactive in Mode 3, so with Timer 0 in Mode 3, Timer 1 can be turned off and on by switching it into and out of its Mode 3. When Timer 0 is in Mode 3, Timer 1 can be operated in Modes 0, 1 or 2, but cannot be clocked by external signals nor set the TF1 flag and generate an interrupt. However, the Timer 1 overflow can be used for baud rate generation.

The Timer 0 and Timer 1 operations are illustrated in Tables 70-73.

Timer 2

Timer 2 is a 16-bit counter/timer formed by the two 8-bit SFRs: TL2 (low byte) and TH2 (high byte). As with Timers 0 and 1, Timer 2 can use either the system clock or transitions on an external input pin as its clock source. The Counter/Timer Select bit C/T2 bit (T2CON.1) selects the clock source for Timer 2. Clearing C/T2 selects the system clock as the input for the timer (divided by either one or twelve as specified by the Timer Clock Select bit T2M in CKCON). When C/T2 is set to 1, high-to-low transitions at the T2 input pin increment the counter/timer register. Timer 2 can also be used to start an ADC Data Conversion.

Timer 2 offers capabilities not found in Timer 0 and Timer 1. It operates in one of three modes: 16-bit Counter/Timer with Capture, 16-bit Counter/Timer with Auto-Reload or Baud Rate Generator Mode. Timer 2's operating mode is selected by setting configuration bits in the Timer 2 Control (T2CON) register (Table 74). Below is a summary of the Timer 2 operating modes and the T2CON bits used to configure the counter/timer. Detailed descriptions of each mode follow in Table 68.

TABLE 68

| RCLK | TCLK | CP/RL2 | TR2 | Mode |
|---|---|---|---|---|
| 0 | 0 | 1 | 1 | 16-bit Counter/Timer with Capture |
| 0 | 0 | 0 | 1 | 16-bit Counter/Timer with Auto-Reload |
| 0 | 1 | X | 1 | Baud Rate Generator |
| 1 | 0 | X | 1 | Baud Rate Generator |
| 1 | 1 | X | 1 | Baud Rate Generator |
| X | X | X | 0 | Off |

Mode 0: 16-bit Counter/Timer with Capture

Figure 42:
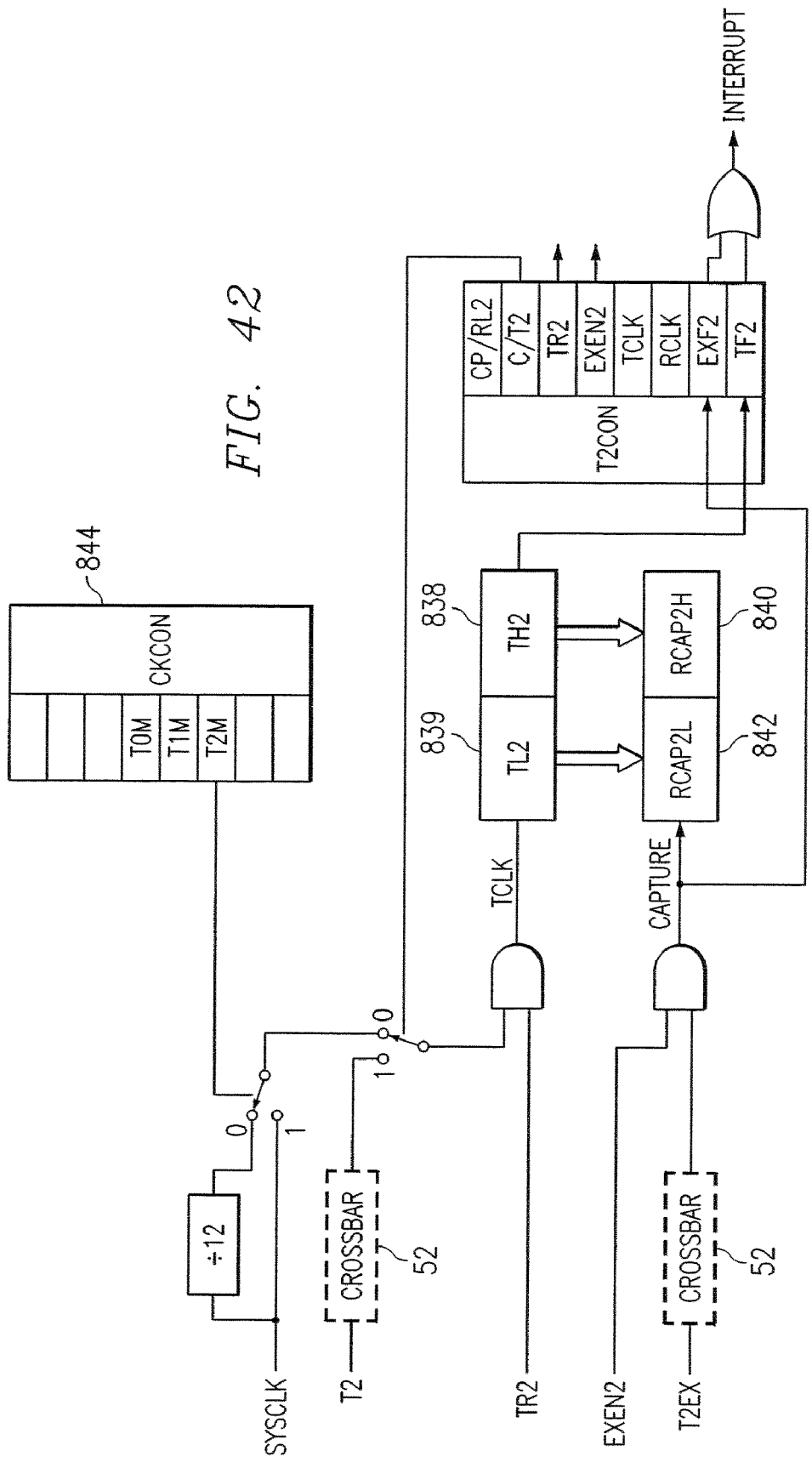

In this mode, illustrated in FIG. 42, Timer 2 operates as a 16-bit counter/timer with capture facility. A high-to-low transition on the T2EX input pin would cause the 16-bit value in Timer 2 (TH2 838, TL2 838) to be loaded into the capture registers (RCAP2H 840, RCAP2L 842).

Timer 2 can use either SYSCLK, SYSCLK divided by 12, or high-to-low transitions on the T2 input pin as its clock source when operating in Counter/Timer with Capture mode. Clearing the C/T2 bit (T2CON.1) selects the system clock as the input for the timer (divided by one or twelve as specified by the Timer Clock Select bit T2M in CKCON 844 (Table 69)). When C/T2 is set to logic 1, a high-to-low transition at the T2 input pin increments the counter/timer register. As the 16-bit counter/timer register increments and overflows from 0xFFFF to 0x0000, the TF2 timer overflow flag (T2CON.7) is set and an interrupt will occur if the interrupt is enabled.

Counter/Timer with Capture mode is selected by setting the Capture/Reload Select bit CP/RL2 (T2CON.0) and the Timer 2 Run Control bit TR2 (T2CON.2) to logic 1. The Timer 2 External Enable EXEN2 (T2CON.3) must also be set to logic 1 to enable a capture. If EXEN2 is cleared, transitions on T2EX will be ignored.

Mode 1: 16-bit Counter/Timer with Auto-Reload

Figure 43:
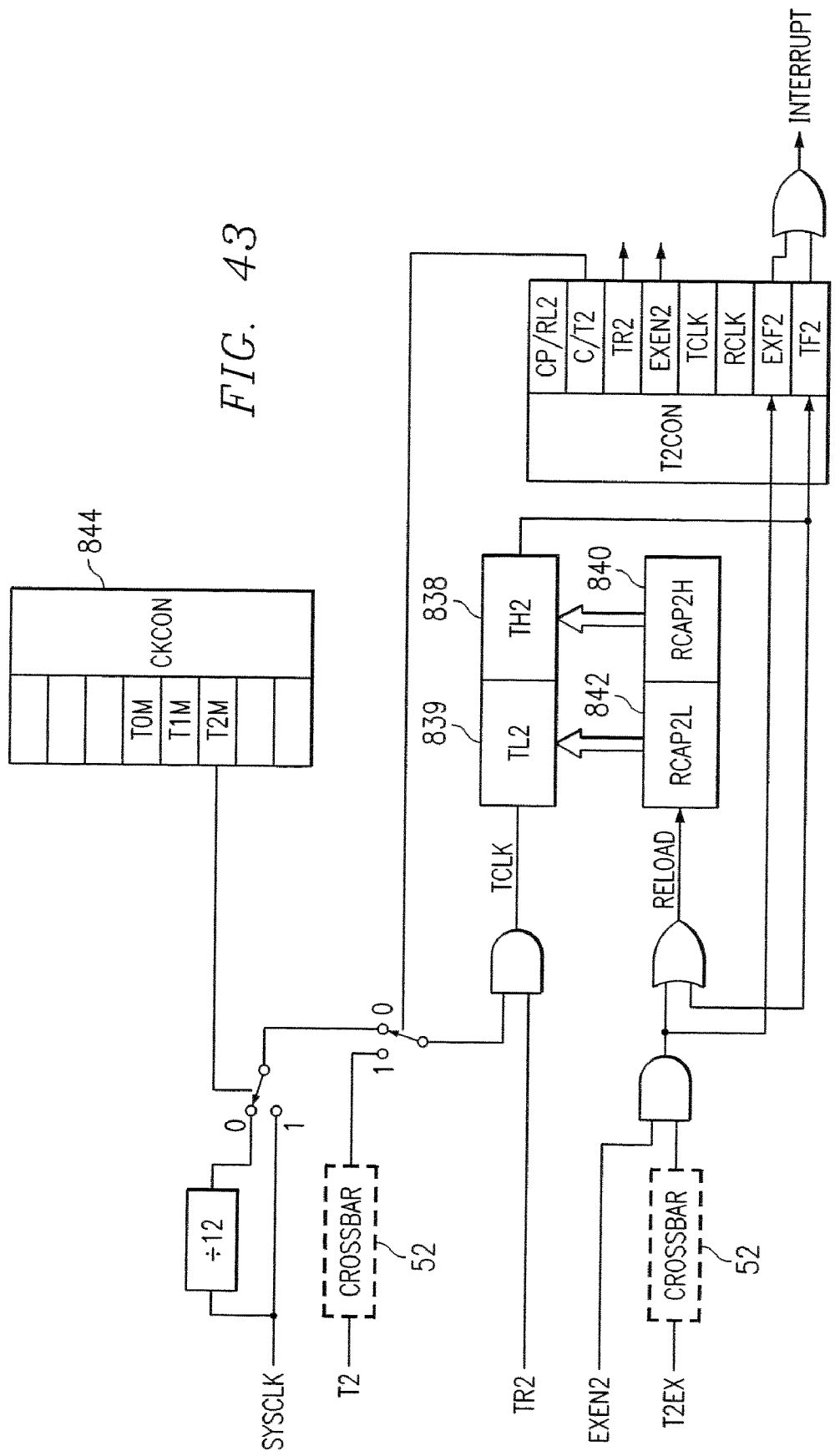

The Counter/Timer with Auto-Reload mode sets the TF2 timer overflow flag when the counter/timer register overflows from 0xFFFF to 0x0000, illustrated in FIG. 43. An interrupt is generated if enabled. On overflow, the 16-bit value held in the two capture registers (RCAP2H, RCAP2L) is automatically loaded into the counter/timer register and the timer is restarted.

Counter/Timer with Auto-Reload mode is selected by clearing the CP/RL2 bit. Setting TR2 to logic 1 enables and starts the timer. Timer 2 can use either the system clock or transitions on an external input pin as its clock source, as specified by the C/T2 bit. If EXEN2 is set to logic 1, a high-to-low transition on T2EX will also cause Timer 2 to be reloaded. If EXEN2 is cleared, transitions on T2EX will be ignored.

16.2.3. Mode 2: Baud Rate Generator

Figure 44:
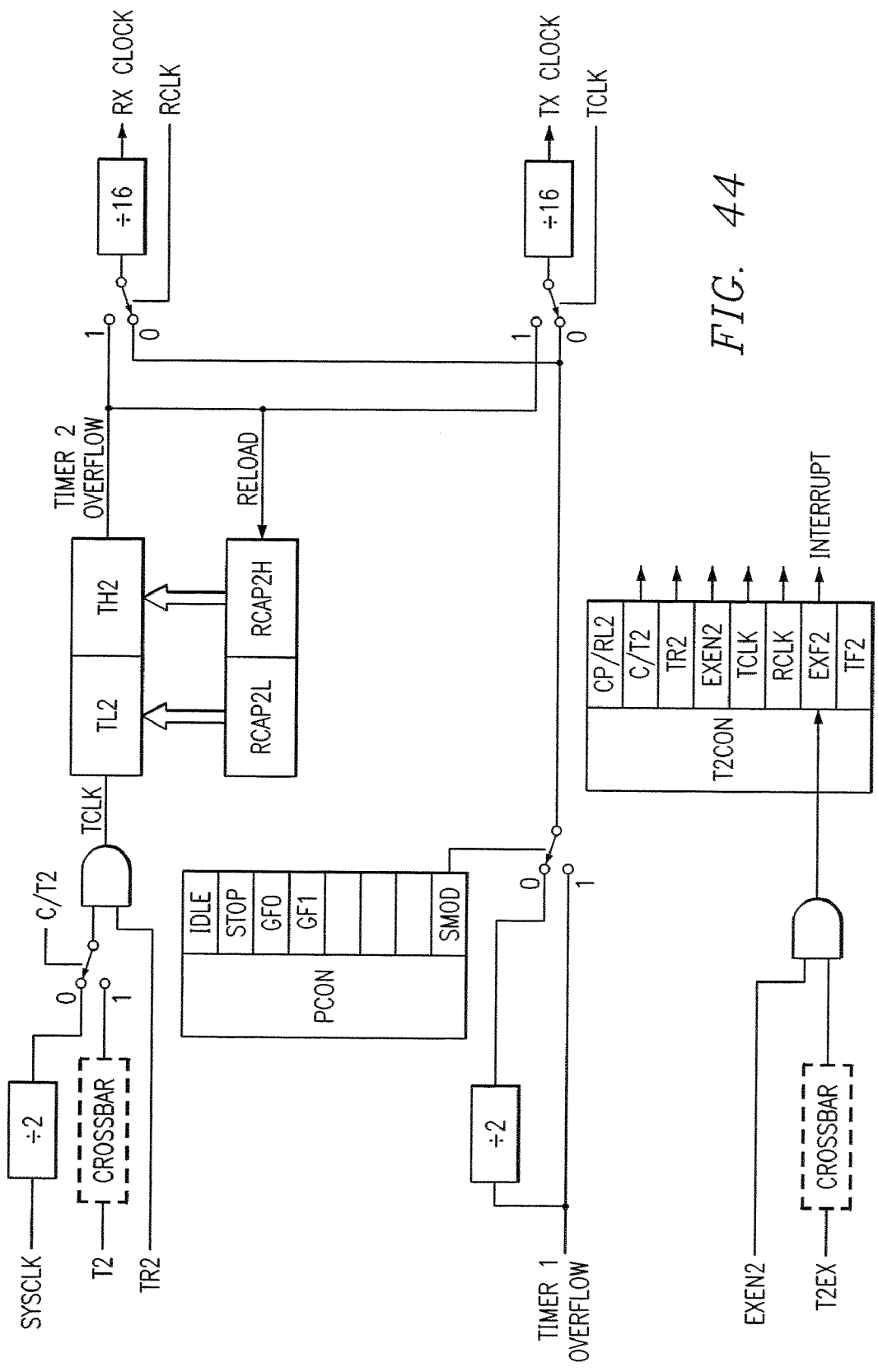
Figure 45:
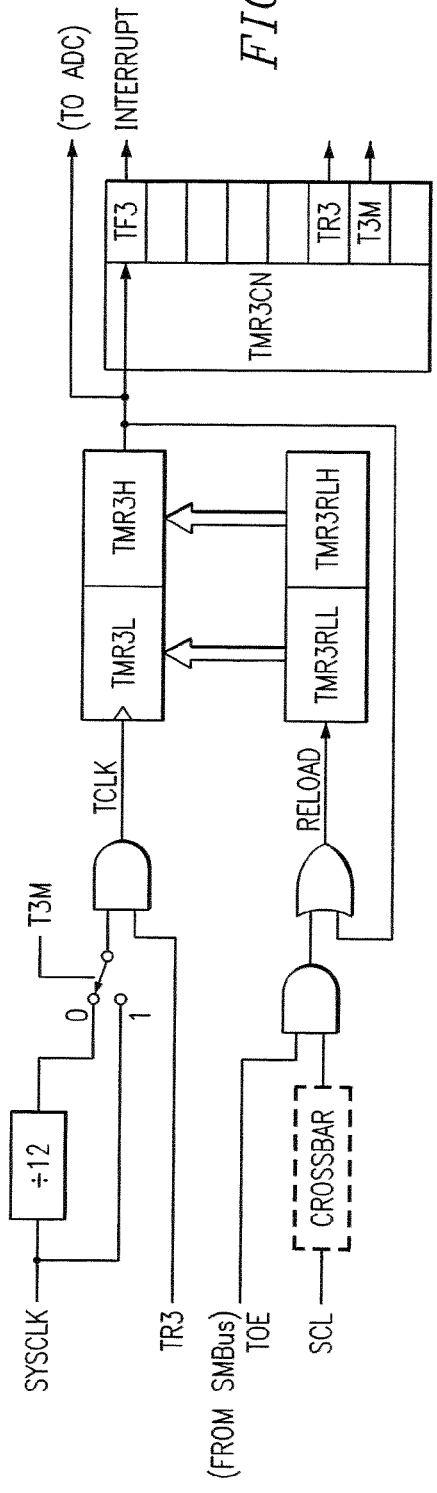
FIG. 45 illustrates a block diagram of the Timer.

Timer 2 can be used as a baud rate generator for the serial port (UART) when the UART is operated in modes 1 or 3, illustrated in FIG. 44. In Baud Rate Generator mode, Timer 2 works similarly to the auto-reload mode. On overflow, the 16-bit value held in the two capture registers (RCAP2H, RCAP2L) is automatically loaded into the counter/timer register. However, the TF2 overflow flag is not set and no interrupt is generated. Instead, the overflow event is used as the input to the UART's shift clock. Timer 2 overflows can be used to generate baud rates for transmit and/or receive independently.

The Baud Rate Generator mode is selected by setting RCLK (T2CON.5) and/or TCLK (T2CON.4) to logic one. When RCLK or TCLK is set to logic 1, Timer 2 operates in the auto-reload mode regardless of the state of the CP/RL2 bit. The baud rate for the UART, when operating in mode 1 or 3, is determined by the Timer 2 overflow rate:

Baud Rate=Timer 2 Overflow Rate/16.

Note, in all other modes, the timebase for the timer is the system clock divided by one or twelve as selected by the T2M bit in CKCON. However, in Baud Rate Generator mode, the timebase is the system clock divided by two. No other divisor selection is possible. If a different time base is required, setting the C/T2 bit to logic 1 will allow the timebase to be derived from the external input pin T2. In this case, the baud rate for the UART is calculated as:

Baud Rate=$FCLK/[32*(65536-[RCAP2H:RCAP2L])]$

Where FCLK is the frequency of the signal (TCLK) supplied to T2 and [RCAP2H:RCAP2L] is the 16-bit value held in the capture registers.

As explained above, in Baud Rate Generator mode, Timer 2 does not set the TF2 overflow flag and therefore cannot generate an interrupt. However, if EXEN2 is set to logic 1, a high-to-low transition on the T2EX input pin will set the EXF2 flag and a Timer 2 interrupt will occur if enabled. Therefore, the T2EX input may be used as an additional external interrupt source.

The Timer 2 Capture Registers are illustrated in Tables 75-78.

Programmable Counter Array

Description

The Programmable Counter Array (PCA) provides enhanced timer functionality while requiring less CPU intervention than the standard 8051 counter/timers. The PCA consists of a dedicated 16-bit counter/timer and five 16-bit capture/compare modules. Each capture/compare module has its own associated I/O line (CEXn) which is routed through the Crossbar to Port I/O when enabled (referring back to FIG. 7). The counter/timer is driven by a configurable timebase that can select between four inputs as its source: system clock divided by twelve, system clock divided by four, Timer 0 overflow, or an external clock signal on the ECI line. The PCA is configured and controlled through the system controller's Special Function Registers.

Capture/Compare Modules

Each module can be configured to operate independently in one of four operation modes: Edge-triggered Capture, Software Timer, High Speed Output, or Pulse Width Modulator. Each module has Special Function Registers (SFRs) associated with it in the Microcontroller 40 system controller. These registers are used to exchange data with a module and configure the module's mode of operation.

Figure 46:
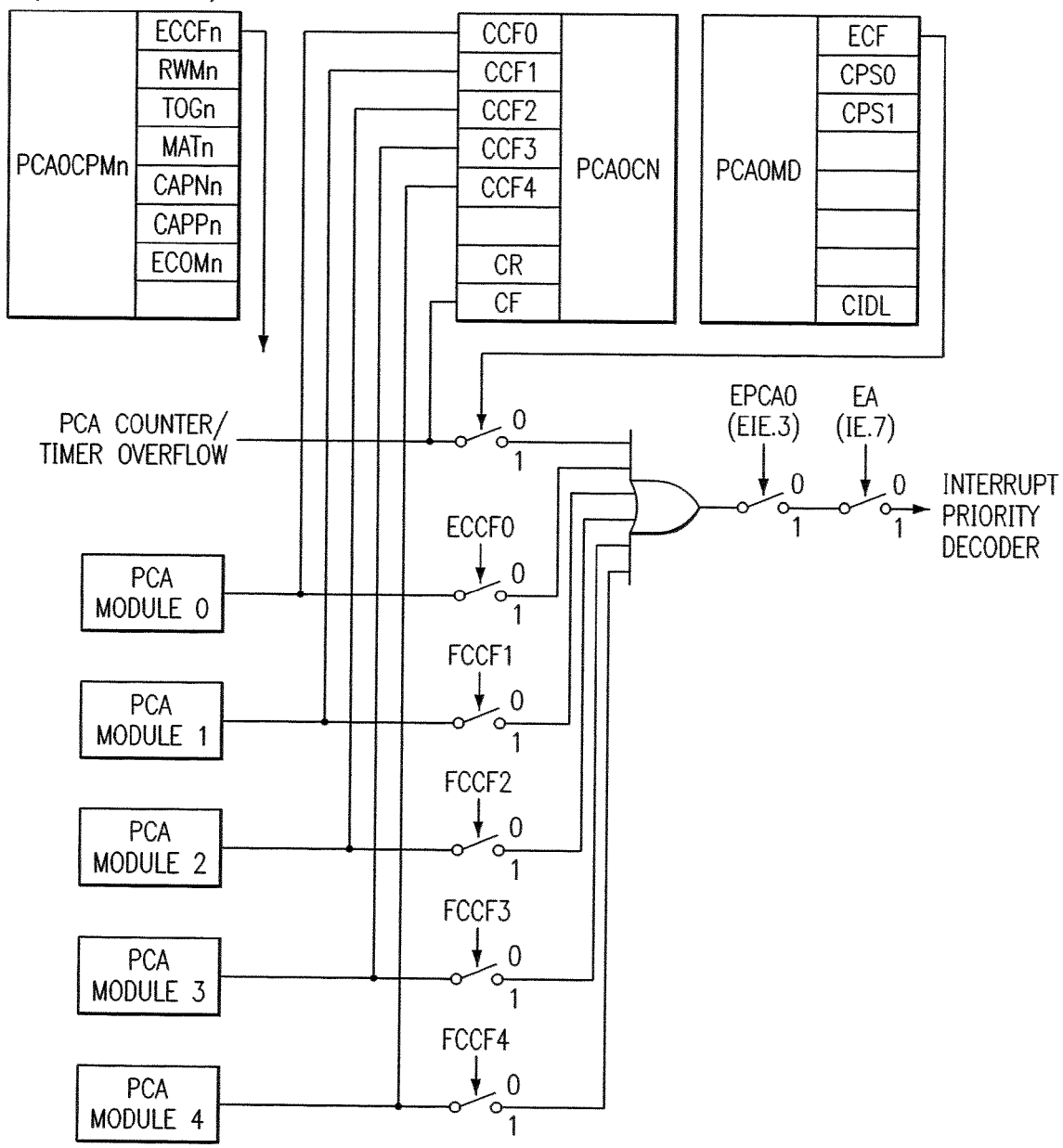

Table 80 summarizes the bit settings in the PCA0CPMn registers used to place the PCA capture/compare modules into different operating modes. Setting the ECCFn bit in a PCA0CPMn register enables the module's CCFn interrupt. Note: PCA0 interrupts must be globally enabled before individual CCFn interrupts are recognized. PCA0 interrupts are globally enabled by setting the EA bit (IE.7) and the EPCA0 bit (EIE1.3) to logic 1. FIG. 46 illustrates the PCA interrupt configuration.

TABLE 80

| PCA0CPM Register Settings for PCA Capture/Compare Modules | | | | | | | |
|---|---|---|---|---|---|---|---|
| ECOM | CAPP | CAPN | MAT | TOG | PWM | ECCF | Operation Mode |
| X | 1 | 0 | 0 | 0 | 0 | X | Capture triggered by positive edge on CEXn |
| X | 0 | 1 | 0 | 0 | 0 | X | Capture triggered by negative edge on CEXn |
| X | 1 | 1 | 0 | 0 | 0 | X | Capture triggered by transition on CEXn |
| 1 | 0 | 0 | 1 | 0 | 0 | X | Software Timer |

TABLE 80-continued

PCA0CPM Register Settings for PCA Capture/Compare Modules

| ECOM | CAPP | CAPN | MAT | TOG | PWM | ECCF | Operation Mode |
|------|------|------|-----|-----|-----|------|----------------|
| 1 | 0 | 0 | 1 | 1 | 0 | X | High Speed Output |
| 1 | 0 | 0 | 0 | 0 | 1 | 0 | Pulse Width Modulator |

X = Don't Care

Edge-triggered Capture Mode

Figure 47:
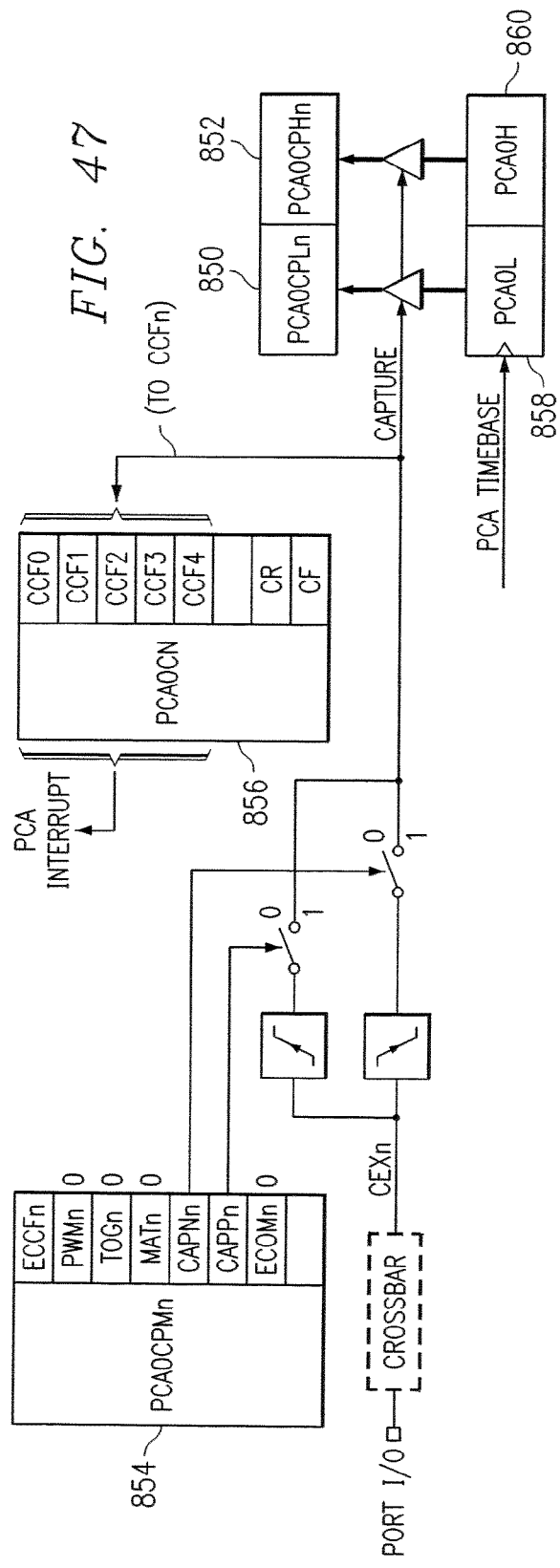
FIGS. 46-51 illustrates diagrams for the various PCA operational modes.

In this mode, illustrated in FIG. 47 a valid transition on the CEXn pin causes the PCA to capture the value of the PCA counter/timer and load it into the corresponding module's 16-bit capture/compare register (PCA0CPLn 850 and PCA0CPHn 852). The CAPPn and CAPNn bits in the PCA0CPMn register 854 are used to select the type of transition that triggers the capture: low-to-high transition (positive edge), high-to-low transition (negative edge), or either transition (positive or negative edge). When a capture occurs, the Capture/Compare Flag (CCFn) in PCA0CN 856 is set to logic 1 and an interrupt request is generated if CCF interrupts are enabled. The CCFn bit is not automatically cleared by hardware when the CPU vectors to the interrupt service routine, and must be cleared by software.

Software Timer (Compare) Mode

Figure 48:
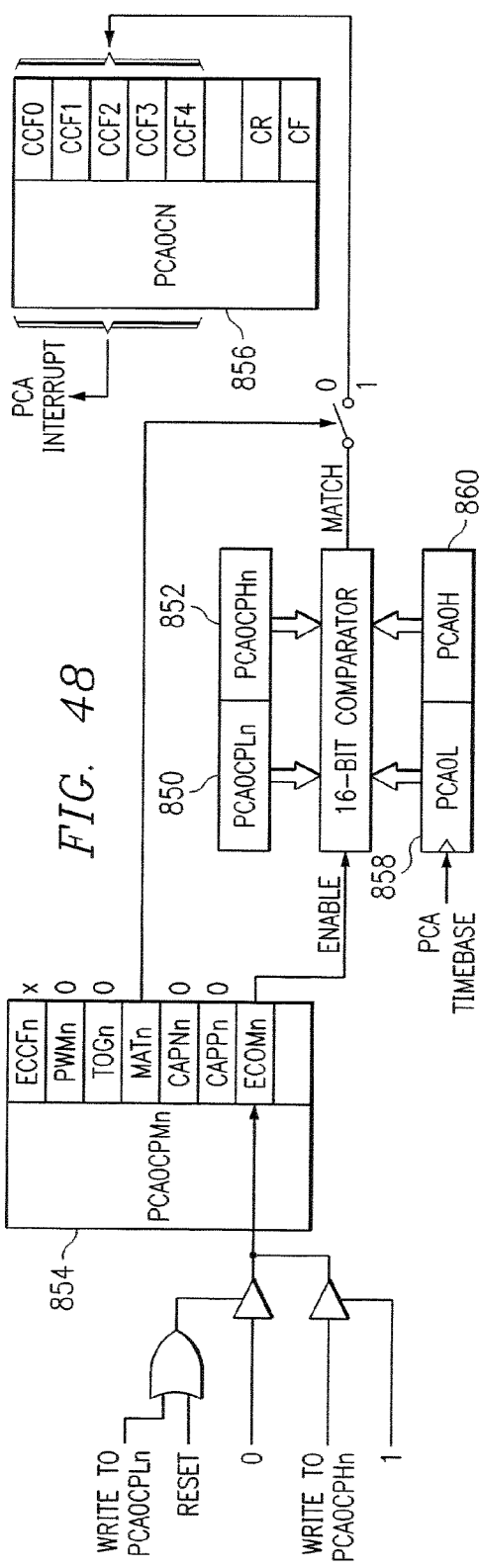

In Software Timer mode, illustrated in FIG. 48, the PCA counter/timer is compared to the module's 16-bit capture/compare register (PCA0CPHn and PCA0CPLn). When a match occurs, the Capture/Compare Flag (CCFn) in PCA0CN is set to logic 1 and an interrupt request is generated if CCF interrupts are enabled. The CCFn bit is not automatically cleared by hardware when the CPU vectors to the interrupt service routine, and must be cleared by software. Setting the ECOMn and MATn bits in the PCA0CPMn register 854 enables Software Timer mode.

High Speed Output Mode

Figure 49:
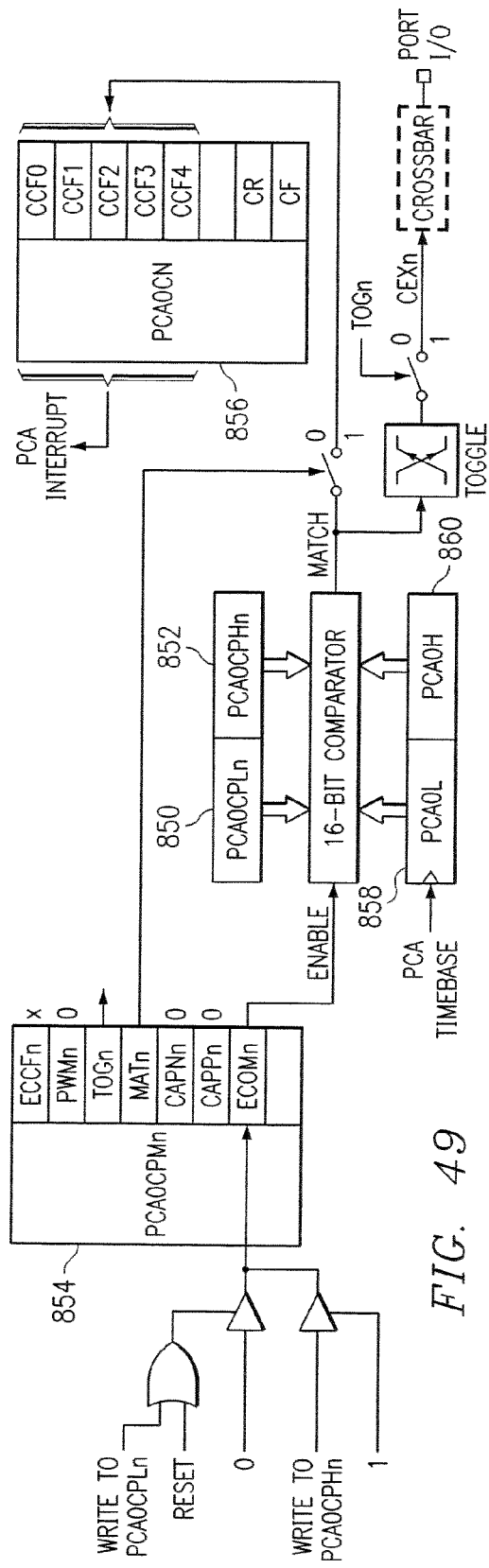

In this mode, illustrated in FIG. 49, each time a match occurs between the PCA Timer Counter and a module's 16-bit capture/compare register (PCA0CPHn 850 and PCA0CPLn 852) the logic level on the module's associated CEXn pin will toggle. Setting the TOGn, MATn, and ECOMn bits in the PCA0CPMn register enables the High-Speed Output mode.

Pulse Width Modulator Mode

Figure 50:
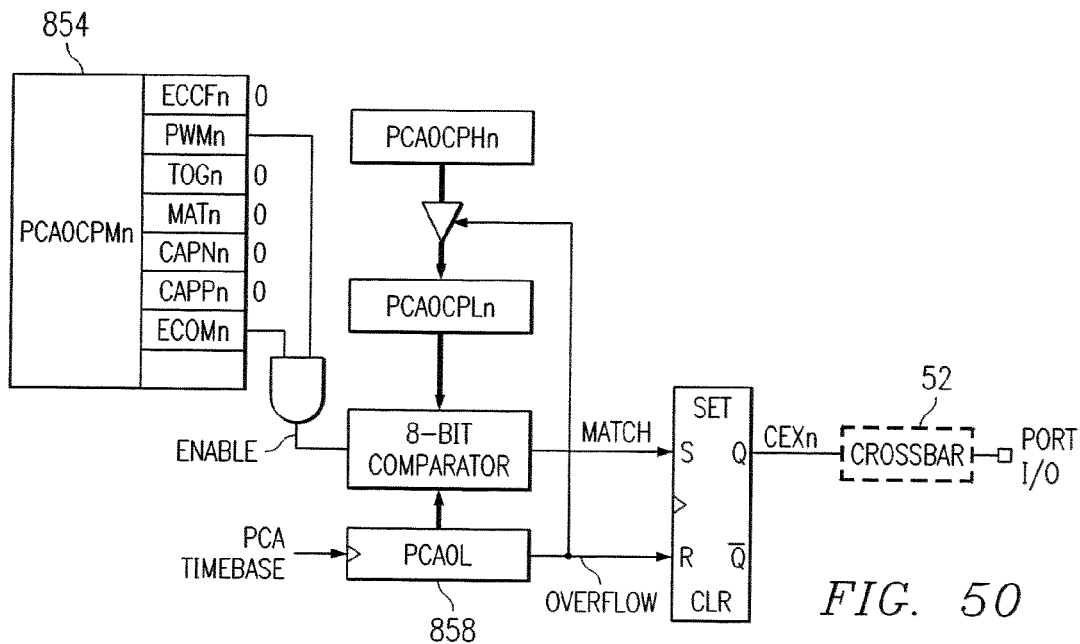

All of the modules can be used independently to generate pulse width modulated (PWM) outputs on their respective CEXn pin. The PWM mode is illustrated in FIG. 50. The frequency of the output is dependent on the timebase for the PCA counter/timer. The duty cycle of the PWM output signal is varied using the module's PCA0CPLn capture/compare register. When the value in the low byte of the PCA counter/timer (PCA0L 858) is equal to the value in PCA0CPLn, the output on the CEXn pin will be set. When the count value in PCA0L overflows, the CEXn output will be reset. Also, when the counter/timer low byte (PCA0L) 858 overflows from 0xFF to 0x00, PCA0CPLn is reloaded automatically with the value stored in the counter/timer's high byte (PCA0H) 860 without software intervention. Setting the ECOMn and PWMn bits in the PCA0CPMn register enables Pulse Width Modulator mode.

PCA Counter/Timer

Figure 51:
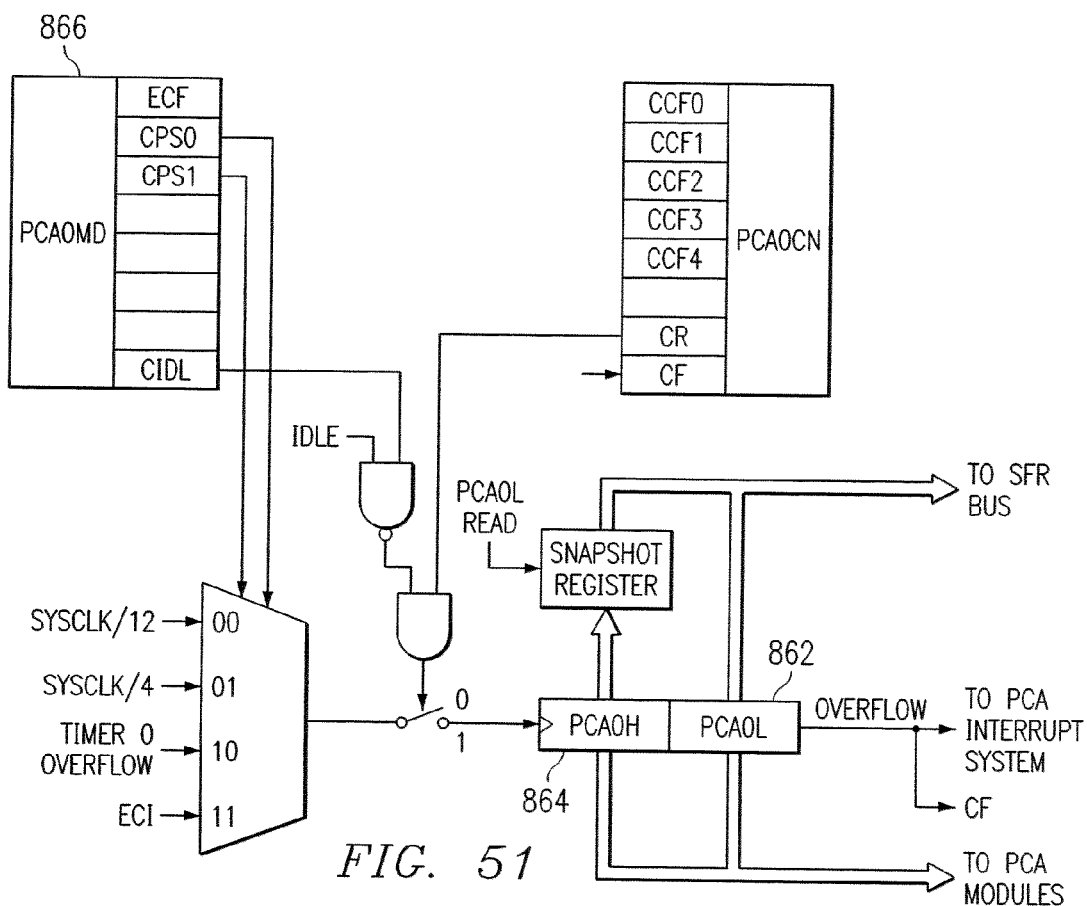

The 16-bit PCA counter/timer, illustrated in FIG. 51 consists of two 8-bit SFRs: PCA0L 862 and PCA0H 864. PCA0H is the high byte (MSB) of the 16-bit counter/timer and PCA0L is the low byte (LSB). Reading PCA0L automatically latches the value of PCA0H at the same time. By reading the PCA0L Register first, this allows the PCA0H value to be held (at the time PCA0L was read) until the user reads the PCA0H Register. Reading PCA0H or PCA0L does not disturb the counter operation. The CPS1 and CPS0 bits in the PCA0MD register 866 select the timebase for the counter/timer.

When the counter/timer overflows from 0xFFFF to 0x0000, the Counter Overflow Flag (CF) in PCA0MD 866 is set to logic 1 and an interrupt request is generated if CF interrupts are enabled. Setting the ECF bit in PCA0MD to logic 1 enables the CF flag to generate an interrupt request. The CF bit is not automatically cleared by hardware when the CPU vectors to the interrupt service routine, and must be cleared by software. (Note: PCA0 interrupts must be globally enabled before CF interrupts are recognized. PCA0 interrupts are globally enabled by setting the EA bit (IE.7) and the EPCA0 bit in EIE1 to logic 1.) Clearing the CIDL bit in the PCA0MD register allows the PCA to continue normal operation while the microcontroller core is in Idle mode. The control register (PCA)CN) settings are set forth in Table 80 with the PCA0MD mode register settings illustrated in Table 81.

| CPS1 | CPS0 | Timebase |
|------|------|----------|
| 0 | 0 | System clock divided by 12 |
| 0 | 1 | System clock divided by 4 |
| 1 | 0 | Timer 0 overflow |
| 1 | 1 | High-to-low transitions on ECI (max rate = system clock divided by 4) |

JTAG (IEEE 1149.1)

Description

The MCU has an on-chip JTAG interface and logic to support boundary scan for production and in-system testing, Flash read/write operations, and non-intrusive in-circuit emulation. The JTAG interface is fully compliant with the IEEE 1149.1 specification. Access of the JTAG Instruction Register (IR) and Data Registers (DR) are as described in the Test Access Port and Operation of the IEEE 1149.1 specification.

The JTAG interface is via four dedicated pins 44 on the MCU, which are TCK, TMS, TDI, and TDO.

The PCA0CPMn PCA Capture/Compare registers are illustrated in Table 82, with the PCA counter operation illustrated in Tables 83-86.

Through the 16-bit JTAG Instruction Register (IR), any of the eight instructions shown in Table 87 can be commanded. There are three DR's associated with JTAG Boundary-Scan, and four associated with Flash read/write operations on the MCU.

Boundary Scan

The DR in the Boundary Scan path is an 87-bit shift register. The Boundary DR provides control and observability of all the device pins as well as the SFR bus and Weak Pullup feature via the EXTEST and SAMPLE commands.

TABLE 88

Boundary Data Register Bit Definitions
EXTEST provides access to both capture and update actions, while Sample only performs a capture.

| Bit | Action | Target |
|---|---|---|
| 0 | Capture | Reset Enable from MCU |
|   | Update  | Reset Enable to /RST pin |
| 1 | Capture | Reset input from /RST pin |
|   | Update  | Reset output to /RST pin |
| 2 | Capture | External Clock from XTAL1 pin |
|   | Update  | Not used |
| 3 | Capture | Weak pullup enable to Port pins |
|   | Update  | Weak pullup enable from MCU |
| 4-11 | Capture | SFR Address Bus bit from Microcontroller 40 (e.g. Bit4 = SFRA0, Bit5 = SFRA1 ... ) |
|   | Update  | SFR Address Bus bit to SFR Address Bus (e.g. Bit4 = XSFRA0, Bit5 = XSFRA1) |
| 12-19 | Capture | SFR Data Bus bit read from SFR (e.g. Bit12 = SFRD0, Bit13 = SFRD1 ... ) |
|   | Update  | SFR Data Bus bit written to SFR (e.g. Bit12 = SFRD0, Bit13 = SFRD1 ... ) |
| 20 | Capture | SFR Write Strobe from Microcontroller 40 |
|   | Update  | SFR Write Strobe to SFR Bus |
| 21 | Capture | SFR Read Strobe from Microcontroller 40 |
|   | Update  | SFR Read Strobe to SFR Bus |
| 22 | Capture | SFR Read/Modify/Write Strobe from Microcontroller 40 |
|   | Update  | SFR Read/Modify/Write Strobe to SFR Bus |
| 23, 25, 27, 29, 31, 33, 35, 37 | Capture | P0.n output enable from MCU (e.g. Bit23 = P0.0, Bit25 = P0.1, etc.) |
|   | Update  | P0.n output enable to pin (e.g. Bit23 = P0.0oe, Bit25 = P0.1oe, etc.) |
| 24, 26, 28, 30, 32, 34, 36, 38 | Capture | P0.n input from pin (e.g. Bit24 = P0.0, Bit26 = P0.1, etc.) |
|   | Update  | P0.n output to pin (e.g. Bit24 = P0.0, Bit26 = P0.1, etc.) |
| 39, 41, 43, 45, 47, 49, 51, 53 | Capture | P1.n output enable from MCU (e.g. Bit39 = P1.0, Bit41 = P1.1, etc.) |
|   | Update  | P1.n output enable to pin (e.g. Bit39 = P1.0oe, Bit41 = P1.1oe, etc.) |
| 40, 42, 44, 46, 48, 50, 52, 54 | Capture | P1.n input from pin (e.g. Bit40 = P1.0, Bit42 = P1.1, etc.) |
|   | Update  | P1.n output to pin (e.g. Bit40 = P1.0, Bit42 = P1.1, etc.) |
| 55, 57, 59, 61, 63, 65, 67, 69 | Capture | P2.n output enable from MCU (e.g. Bit55 = P2.0, Bit57 = P2.1, etc.) |
|   | Update  | P2.n output enable to pin (e.g. Bit55 = P2.0oe, Bit57 = P2.1oe, etc.) |
| 56, 58, 60, 62, 64, 66, 68, 70 | Capture | P2.n input from pin (e.g. Bit56 = P2.0, Bit58 = P2.1, etc.) |
|   | Update  | P2.n output to pin (e.g. Bit56 = P2.0, Bit58 = P2.1, etc.) |
| 71, 73, 75, 77, 79, 81, 83, 85 | Capture | P3.n output enable from MCU (e.g. Bit71 = P3.0, Bit73 = P3.1, etc.) |
|   | Update  | P3.n output enable to pin (e.g. Bit71 = P3.0oe, Bit73 = P3.1oe, etc.) |
| 72, 74, 76, 78, 80, 82, 84, 86 | Capture | P3.n input from pin (e.g. Bit72 = P3.0, Bit74 = P3.1, etc.) |
|   | Update  | P3.n output to pin (e.g. Bit72 = P3.0, Bit74 = P3.1, etc.) |

EXTEST Instruction

The EXTEST instruction is accessed via the IR. The Boundary DR provides control and observability of all the device pins as well as the SFR bus and Weak Pullup feature. All on-chip latches are set to one.

SAMPLE Instruction

The SAMPLE instruction is accessed via the IR. The Boundary DR provides observability and presetting of the scan-path latches.

BYPASS Instruction

The BYPASS instruction is accessed via the IR. It provides access to the standard JTAG Bypass data register.

IDCODE Instruction

The IDCODE instruction is accessed via the IR. It provides access to the 32-bit Device ID register. The Flash memory can be programmed directly over the JTAG interface using the Flash Control, Flash Data, Flash Address, and Flash Scale registers. These Data Registers are accessed via the JTAG Instruction Register.

Emulation Support

The MCU has on-chip JTAG and emulation logic that provide non-intrusive, full speed, in-circuit emulation using the production part installed in the end application using the four pin JTAG I/F. The emulation system supports inspection and modification of memory and registers, breakpoints, and single stepping. No additional target RAM, program memory, or communications channels are required. All the digital and analog peripherals are functional and work correctly (remain in sync) while emulating. The WDT is disabled when the MCU is halted during single stepping or at a breakpoint.

Although the preferred embodiment has been described in detail, it should be understood that various changes, substitutions and alterations can be made therein without departing from the spirit and scope of the invention as defined by the appended claims.

TABLE APPENDIX

TABLE 2

| AMX0CF: AMUX Configuration Register | | | | | | | | |
|---|---|---|---|---|---|---|---|---|
| R/W | R/W | R/W | R/W | R/W | R/W | R/W | R/W | Reset Value |
| — | — | — | — | AIN67IC | AIN45IC | AIN23IC | AIN01IC | 00000000 |
| Bit7 | Bit6 | Bit5 | Bit4 | Bit3 | Bit2 | Bit1 | Bit0 | SFR Address: 0xBA |

Bits7-4: UNUSED. Read = 0000b; Write = don't care
Bit3: AIN67IC: AIN6, AIN7 Input Pair Configuration Bit
  0: AIN6 and AIN7 are independent singled-ended inputs
  1: AIN6, AIN7 are (respectively) +, − differential input pair
Bit2: AIN45IC: AIN4, AIN5 Input Pair Configuration Bit
  0: AIN4 and AIN5 are independent singled-ended inputs
  1: AIN4, AIN5 are (respectively) +, − differential input pair
Bit1: AIN23IC: AIN2, AIN3 Input Pair Configuration Bit
  0: AIN2 and AIN3 are independent singled-ended inputs
  1: AIN2, AIN3 are (respectively) +, − differential input pair
Bit0: AIN01IC: AIN0, AIN1 Input Pair Configuration Bit
  0: AIN0 and AIN1 are independent singled-ended inputs
  1: AIN0, AIN1 are (respectively) +, − differential input pair NOTE:
The ADC Data Word is in 2's complement format for channels configured as differential.

TABLE 3

| AMX0SL: AMUX Channel Select Register | | | | | | | | |
|---|---|---|---|---|---|---|---|---|
| R/W | R/W | R/W | R/W | R/W | R/W | R/W | R/W | Reset Value |
| — | — | — | — | AMXAD3 | AMXAD2 | AMXAD1 | AMXAD0 | 00000000 |
| Bit7 | Bit6 | Bit5 | Bit4 | Bit3 | Bit2 | Bit1 | Bit0 | SFR Address: 0xBB |

Bits7-4: UNUSED. Read = 0000 b; Write = don't care
Bits3-0: AMXAD3-0: AMUX Address Bits
  0000-1111: ADC Inputs selected per chart below

| AMX0CF BITS 3-0 | AMXAD3-0 0000 | 0001 | 0010 | 0011 | 0100 | 0101 | 0110 | 0111 | 1xxx |
|---|---|---|---|---|---|---|---|---|---|
| 0000 | AIN0 | AIN1 | AIN2 | AIN3 | AIN4 | AIN5 | AIN6 | AIN7 | TEMP SENSOR |
| 0001 | +(AIN0) −(AIN1) | | AIN2 | AIN3 | AIN4 | AIN5 | AIN6 | AIN7 | TEMP SENSOR |
| 0010 | AIN0 | AIN1 | +(AIN2) −(AIN3) | | AIN4 | AIN5 | AIN6 | AIN7 | TEMP SENSOR |
| 0011 | +AIN0 −(AIN1) | | +(AIN2) −(AIN3) | | AIN4 | AIN5 | AIN6 | AIN7 | TEMP SENSOR |
| 0100 | AIN0 | AIN1 | AIN2 | AIN3 | +(AIN4) −(AIN5) | | AIN6 | AIN7 | TEMP SENSOR |
| 0101 | +(AIN0) −(AIN1) | | AIN2 | AIN3 | +(AIN4) −(AIN5) | | AIN6 | AIN7 | TEMP SENSOR |
| 0110 | AIN0 | AIN1 | +(AIN2) −(AIN3) | | +(AIN4) −(AIN5) | | AIN6 | AIN7 | TEMP SENSOR |
| 0111 | +(AIN0) −(AIN1) | | +(AIN2) −(AIN3) | | +(AIN4) −(AIN5) | | AIN6 | AIN7 | TEMP SENSOR |
| 1000 | AIN0 | AIN1 | AIN2 | AIN3 | AIN4 | AIN5 | +(AIN6) −(AIN7) | | TEMP SENSOR |
| 1001 | +(AIN0) −(AIN1) | | AIN2 | AIN3 | AIN4 | AIN5 | +(AIN6) −(AIN7) | | TEMP SENSOR |
| 1010 | AIN0 | AIN1 | +(AIN2) −(AIN3) | | AIN4 | AIN5 | +(AIN6) −(AIN7) | | TEMP SENSOR |
| 1011 | +(AIN0) −(AIN1) | | +(AIN2) −(AIN3) | | AIN4 | AIN5 | +(AIN6) −(AIN7) | | TEMP SENSOR |
| 1100 | AIN0 | AIN1 | AIN2 | AIN3 | +(AIN4) −(AIN5) | | +(AIN6) −(AIN7) | | TEMP SENSOR |
| 1101 | +(AIN0) −(AIN1) | | AIN2 | AIN3 | +(AIN4) −(AIN5) | | +(AIN6) −(AIN7) | | TEMP SENSOR |
| 1110 | AIN0 | AIN1 | +(AIN2) −(AIN3) | | +(AIN4) −(AIN5) | | +(AIN6) −(AIN7) | | TEMP SENSOR |
| 1111 | +(AIN0) −(AIN1) | | +(AIN2) −(AIN3) | | +(AIN4) −(AIN5) | | +(AIN6) −(AIN7) | | TEMP SENSOR |

TABLE 4

ADC0CF: ADC Configuration Register

| R/W | R/W | R/W | R/W | R/W | R/W | R/W | R/W | Reset Value |
|---|---|---|---|---|---|---|---|---|
| ADCSC2 | ADCSC1 | ADCSC0 | — | — | AMPGN2 | AMPGN1 | AMPGN0 | 01100000 |
| Bit7 | Bit6 | Bit5 | Bit4 | Bit3 | Bit2 | Bit1 | Bit0 | SFR Address: 0xBC |

Bits7-5: ADCSC2-0: ADC SAR Conversion Clock Period Bits
    000: SAR Conversion Clock = 1 System Clock
    001: SAR Conversion Clock = 2 System Clocks
    010: SAR Conversion Clock = 4 System Clocks
    011: SAR Conversion Clock = 8 System Clocks
    1xx: SAR Conversion Clock = 16 Systems Clocks
Bits4-3: UNUSED. Read = 00b; Write = don't care
Bits2-0: AMPGN2-0: ADC Internal Amplifier Gain
    000: Gain = 1
    001: Gain = 2
    010: Gain = 4
    011: Gain = 8
    10x: Gain = 16
    11x: Gain = 0.5

TABLE 5

ADC0CN: ADC Control Register

| R/W | R/W | R/W | R/W | R/W | R/W | R/W | R/W | Reset Value |
|---|---|---|---|---|---|---|---|---|
| ADCEN | ADCTM | ADCINT | ADBUSY | ADSTM1 | ADSTM0 | ADWINT | ADLJST | 00000000 |
| Bit7 | Bit6 | Bit5 | Bit4 | Bit3 | Bit2 | Bit1 | Bit0 (bit addressable) | SFR Address: 0xE8 |

Bit7:    ADCEN: ADC Enable Bit
    0: ADC Disabled. ADC is in low power shutdown.
    1: ADC Enabled. ADC is active and ready for data conversions.
Bit6:    ADCTM: ADC Track Mode Bit
    0: When the ADC is enabled, tracking is always done unless a conversion is in process
    1: Tracking Defined by ADSTM1-0 bits
    ADSTM1-0:
    00: Tracking starts with the write of 1 to ADBUSY and lasts for 3 SAR clocks
    01: Tracking started by the overflow of Timer 3 and last for 3 SAR clocks
    10: ADC tracks only when CNVSTR input is logic low
    11: Tracking started by the overflow of Timer 2 and last for 3 SAR clocks
Bit5:    ADCINT: ADC Conversion Complete Interrupt Flag
    0: ADC has not completed a data conversion since the last time this flag was cleared
    1: ADC has completed a data conversion
Bit4:    ADBUSY: ADC Busy Bit
    Read
    0: ADC Conversion complete or no valid data has been converted since a reset. The falling edge of ADBUSY generates an interrupt when enabled.
    1: ADC Busy converting data
    Write
    0: No effect
    1: Starts ADC Conversion if ADSTM1-0 = 00b
Bits3-2: ADSTM1-0: ADC Start of Conversion Mode Bits
    00: ADC conversion started upon every write of 1 to ADBUSY
    01: ADC conversions taken on every overflow of Timer 3
    10: ADC conversion started upon every rising edge of CNVSTR
    11: ADC conversions taken on every overflow of Timer 2
Bit1:    ADWINT: ADC Window Compare Interrupt Flag
    0: ADC Window Comparison Data match has not occurred
    1: ADC Window Comparison Data match occurred
Bit0:    ADLJST: ADC Left Justify Data Bit
    0: Data in ADC0H:ADC0L Registers is right justified
    1: Data in ADC0H:ADC0L Registers is left justified

TABLE 6

ADC0H: ADC Data Word MSB Register

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xBF |

Bits7-0: ADC Data Word Bits
    For ADLJST = 1: Upper 8-bits of the 12-bit ADC Data Word.
    For ADLJST = 0: Bits7-4 are the sign extension of Bit3.
    Bits 3-0 are the upper 4-bits of the 12-bit ADC Data Word.

TABLE 7

ADC0L: ADC Data Word LSB Register

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xBE |

Bits7-0: ADC Data Word Bits
    For ADLJST = 1: Bits7-4 are the lower 4-bits of the 12-bit ADC Data Word. Bits3-0 will always read 0.
    For ADLJST = 0: Bits7-0 are the lower 8-bits of the 12-bit ADC Data Word.
NOTE: Resulting 12-bit ADC Data Word appears in the ADC Data Word Registers as follows:
    ADC0H[3:0]:ADC0L[7:0], if ADLJST = 0
    (ADC0H[7:4] will be sign extension of ADC0H.3 if a differential reading, otherwise = 0000b)
    ADC0H[7:0]:ADC0L[7:4], if ADLJST = 1
    (ADC0L[3:0] = 0000b)
    EXAMPLE: ADC Data Word Conversion Map, AIN0 Input in Single-Ended Mode
    (AMX0CF = 0x00, AMX0SL = 0x00)

| AIN0 – AGND (Volts) | ADC0H:ADC0L (ADLJST = 0) | ADC0H:ADC0L (ADLJST = 1) |
|---|---|---|
| REF × (4095/4096) | 0x0FFF | 0xFFF0 |
| REF × ½ | 0x0800 | 0x8000 |
| REF × (2047/4096) | 0x07FF | 0x7FF0 |
| 0 | 0x0000 | 0x0000 |

EXAMPLE: ADC Data Word Conversion Map, AIN0 – AIN1 Differential Input Pair
(AMX0CF = 0x01, AMX0SL = 0x00)

| AIN0 – AIN1 (Volts) | ADC0H:ADC0L (ADLJST = 0) | ADC0H:ADC0L (ADLJST = 1) |
|---|---|---|
| REF × (4095/4096) | 0x07FF | 0x7FF0 |
| 0 | 0x0000 | 0x0000 |
| −REF × (1/4096) | 0xFFFF | 0xFFF0 |
| −REF | 0xF800 | 0x8000 |

TABLE 8

DAC0H: DAC0 High Byte Register

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xD3 |

Bits7-0: DAC0 Data Word Most Significant Byte.

TABLE 9

DAC0L: DAC0 Low Byte Register

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xD2 |

Bits7-0: DAC0 Data Word Least Significant Byte.

TABLE 10

DAC0CN: DAC0 Control Register

| R/W | R/W | R/W | R/W | R/W | R/W | R/W | R/W | Reset Value |
|---|---|---|---|---|---|---|---|---|
| DAC0EN | - | - | - | - | DAC0DF2 | DAC0DF1 | DAC0DF0 | 00000000 |
| Bit7 | Bit6 | Bit5 | Bit4 | Bit3 | Bit2 | Bit1 | Bit0 | SFR Address: 0xD4 |

Bit7: DAC0EN: DAC0 Enable Bit
  0: DAC0 Disabled. DAC0 Output pin is tri-state: DAC0 is in low power shutdown mode.
  1: DAC0 Enabled. DAC0 Output is pin active; DAC0 is operational.
Bits6-3: UNUSED, Read = 0000b; Write = don't care
Bits2-0: DAC0DF2-0: DAC0 Data Format Bits
  000: The most significant nybble of the DAC0 Data Word is in DAC0H[3:0], while the least significant byte is in DAC0L.

001: The most significant 5-bits of the DAC0 Data Word is in DAC0H[4:0], while the least significant 7-bits is in DAC0L[7:1].

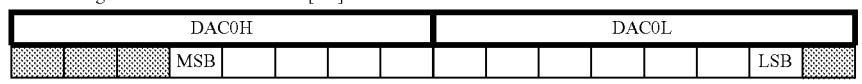

010: The most significant 6-bits of the DAC0 Data Word is in DAC0H[5:0], while the least significant 6-bits is in DAC0L[7:2].

011: The most significant 7-bits of the DAC0 Data Word is in DAC0H[6:0], while the least significant 5-bits is in DAC0L[7:3].

1xx: The most significant byte of the DAC0 Data Word is in DAC0H, while the least significant nybble is in DAC0L[7:4].

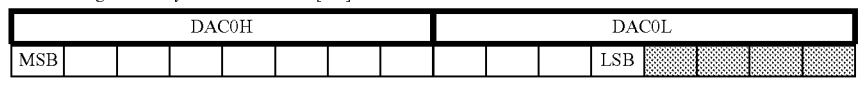

TABLE 11

CPT0CN: Comparator 0 Control Register

| R/W | R | R/W | R/W | R/W | R/W | R/W | R/W | Reset Value |
|---|---|---|---|---|---|---|---|---|
| CP0EN | CP0OUT | CP0RIF | CP0FIF | CP0HYP1 | CP0HYP0 | CP0HYN1 | CP0HYN0 | 00000000 |
| Bit7 | Bit6 | Bit5 | Bit4 | Bit3 | Bit2 | Bit1 | Bit0 | SFR Address: 0x9E |

Bit7: CP0EN: Comparator 0 Enable Bit
  0: Comparator 0 Disabled.
  1: Comparator 0 Enabled.
Bit6: CP0OUT: Comparator 0 Output State Flag
  0: Voltage on CP0+ < CP0−
  1: Voltage on CP0+ > CP0−
Bit5: CP0RIF: Comparator 0 Rising-Edge Interrupt Flag
  0: No Comparator 0 Rising-Edge Interrupt has occurred since this flag was cleared
  1: Comparator 0 Rising-Edge Interrupt has occurred since this flag was cleared
Bit4: CP0FIF: Comparator 0 Falling-Edge Interrupt Flag
  0: No Comparator 0 Falling-Edge Interrupt has occurred since this flag was cleared
  1: Comparator 0 Falling-Edge Interrupt has occurred since this flag was cleared
Bit3-2: CP0HYP1-0: Comparator 0 Positive Hysteresis Control Bits
  00: Positive Hysteresis Disabled
  01: Positive Hysteresis = 5 mV
  10: Positive Hysteresis = 10 mV
  11: Positive Hysteresis = 20 mV
Bit1-0: CP0HYN1-0: Comparator 0 Negative Hysteresis Control Bits
  00: Negative Hysteresis Disabled
  01: Negative Hysteresis = 5 mV
  10: Negative Hysteresis = 10 mV
  11: Negative Hysteresis = 20 mV

TABLE 12

CPT1CN: Comparator 1 Control Register

| R/W | R | R/W | R/W | R/W | R/W | R/W | R/W | Reset Value |
|-----|---|-----|-----|-----|-----|-----|-----|-------------|
| CP1EN | CP1OUT | CP1RIF | CP1FIF | CP1HYP1 | CP1HYP0 | CP1HYN1 | CP1HYN0 | 00000000 |
| Bit7 | Bit6 | Bit5 | Bit4 | Bit3 | Bit2 | Bit1 | Bit0 | SFR Address: 0x9F |

Bit7:     CP1EN: Comparator 1 Enable Bit
       0: Comparator 1 Disabled.
       1: Comparator 1 Enabled.
Bit6:     CP1OUT: Comparator 1 Output State Flag
       0: Voltage on CP1+ < CP1−
       1: Voltage on CP1+ > CP1−
Bit5:     CP1RIF: Comparator 1 Rising-Edge Interrupt Flag
       0: No Comparator 1 Rising-Edge Interrupt has occurred since this flag was cleared
       1: Comparator 1 Rising-Edge Interrupt has occurred since this flag was cleared
Bit4:     CP1FIF: Comparator 1 Falling-Edge Interrupt Flag
       0: No Comparator 1 Falling-Edge Interrupt has occurred since this flag was cleared
       1: Comparator 1 Falling-Edge Interrupt has occurred since this flag was cleared
Bit3-2:   CP1HYP1-0: Comparator 1 Positive Hysteresis Control Bits
       00: Positive Hysteresis Disabled
       01: Positive Hysteresis = 5 mV
       10: Positive Hysteresis = 10 mV
       11: Positive Hysteresis = 20 mV
Bit1-0:   CP1HYN1-0: Comparator 1 Negative Hysteresis Control Bits
       00: Negative Hysteresis Disabled
       01: Negative Hysteresis = 5 mV
       10: Negative Hysteresis = 10 mV
       11: Negative Hysteresis = 20 mV

TABLE 13

REF0CN: Reference Control Register

| R/W | R/W | R/W | R/W | R/W | R/W | R/W | R/W | Reset Value |
|-----|-----|-----|-----|-----|-----|-----|-----|-------------|
| — | — | — | — | — | TEMPE | BIASE | REFBE | 00000000 |
| Bit7 | Bit6 | Bit5 | Bit4 | Bit3 | Bit2 | Bit1 | Bit0 | SFR Address: 0xD1 |

Bits7-3:  UNUSED. Read = 00000b; Write = don't care
Bit2:     TEMPE: Temperature Sensor Enable Bit
       0: Internal Temperature Sensor Off.
       1: Internal Temperature Sensor On.
Bit1:     BIASE: Internal Band-Gap Bias Enable Bit
       0: Internal Band-Gap Off.
       1: Internal Band-Gap On.
Bit0:     REFBE: Internal Reference Buffer Enable Bit
       0: Internal Reference Buffer Off. System reference can be driven from external source on VREF pin.
       1: Internal Reference Buffer On. System reference from internal band-gap.

TABLE 15

PSW: Program Status Word

| R/W | R/W | R/W | R/W | R/W | R/W | R/W | R/W | Reset Value |
|-----|-----|-----|-----|-----|-----|-----|-----|-------------|
| CY | AC | F0 | RS1 | RS0 | OV | F1 | PARITY | 00000000 |
| Bit7 | Bit6 | Bit5 | Bit4 | Bit3 | Bit2 | Bit1 | Bit0 (bit addressable) | SFR Address: 0xD0 |

Bit7:     CY: Carry Flag.
       This bit is set when the last arithmetic operation results in a carry (addition) or a borrow (subtraction). It is cleared to 0 by all other arithmetic operations.
Bit6:     AC: Auxiliary Carry Flag.
       This bit is set when the last arithmetic operation results in a carry into (addition) or a borrow from (subtraction) the high order nibble. It is cleared to 0 by all other arithmetic operations.
Bit5:     F0: User Flag 0.
       This is a bit-addressable, general purpose flag for use under software control.
Bits4-3:  RS1-RS0: Register Bank Select.
       These bits select which register bank is used during register accesses.

| RS1 | RS0 | Register Bank | Address |
|-----|-----|---------------|---------|
| 0 | 0 | 0 | 0x00-0x07 |
| 0 | 1 | 1 | 0x08-0x0F |
| 1 | 0 | 2 | 0x10-0x17 |
| 1 | 1 | 3 | 0x18-0x1F |

TABLE 15-continued

Bit2: OV: Overflow Flag.
This bit is set to 1 if the last arithmetic operation resulted in a carry (addition), borrow (subtraction), or overflow (multiply or divide). It is cleared to 0 by all other arithmetic operations.
Bit1: F1: User Flag 1.
This is a bit-addressable, general purpose flag for use under software control.
Bit0: PARITY: Parity Flag.
This bit is set to 1 if the sum of the eight bits in the accumulator is odd and cleared if the sum is even.

TABLE 16

SP: Stack Pointer

| R/W | R/W | R/W | R/W | R/W | R/W | R/W | R/W | Reset Value 00000111 |
|---|---|---|---|---|---|---|---|---|
| Bit7 | Bit6 | Bit5 | Bit4 | Bit3 | Bit2 | Bit1 | Bit0 | SFR Address: 0x81 |

Bits 7-0: SP: Stack Pointer.
The stack pointer holds the location of the top of the stack. The stack pointer is incremented before every PUSH operation. The SP register defaults to 0x07 after reset.

TABLE 17

DPL: Data Pointer Low Byte

| R/W | R/W | R/W | R/W | R/W | R/W | R/W | R/W | Reset Value 00000000 |
|---|---|---|---|---|---|---|---|---|

TABLE 17-continued

| Bit7 | Bit6 | Bit5 | Bit4 | Bit3 | Bit2 | Bit1 | Bit0 | SFR Address: 0x82 |
|---|---|---|---|---|---|---|---|---|

Bits 7-0: DPL: Data Pointer Low.
The DPL register is the low byte of the 16-bit DPTR. DPTR is used to access indirectly addressed RAM.

TABLE 18

DPH: Data Pointer High Byte

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0x83 |

Bits 7-0: DPH: Data Pointer High.
The DPH register is the high byte of the 16-bit DPTR. DPTR is used to access indirectly addressed RAM.

TABLE 19

ACC: Accumulator

| R/W | R/W | R/W | R/W | R/W | R/W | R/W | R/W | Reset Value |
|---|---|---|---|---|---|---|---|---|
| ACC.7 | ACC.6 | ACC.5 | ACC.4 | ACC.3 | ACC.2 | ACC.1 | ACC.0 | 00000000 |
| Bit7 | Bit6 | Bit5 | Bit4 | Bit3 | Bit2 | Bit1 | Bit0 (bit addressable) | SFR Address: 0xE0 |

Bits 7-0: ACC: Accumulator
This register is the accumulator for arithmetic operations.

TABLE 20

B: B Register

| R/W | R/W | R/W | R/W | R/W | R/W | R/W | R/W | Reset Value |
|---|---|---|---|---|---|---|---|---|
| B.7 | B.6 | B.5 | B.4 | B.3 | B.2 | B.1 | B.0 | 00000000 |
| Bit7 | Bit6 | Bit5 | Bit4 | Bit3 | Bit2 | Bit1 | Bit0 (bit addressable) | SFR Address: 0xF0 |

Bits 7-0: B: B Register
This register serves as a second accumulator for certain arithmetic operations.

TABLE 22

IE: Interrupt Enable

| R/W | R/W | R/W | R/W | R/W | R/W | R/W | R/W | Reset Value |
|---|---|---|---|---|---|---|---|---|
| EA | — | ET2 | ES | ET1 | EX1 | ET0 | EX0 | 00000000 |
| Bit7 | Bit6 | Bit5 | Bit4 | Bit3 | Bit2 | Bit1 | Bit0 (bit addressable) | SFR Address: 0xA8 |

Bit7: EA: Enable All Interrupts.
This bit globally enables/disables all interrupts. It overrides the individual interrupt mask settings.
0: Disable all interrupt sources.
1: Enable each interrupt according to its individual mask setting.

TABLE 22-continued

Bit6: UNUSED. Read = 0, Write = don't care.
Bit5: ET2: Enable Time 2 Interrupt.
   This bit sets the masking of the Timer 2 interrupt.
   0: Disable all Timer 2 interrupts.
   1: Enable interrupt requests generated by the TF2 flag (T2CON.7)
Bit4: ES: Enable Serial Port (UART) Interrupt.
   This bit sets the masking of the Serial Port (UART) interrupt.
   0: Disable all UART interrupts.
   1: Enable interrupt requests generated by the R1 flag (SCON.0) or T1 flag (SCON.1).
Bit3: ET1: Enable Timer 1 Interrupt.
   This bit sets the masking of the Timer 1 interrupt.
   0: Disable all Timer 1 interrupts.
   1: Enable interrupt requests generated by the TF1 flag (TCON.7).
Bit2: EX1: Enable External Interrupt 1.
   This bit sets the masking of external interrupt 1.
   0: Disable external interrupt 1.
   1: Enable interrupt requests generated by the /INT1 pin.
Bit1: ET0: Enable Timer 0 Interrupt.
   This bit sets the masking of the Timer 0 interrupt.
   0: Disable all Timer 0 interrupts.
   1: Enable interrupt requests generated by the TF0 flag (TCON.5).
Bit0: EX0: Enable External Interrupt 0.
   This bit sets the masking of external interrupt 0.
   0: Disable external interrupt 0.
   1: Enable interrupt requests generated by the /INT0 pin.

TABLE 23

IP: Interrupt Priority

| R/W | R/W | R/W | R/W | R/W | R/W | R/W | R/W | Reset Value |
|---|---|---|---|---|---|---|---|---|
| — | — | PT2 | PS | PT1 | PX1 | PT0 | PX0 | 00000000 |
| Bit7 | Bit6 | Bit5 | Bit4 | Bit3 | Bit2 | Bit1 | Bit0 (bit addressable) | SFR Address: 0xB8 |

Bits7-6: UNUSED. Read = 00b, Write = don't care.
Bit5: PT2 Timer 2 Interrupt Priority Control.
   This bit sets the priority of the Timer 2 interrupts.
   0: Timer 2 interrupt priority determined by default priority order.
   1: Timer 2 interrupts set to high priority level.
Bit4: PS: Serial Port (UART) Interrupt Priority Control.
   This bit sets the priority of the Serial Port (UART) interrupts.
   0: UART interrupt priority determined by default priority order.
   1: UART interrupts set to high priority level.
Bit3: PT1: Timer 1 Interrupt Priority Control.
   This bit sets the priority of the Timer 1 interrupts.
   0: Timer 1 interrupt priority determined by default priority order.
   1: Timer 1 interrupts set to high priority level.
Bit2: PX1: External Interrupt 1 Priority Control.
   This bit sets the priority of the External Interrupt 1 interrupts.
   0: External Interrupt 1 priority determined by default priority order.
   1: External Interrupt 1 set to high priority level.
Bit1: PT0: Timer 0 Interrupt Priority Control.
   This bit sets the priority of the Timer 0 interrupts.
   0: Timer 0 interrupt priority determined by default priority order.
   1: Timer 0 interrupt set to high priority level.
Bit0: PX0: External Interrupt 0 Priority Control.
   This bit sets the priority of the External Interrupt 0 interrupts.
   0: External Interrupt 0 priority determined by default priority order.
   1: External Interrupt 0 set to high priority level.

TABLE 24

EIE1: Extended Interrupt Enable 1

| R/W | R/W | R/W | R/W | R/W | R/W | R/W | R/W | Reset Value |
|---|---|---|---|---|---|---|---|---|
| ECP1R | ECP1F | ECP0R | ECP0F | EPCA0 | EADC0 | ESMB0 | ESPI0 | 00000000 |
| Bit7 | Bit6 | Bit5 | Bit4 | Bit3 | Bit2 | Bit1 | Bit0 | SFR Address: 0xE6 |

Bit7: ECP1R: Enable Comparator 1 (CP1) Rising Edge Interrupt.
   This bit sets the masking of the CP1 interrupt.
   0: Disable CP1 Rising Edge interrupt.
   1: Enable interrupt requests generated by the CP1RIF flag (CPT1CN.3).

TABLE 24-continued

Bit6: ECP1F: Enable Comparator 1 (CP1) Falling Edge Interrupt.
This bit sets the masking of the CP1 interrupt.
0: Disable CP1 Falling Edge interrupt.
1: Enable interrupt requests generated by the CP1FIF flag (CPT1CN.4).
Bit5: ECP0R: Enable Comparator 0 (CP0) Rising Edge Interrupt.
This bit sets the masking of the CP0 interrupt.
0: Disable CP0 Rising Edge interrupt.
1: Enable interrupt requests generated by the CP0RIF flag (CPT0CN.3).
Bit4: ECP0F: Enable Comparator 0 (CP0) Falling Edge Interrupt.
This bit sets the masking of the CP0 interrupt.
0: Disable CP0 Falling Edge interrupt.
1: Enable interrupt requests generated by the CP0FIF flag (CPT0CN.4).
Bit3: EPCA0: Enable Programmable Counter Array (PCA0) Interrupt.
This bit sets the masking of the PCA0 interrupts.
0: Disable all PCA0 interrupts.
1: Enable interrupt requests generated by PCA0.
Bit2: EWADC0: Enable Window Comparison ADC0 Interrupt.
This bit sets the masking of ADC0 interrupts.
0: Disable ADC0 Window Comparison Interrupt.
1: Enable Interrupt requests generated by ADC0 Window Comparisons.
Bit1: ESMB0: Enable SMBus 0 Interrupt.
This bit sets the masking of the SMBus interrupt.
0: Disable all SMBus interrupts.
1: Enable interrupt requests generated by the SI flag (SMB0CN.3).
Bit0: ESPI0: Enable Serial Peripheral Interface 0 Interrupt.
This bit set the masking of SPI0 interrupt.
0: Disable all SPI0 interrupts.
1: Enable Interrupt requests generated by the SPIF flag (SPI0CN.7).

TABLE 25

EIE2: Extended Interrupt Enable 2

| R/W | R/W | R/W | R/W | R/W | R/W | R/W | R/W | Reset Value |
|---|---|---|---|---|---|---|---|---|
| EXVLD | EJ | EX7 | EX6 | EX5 | EX4 | EX3 | ET3 | 00000000 |
| Bit7 | Bit6 | Bit5 | Bit4 | Bit3 | Bit2 | Bit1 | Bit0 | SFR Address: 0xE7 |

Bit7: EXVLD: Enable External Clock Source Valid (XLVD) Interrupt.
This bit sets the masking of the XLVD interrupt.
0: Disable all XLVD interrupts.
1: Enable interrupt requests generated by the XLVD flag (OSCXCN.7)
Bit6: EJ: Enable JTAG Interrupts.
This bit sets the masking of the JTAG interrupt.
0: Disable all JTAG interrupts.
1: Enable interrupt requests generated by the JI flag (JTAG.X)
Bit5: EX7: Enable External Interrupt 7.
This bit sets the masking of External Interrupt 7.
0: Disable External Interrupt 7.
1: Enable interrupt requests generated by the External Interrupt 7 input pin.
Bit4: EX6: Enable External Interrupt 6.
This bit sets the masking of External Interrupt 6.
0: Disable External Interrupt 6.
1: Enable interrupt requests generated by the External Interrupt 6 input pin.
Bit3: EX5: Enable External Interrupt 5.
This bit sets the masking of External Interrupt 5.
0: Disable External Interrupt 5.
1: Enable interrupt requests generated by the External Interrupt 5 input pin.
Bit2: EX4: Enable External Interrupt 4.
This bit sets the masking of External Interrupt 4.
0: Disable External Interrupt 4.
1: Enable interrupt requests generated by the External Interrupt 4 input pin.
Bit1: EADC0: Enable ADC0 End of Conversion Interrupt.
This bit sets the masking of the ADC0 End of Conversion Interrupt.
0: Disable ADC0 Conversion Interrupt.
1: Enable interrupt requests generated by the ADC0 Conversion Interrupt.
Bit0: ET3: Enable Timer 3 Interrupt.
This bit sets the masking of the Timer 3 interrupt.
0: Disable all Timer 3 interrupts.
1: Enable interrupt requests generated by the TF3 flag (TMR3CN.7)

TABLE 26

EIP1: Extended Interrupt Priority 1

| R/W | R/W | R/W | R/W | R/W | R/W | R/W | R/W | Reset Value |
|---|---|---|---|---|---|---|---|---|
| PCP1R | PCP1F | PCP0R | PCP0F | PPCA0 | PADC0 | PSMB0 | PSPI0 | 00000000 |
| Bit7 | Bit6 | Bit5 | Bit4 | Bit3 | Bit2 | Bit1 | Bit0 | SFR Address: 0xF6 |

Bit7: PCP1R: Comparator 1 (CP1) Rising Interrupt Priority Control.
This bit sets the priority of the CP1 interrupt.
0: CP1 rising interrupt set to low priority level.
1: CP1 rising interrupt set to high priority level.
Bit6: PCP1F: Comparator 1 (CP1) Falling Interrupt Priority Control.
This bit sets the priority of the CP1 interrupt.
0: CP1 falling interrupt set to low priority level.
1: CP1 falling interrupt set to high priority level.

TABLE 26-continued

Bit5: PCP0R: Comparator 0 (CP0) Rising Interrupt Priority Control.
  This bit sets the priority of the CP0 interrupt.
    0: CP0 rising interrupt set to low priority level.
    1: CP0 rising interrupt set to high priority level.
Bit4: PCP0F: Comparator 0 (CP0) Falling Interrupt Priority Control.
  This bit sets the priority of the CP0 interrupt.
    0: CP0 falling interrupt set to low priority level.
    1: CP0 falling interrupt set to high priority level.
Bit3: PPCA0: Programmable Counter Array (PCA0) Interrupt Priority Control.
  This bit sets the priority of the PCA0 interrupt.
    0: PCA0 interrupt set to low priority level.
    1: PCA0 interrupt set to high priority level.
Bit2: PADC0: Analog-to-Digital Converter 0 (ADC0) Interrupt Priority Control.
  This bit sets the priority of the ADC0 interrupt.
    0: ADC0 interrupt set to low priority level.
    1: ADC0 interrupt set to high priority level.
Bit1: PSMB0: SMBus 0 Interrupt Priority Control.
  This bit sets the priority of the SMBus interrupt.
    0: SMBus interrupt set to low priority level.
    1: SMBus interrupt set to high priority level.
Bit0: PSPI0: Serial Peripheral Interface 0 Interrupt Priority Control.
  This bit sets the priority of the SPI0 interrupt.
    0: SPI0 interrupt set to low priority level.
    1: SPI0 interrupt set to high priority level.

TABLE 27

EIP2: Extended Interrupt Priority 2

| R/W | R/W | R/W | R/W | R/W | R/W | R/W | R/W | Reset Value |
|---|---|---|---|---|---|---|---|---|
| PXVLD | PEJ | PX7 | PX6 | PX5 | PX4 | PX3 | PT3 | 00000000 |
| Bit7 | Bit6 | Bit5 | Bit4 | Bit3 | Bit2 | Bit1 | Bit0 | SFR Address: 0xF7 |

Bit7: PXVLD: External Clock Source Valid (XVLD) Interrupt Priority Control.
  This bit sets the priority of the XVLD interrupt.
    0: XVLD interrupt set to low priority level.
    1: XVLD interrupt set to high priority level.
Bit6: PEJ: JTAG Interrupt Priority Control.
  This bit sets the priority of the JTAG interrupt.
    0: JTAG interrupt set to low priority level.
    1: JTAG interrupt set to high priority level.
Bit5: PX7: External Interrupt 7 Priority Control.
  This bit sets the priority of the External Interrupt 7.
    0: External Interrupt 7 set to low priority level.
    1: External Interrupt 7 set to high priority level.
Bit4: PX6: External Interrupt 6 Priority Control.
  This bit sets the priority of the External Interrupt 6.
    0: External Interrupt 6 set to low priority level.
    1: External Interrupt 6 set to high priority level.
Bit3: PX5: External Interrupt 5 Priority Control.
  This bit sets the priority of the External Interrupt 5.
    0: External Interrupt 5 set to low priority level.
    1: External Interrupt 5 set to high priority level.
Bit2: PX4: External Interrupt 4 Priority Control.
  This bit sets the priority of the External Interrupt 4.
    0: External Interrupt 4 set to low priority level.
    1: External Interrupt 4 set to high priority level.
Bit1: PX3: External Interrupt 3 Priority Control.
  This bit sets the priority of the External Interrupt 3.
    0: External Interrupt 3 set to low priority level.
    1: External Interrupt 3 set to high priority level.
Bit0: PT3: Timer 3 Interrupt Priority Control.
  This bit sets the priority of the Timer 3 interrupts.
    0: Timer 3 interrupt priority determined by default priority order.
    1: Timer 3 interrupt set to high priority level.

TABLE 28

PCON: Power Control Register

| R/W | R/W | R/W | R/W | R/W | R/W | R/W | R/W | Reset Value |
|---|---|---|---|---|---|---|---|---|
| SMOD | — | — | — | GF1 | GF0 | STOP | IDLE | 00000000 |
| Bit7 | Bit6 | Bit5 | Bit4 | Bit3 | Bit2 | Bit1 | Bit0 | SFR Address: 0x87 |

Bit7: SMOD: Serial Port Baud Rate Doubler Enable.
    0: Serial Port baud rate is that defined by Serial Port Mode in SCON.
    1: Serial Port baud rate is double that defined by Serial Port Mode in SCON.
Bits6-4: UNUSED. Read = 000b, Write = don't care.
Bit3: GF1: General Purpose Flag 1.
  This is a general purpose flag for use under software control.
Bit2: GF0: General Purpose Flag 0.
  This is a general purpose flag for use under software control.
Bit1: STOP: Stop Mode Select.
  Setting this bit will place the CIP-51 in Stop mode. This bit will always be read as 0.
    1: Goes into power down mode. (Turns off oscillator).
Bit0: IDLE: Idle Mode Select.
  Setting this bit will place the CIP-51 in Idle mode. This bit will always be read as 0.
    1: Goes into idle mode. (Shuts off clock to CPU, but clock to Timers, Interrupts, Serial Ports, and Analog Peripherals are still active.)

TABLE 29

PSCTL: Program Store RW Control

| R/W | R/W | R/W | R/W | R/W | R/W | R/W | R/W | Reset Value |
|---|---|---|---|---|---|---|---|---|
| — | — | — | — | — | — | PSEE | PSWE | 00000000 |
| Bit7 | Bit6 | Bit5 | Bit4 | Bit3 | Bit2 | Bit1 | Bit0 | SFR Address: 0x8F |

Bits7-2: UNUSED. Read = 000000b, Write = don't care.
Bit1: PSEE: Program Store Erase Enable.
  Setting this bit allows an entire page of the Flash program memory to be erased. After setting this bit, a write to Flash memory using the MOVX instruction will erase the entire page that contains the location addressed by the MOVX instruction. The value of the data byte written does not matter.
    0: Flash program memory erasure disabled.
    1: Flash program memory erasure enabled.
Bit0: PSWE: Program Store Write Enable.
  Setting this bit allows writing a byte of data to the Flash program memory using the MOVX instruction. The location must be

TABLE 29-continued erased before writing data.
0: Write to Flash program memory disabled.
1: Write to Flash program memory enabled.

TABLE 30

FLSCL: Flash Memory Timing Prescaler

| R/W | R/W | R/W | R/W | R/W | R/W | R/W | R/W | Reset Value |
|---|---|---|---|---|---|---|---|---|
| FOSE Bit7 | FRAE Bit6 | — Bit5 | — Bit4 | FLASCL Bit3 | Bit2 | Bit1 | Bit0 | 10001111 SFR Address: 0xB6 |

Bit7: FOSE: Flash One-Shot Timer Enable
(This is the timer which turns off the sense amps after reading the Flash).
0: Flash One-shot timer disabled.
1: Flash One-shot timer enabled
Bit6: FRAE: Flash Read Always Enable
0: Flash reads per one-shot timer
1: Flash always in read mode
Bits5-4: UNUSED. Read = 00b, Write = don't care.
Bits3-0: FLASCL: Flash Memory Timing Prescaler.
This register specifies the prescaler value for a given system clock required to generate the correct timing for Flash write/erase operations. If the prescaler is set to 1111b, Flash write/erase operations are disabled.
0000: System Clock <50 kHz
0001: 50 kHz ≦ System Clock < 100 kHz
0010: 100 kHz ≦ System Clock < 200 kHz
0011: 200 kHz ≦ System Clock < 400 kHz
0100: 400 kHz ≦ System Clock < 800 kHz
0101: 800 kHz ≦ System Clock < 1.6 MHz
0110: 1.6 MHz ≦ System Clock < 3.2 MHz
0111: 3.2 MHz ≦ System Clock < 6.4 MHz
1000: 6.4 MHz ≦ System Clock < 12.8 MHz
1001: 12.8 MHz ≦ System Clock < 20 MHz
1010, 1011, 1100, 1101, 1110: Reserved Values
1111: Flash Memory Write/Erase Disabled
The prescaler value is the smallest value satisfying the following equation:
FLASCL > $\log_2$(System Clock/50 kHz)

TABLE 31

FLACL: Flash Access Limit

| R/W | R/W | R/W | R/W | R/W | R/W | R/W | R/W | Reset Value |
|---|---|---|---|---|---|---|---|---|
| Bit7 | Bit6 | Bit5 | Bit4 | Bit3 | Bit2 | Bit1 | Bit0 | 00000000 SFR Address: 0xB7 |

Bits 7-0: FLACL: Flash Memory Read Limit.
This register holds the high byte of the 16-bit program memory read limit address. The entire 16-bit access limit address value is calculated as 0xNN00 where NN is replaced by contents of FLACL. A write to this register sets the Flash Access Limit. Any subsequent writes are ignored until the next reset.

TABLE 32

WDTCN: Watchdog Timer Control Register

| R/W | R/W | R/W | R/W | R/W | R/W | R/W | R/W | Reset Value |
|---|---|---|---|---|---|---|---|---|
| Bit7 | Bit6 | Bit5 | Bit4 | Bit3 | Bit2 | Bit1 | Bit0 | xxxxx111 SFR Address: 0xFF |

Bits7-0: WDT Control
Writing 0xA5 both enables and reloads the WDT.
Writing 0xDE followed within 4 clocks by 0xAD disables the WDT.
Writing 0xFF locks out the disable feature.
Bit4: Watchdog Status Bit
Reading the WDTCN.[4] bit indicates the Watchdog Timer Status.
0: WDT is inactive
1: WDT is active
Bits2-0: Watchdog Timeout Interval Bits
The WDTCN.[2:0] bits set the Watchdog Timeout Interval. When writing these bits, WDTCN.7 must be set to 0.

TABLE 34

RSTSRC: Reset Source Register

| R | R/W | R/W | R/W | R | R | R/W | R | Reset Value |
|---|---|---|---|---|---|---|---|---|
| JTAGRST Bit7 | CNVRSEF Bit6 | C0RSEF Bit5 | SWRSEF Bit4 | WDTRSF Bit3 | MCDRSF Bit2 | PORSF Bit1 | PINRSF Bit0 | xxxxxxxx SFR Address: 0xEF |

(Note: Do not use read-modify-write operations on this register.)
Bit7: JTAGRST. JTAG Reset Flag.
    0: Source of prior reset was not from JTAG command.
    1: Source of prior reset was from JTAG command.
Bit6: CNVRSEF: Convert Start Reset Source Enable and Flag
    Write
    0: CNVSTR is not a reset source
    1: CNVSTR is a reset source (active low)
    Read
    0: Source of prior reset was not from CNVSTR
    1: Source of prior reset was from CNVSTR
Bit5: C0RSEF: Comparator 0 Reset Enable and Flag
    Write
    0: Comparator 0 is not a reset source
    1: Comparator 0 is a reset source
    Read
    0: Source of prior reset was not from Comparator 0
    1: Source of prior reset was from Comparator 0

TABLE 34-continued

Bit4: SWRSF: Software Reset Force and Flag
  Write
    0: No Effect
    1: Forces an internal reset. /RST pin is not effected.
  Read
    0: Prior reset source was not from write to the SWRSF bit.
    1: Prior reset source was from write to the SWRSF bit.
Bit3: WDTRSF: Watchdog Timer Reset Flag
    0: Source of prior reset was not from WDT timeout.
    1: Source of prior reset was from WDT timeout.
Bit2: MCDRSF: Missing Clock Detector Flag
    0: Source of prior reset was not from Missing Clock Detector timeout.
    1: Source of prior reset was from Missing Clock Detector timeout.
Bit1: PORSF: Power-On Reset Force and Flag
  Write
    0: No effect
    1: Forces a Power-On Reset. /RST is driven low.
  Read
    0: Source of prior reset was not from POR.
    1: Source of prior reset was from POR.
Bit0: PINRSF: HW Pin Reset Flag
    0: Source of prior reset was not from /RST pin.
    1: Source of prior reset was from /RST pin.

TABLE 36

OSCICN: Internal Oscillator Control Register

| R/W | R/W | R/W | R/W | R/W | R/W | R/W | R/W | Reset Value |
|---|---|---|---|---|---|---|---|---|
| MSCLKE | — | — | IFRDY | CLKSL | IOSCEN | IFCN1 | IFCN0 | 00000100 |
| Bit7 | Bit6 | Bit5 | Bit4 | Bit3 | Bit2 | Bit1 | Bit0 | SFR Address: 0xB2 |

Bit7: MSCLKE: Missing Clock Enable Bit
    0: Missing Clock Detector Disabled
    1: Missing Clock Detector Enabled; triggers a reset if a missing clock is detected
Bits6-5: UNUSED. Read = 00b, Write = don't care
Bit4: IFRDY: Internal Oscillator Frequency Ready Flag
    0: Internal Oscillator Frequency not running at speed specified by the IFCN bits.
    1: Internal Oscillator Frequency running at speed specified by the IFCN bits.
Bit3: CLKSL: System Clock Source Select Bit
    0: Uses Internal Oscillator as System Clock.
    1: Uses External Oscillator as System Clock.
Bit2: IOSCEN: Internal Oscillator Enable Bit
    0: Internal Oscillator Disabled
    1: Internal Oscillator Enabled
Bits1-0: IFCN1-0: Internal Oscillator Frequency Control Bits
    00: Internal Oscillator typical frequency is 1.9 MHz.
    01: Internal Oscillator typical frequency is 3.8 MHz.
    10: Internal Oscillator typical frequency is 7.5 MHz.
    11: Internal Oscillator typical frequency is 15 MHz.

TABLE 37

OSCXCN: External Oscillator Control Register

| R | R/W | R/W | R/W | R/W | R/W | R/W | R/W | Reset Value |
|---|---|---|---|---|---|---|---|---|
| XTLVLD | XOSCMD2 | XOSCMD1 | XOSCMD0 | — | XFCN2 | XFCN1 | XFCN0 | 00110000 |
| Bit7 | Bit6 | Bit5 | Bit4 | Bit3 | Bit2 | Bit1 | Bit0 | SFR Address: 0xB1 |

Bit7: XTLVLD: Crystal Oscillator Valid Flag
    (Valid only when XOSCMD = 11x.)
    0: Crystal Oscillator is unused or not yet stable
    1: Crystal Oscillator is running and stable
Bits6-4: XOSCMD2-0: External Oscillator Mode Bits
    00x: Off. XTAL1 pin is grounded internally.
    010: System Clock from External CMOS Clock on XTAL1 pin.
    011: System Clock from External CMOS Clock on XTAL1 pin divided by 2.
    10x: RC/C Oscillator Mode with divide by 2 stage.
    110: Crystal Oscillator Mode
    111: Crystal Oscillator Mode with divide by 2 stage.
Bit3: RESERVED. Read = undefined, Write = don't care
Bits2-0: XFCN2-0: External Oscillator Frequency Control Bits
    000-111: see table below TABLE 37-continued

| XFCN | Crystal (XOSCMD = 11x) | RC (XOSCMD = 10x) | C (XOSCMD = 10x) |
|---|---|---|---|
| 000 | Power Factor = 90 ($10^3$) | f ≦ 25 kHz | K Factor = 0.741 |
| 001 | Power Factor = 280 ($10^3$) | 25 kHz < f ≦ 50 kHz | K Factor = 2.36 |
| 010 | Power Factor = 810 ($10^3$) | 50 kHz < f ≦ 100 kHz | K Factor = 7.10 |
| 011 | Power Factor = 2.30 ($10^6$) | 100 kHz < f ≦ 200 kHz | K Factor = 21.0 |
| 100 | Power Factor = 6.30 ($10^6$) | 200 kHz < f ≦ 400 kHz | K Factor = 60.8 |
| 101 | Power Factor = 20.4 ($10^6$) | 400 kHz < f ≦ 800 kHz | K Factor = 225 |
| 110 | Power Factor = 36.6 ($10^6$) | 800 kHz < f ≦ 1.6 MHz | K Factor = 773 |
| 111 | Power Factor = 110 ($10^6$) | 1.6 MHz < f ≦ 3.2 MHz | K Factor = 2141 |

CRYSTAL MODE (Option 1; XOSCMD = 11x)
    Choose smallest Power Factor (PF) such that:
    PF > 5 * ESR * $f^2$ * $C_L^2$, where
    ESR = crystal equivalent series resistance in ohms
    f = crystal frequency in MHz
    $C_L$ = load capacitance in pF (crystal capacitance, parasitic, compensation network)
RC MODE (Option 2; XOSCMD = 10x)
    Choose oscillation frequency range where:
    f = 1.23($10^3$)/(R * C), where
    f = frequency of oscillation in MHz
    C = capacitor value in pF
    R = Pull-up resistor value in kΩ
C MODE (Option 3; XOSCMD = 10x)
    Choose K Factor (KF) for the oscillation frequency desired:
    f = KF/(C * AV+), where
    f = frequency of oscillation in MHz
    C = capacitor value on XTAL1, XTAL2 pins in pF
    AV+= Analog Power Supply on MCU in volts

TABLE 39

XBR0: Port I/O CrossBar Register 0

| R/W | R/W | R/W | R/W | R/W | R/W | R/W | R/W | Reset Value |
|---|---|---|---|---|---|---|---|---|
| CP0OEN | ECIE | | PCA0ME | | UARTEN | SPI0OEN | SMB0OEN | 00000000 |
| Bit7 | Bit6 | Bit5 | Bit4 | Bit3 | Bit2 | Bit1 | Bit0 | SFR Address: 0xE1 |

Bit7:    CP0OEN: Comparator 0 Output Enable Bit
         0: CP0 unavailable at Port pin.
         1: CP0 routed to Port Pin.
Bit6:    ECIE: PCA0 Counter Input Enable Bit
         0: ECI unavailable at Port pin.
         1: ECI routed to Port Pin.
Bits3-5:  PCA0ME: PCA Module I/O Enable Bits
         000: All PCA I/O unavailable at Port pins.
         001: CEX0 routed to Port Pin.
         010: CEX0, CEX1 routed to 2 Port Pins.
         011: CEX0, CEX1, CEX2 routed to 3 Port Pins.
         100: CEX0, CEX1, CEX2, CEX3 routed to 4 Port Pins.
         101: CEX0, CEX1, CEX2, CEX3, CEX4 routed to 5 Port Pins.
         110: RESERVED
         111: RESERVED
Bit2:    UARTEN: UART I/O Enable Bit
         0: UART I/O unavailable at Port pins.
         1: RX, TX routed to 2 Port Pins.
Bit1:    SPI0OEN: SPI Bus I/O Enable Bit
         0: SPI I/O unavailable at Port pins.
         1: MISO, MOSI, SCK, and NSS routed to 4 Port Pins.
Bit0:    SMB0OEN: SMBus Bus I/O Enable Bit
         0: SMBus I/O unavailable at P0.0, P0.1.
         1: SDA routed to P0.0, SCL routed to P0.1.

TABLE 40

XBR1: Port I/O CrossBar Register 1

| R/W | R/W | R/W | R/W | R/W | R/W | R/W | R/W | Reset Value |
|---|---|---|---|---|---|---|---|---|
| SYSCKE | T2EXE | T2E | INT1E | T1E | INT0E | T0E | CP1OE | 00000000 |
| Bit7 | Bit6 | Bit5 | Bit4 | Bit3 | Bit2 | Bit1 | Bit0 | SFR Address: 0xE2 |

Bit7:    SYSCKE: SYSCLK Output Enable Bit
         0: SYSCLK unavailable at Port pin.
         1: SYSCLK output routed to Port Pin.

TABLE 40-continued

Bit6: T2EXE: T2EX Enable Bit
    0: T2EX unavailable at Port pin.
    1: T2EX routed to Port Pin.
Bit5: T2E: T2 Enable Bit
    0: T2 unavailable at Port pin.
    1: T2 routed to Port Pin.
Bit4: INT1E: /INT1 Enable Bit
    0: /INT1 unavailable at Port pin.
    1: /INT1 routed to Port Pin.
Bit3: T1E: T1 Enable Bit
    0: T1 unavailable at Port pin.
    1: T1 routed to Port Pin.
Bit2: INT0E: /INT0 Enable Bit
    0: /INT0 unavailable at Port pin.
    1: /INT0 routed to Port Pin.
Bit1: T0E: T0 Enable Bit
    0: T0 unavailable at Port pin.
    1: T0 routed to Port Pin.
Bit0: CP1OE: Comparator 1 Output Enable Bit
    0: CP1 unavailable at Port pin.
    1: CP1 routed to Port Pin.

TABLE 41

XBR2: Port I/O CrossBar Register 2

| R/W | R/W | R/W | R/W | R/W | R/W | R/W | R/W | Reset Value |
|---|---|---|---|---|---|---|---|---|
| WEAKPU | XBARE | — | — | — | — | — | CNVSTE | 00000000 |
| Bit7 | Bit6 | Bit5 | Bit4 | Bit3 | Bit2 | Bit1 | Bit0 | SFR Address: 0xE3 |

Bit7: WEAKPU: Port I/O Weak Pull-up Disable Bit
    0: Weak Pull-ups Enabled
    1: Weak Pull-ups Disabled
Bit6: XBARE: Crossbar Enable Bit
    0: Crossbar Disabled
    1: Crossbar Enabled
Bits5-1: UNUSED. Read = 00000b, Write = don't care.
Bit0: CNVSTE: ADC Convert Start Input Enable Bit
    0: CNVSTR unavailable at Port pin.
    1: CNVSTR routed to Port Pin.
Example Usage of XBR0, XBR1, XBR2:

When selected, the digital resources fill the Port I/O pins in order
starting with P0.0 though P0.7, and then P1.0 through P1.7, and
finally P2.0 through P2.7. If the digital resources are not mapped
to the Port I/O pins, they default to their matching internal Port Register bits.
Example1: If XBR0 = 0x11, XBR1 = 0x00, and XBR2 = 0x40:
P0.0 = SDA, P0.1 = SCL, P0.2 = CEX0, P0.3 = CEX1, P0.4...P2.7 map to
corresponding Port I/O.
Example2: If XBR0 = 0x80, XBR1 = 0x04, and XBR2 = 0x41:
P0.0 = CP0, P0.1 = /INT0, P0.2 = CNVSTR, P0.3...P2.7 map to
corresponding Port I/O.

TABLE 42

P0: Port0 Register

| R/W | R/W | R/W | R/W | R/W | R/W | R/W | R/W | Reset Value |
|---|---|---|---|---|---|---|---|---|
| P0.7 | P0.6 | P0.5 | P0.4 | P0.3 | P0.2 | P0.1 | P0.0 | 11111111 |
| Bit7 | Bit6 | Bit5 | Bit4 | Bit3 | Bit2 | Bit1 | Bit0 (bit addressable) | SFR Address: 0x80 |

Bits7-0: P0.[7:0]
    (Write - Output appears on I/O pins per XBR0, XBR1, and XBR2 Registers)
    0: Logic Low Output.
    1: Logic High Output (open if corresponding PRT0CF.n bit = 0)
    (Read - Regardless of XBR0, XBR1, and XBR2 Register settings).
    0: P0.n pin is logic low.
    1: P0.n pin is logic high.

TABLE 43

PRT0CF: Port0 Configuration Register

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xA4 |

Bits7-0: PRT0CF.[7:0]: Output Configuration Bits for P0.7-P0.0 (respectively)
0: Corresponding P0.n Output is Open-Drain.
1: Corresponding P0.n Output is Push-Pull.
(Note: When SDA, SCL, and RX appear on any of the P0 I/O, each are open-drain regardless of the value of PRT0CF).

TABLE 44

P1: Port1 Register

| R/W | R/W | R/W | R/W | R/W | R/W | R/W | R/W | Reset Value 11111111 |
|---|---|---|---|---|---|---|---|---|
| P1.7 | P1.6 | P1.5 | P1.4 | P1.3 | P1.2 | P1.1 | P1.0 | |
| Bit7 | Bit6 | Bit5 | Bit4 | Bit3 | Bit2 | Bit1 | Bit0 (bit addressable) | SFR Address: 0x90 |

Bits7-0: P1.[7:0]
(Write - Output appears on I/O pins per XBR0, XBR1, and XBR2 registers)
0: Logic Low Output.
1: Logic High Output (open if corresponding PRT1CF.n bit = 0)
(Read - Regardless of XBR0, XBR1, and XBR2 Register settings).
0: P1.n pin is logic low.
1: P1.n pin is logic high.

TABLE 45

PRT1CF: Port1 Configuration Register

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xA5 |

Bits7-0: PRT1CF.[7:0]: Output Configuration Bits for P1.7-P1.0 (respectively)
0: Corresponding P1.n Output is Open-Drain.
1: Corresponding P1.n Output is Push-Pull.

TABLE 46

PRT1IF: Port1 Interrupt Flag Register

| R/W | R/W | R/W | R/W | R/W | R/W | R/W | R/W | Reset Value 00000000 |
|---|---|---|---|---|---|---|---|---|
| IE7 | IE6 | IE5 | IE4 | — | — | — | — | |
| Bit7 | Bit6 | Bit5 | Bit4 | Bit3 | Bit2 | Bit1 | Bit0 | SFR Address: 0xAD |

Bit7: IE7: External Interrupt 7 Pending Flag.
0: No falling edge detected on P1.7.
1: This flag is set by hardware when a falling edge on P1.7 is detected.
Bit6: IE6: External Interrupt 6 Pending Flag.
0: No falling edge detected on P1.6.
1: This flag is set by hardware when a falling edge on P1.6 is detected.
Bit5: IE5: External Interrupt 5 Pending Flag.
0: No falling edge detected on P1.5.
1: This flag is set by hardware when a falling edge on P1.5 is detected.
Bit4: IE4: External Interrupt 4 Pending Flag.
0: No falling edge detected on P1.4.
1: This flag is set by hardware when a falling edge on P1.4 is detected.
Bits3-0: UNUSED. Read = 0000b, Write = don't care.

TABLE 47

P2: Port2 Register

| R/W | R/W | R/W | R/W | R/W | R/W | R/W | R/W | Reset Value 11111111 |
|---|---|---|---|---|---|---|---|---|
| P2.7 | P2.6 | P2.5 | P2.4 | P2.3 | P2.2 | P2.1 | P2.0 | |
| Bit7 | Bit6 | Bit | Bit4 | Bit3 | Bit2 | Bit1 | Bit0 (bit addressable) | SFR Address: 0xA0 |

Bits7-0: P2.[7:0]
(Write - Output appears on I/O pins per XBR0, XBR1, and XBR2 registers)
0: Logic Low Output.
1: Logic High Output (open if corresponding PRT2CF.n bit = 0)
(Read - Regardless of XBR0, XBR1, and XBR2 Register settings).
0: P2.n is logic low.
1: P2.n is logic high.

TABLE 48

PRT2CF: Port2 Configuration Register

| R/W | R/W | R/W | R/W | R/W | R/W | R/W | R/W | Reset Value 00000000 |
|---|---|---|---|---|---|---|---|---|

TABLE 48-continued

| Bit7 | Bit6 | Bit5 | Bit4 | Bit3 | Bit2 | Bit1 | Bit0 | SFR Address: 0xA6 |
|------|------|------|------|------|------|------|------|-------------------|

Bits7-0: PRT2CF.[7:0]: Output Configuration Bits for P2.7-P2.0 (respectively)
0: Corresponding P2.n Output is Open-Drain.
1: Corresponding P2.n Output is Push-Pull.

TABLE 49

P3: Port3 Register

| R/W | R/W | R/W | R/W | R/W | R/W | R/W | R/W | Reset Value |
|-----|-----|-----|-----|-----|-----|-----|-----|-------------|
| P3.7 | P3.6 | P3.5 | P3.4 | P3.3 | P3.2 | P3.1 | P3.0 | 11111111 |
| Bit7 | Bit6 | Bit5 | Bit4 | Bit3 | Bit2 | Bit1 | Bit0 (bit addressable) | SFR Address: 0xB0 |

Bits7-0: P3.[7:0]
(Write)
0: Logic Low Output.
1: Logic High Output (open if corresponding PRT3CF.n bit = 0)
(Read)
0: P3.n is logic low.
1: P3.n is logic high.

TABLE 50

PRT3CF: Port3 Configuration Register

| R/W | R/W | R/W | R/W | R/W | R/W | R/W | R/W | Reset Value 00000000 |
|-----|-----|-----|-----|-----|-----|-----|-----|----------------------|
| Bit7 | Bit6 | Bit5 | Bit4 | Bit3 | Bit2 | Bit1 | Bit0 | SFR Address: 0xA7 |

TABLE 50-continued

Bits7-0: PRT3CF.[7:0]: Output Configuration Bits for P3.7-P3.0 (respectively)
0: Corresponding P3.n Output is Open-Drain.
1: Corresponding P3.n Output is Push-Pull.

TABLE 51

SMB0CN: SMBus Control Register

| R | R/W | R/W | R/W | R/W | R/W | R/W | R/W | Reset Value |
|---|-----|-----|-----|-----|-----|-----|-----|-------------|
| BUSY | ENSMB | STA | STO | SI | AA | FTE | TOE | 00000000 |
| Bit7 | Bit6 | Bit5 | Bit4 | Bit3 | Bit2 | Bit1 | Bit0 (bit addressable) | SFR Address: 0xC0 |

Bit7: BUSY: Busy Status Flag.
    0: SMBus is free
    1: SMBus is busy
Bit6: ENSMB: SMBus Enable.
    This bit enables/disables the SMBus serial interface.
    0: SMBus disabled.
    1: SMBus enabled.
Bit5: STA: SMBus Start Flag.
    0: No START condition is transmitted.
    1: When operating as a master, a START condition is transmitted if the bus is free.
    (If the bus is not free, the START is transmitted after a STOP is received.) If STA is
    set after one or more bytes have been transmitted or received and before a STOP is
    received, a repeated START condition is transmitted.
Bit4: STO: SMBus Stop Flag.
    0: No STOP condition is transmitted.
    1: Setting STO to logic 1 causes a STOP condition to be transmitted. When a STOP
    condition is received, hardware clears STO to logic 0. If both STA and STO are set, a
    STOP condition is transmitted followed by a START condition. In slave mode, setting
    the STO flag causes SMBus to behave as if a STOP condition was received.
Bit3: SI: SMBus Serial Interrupt Flag.
    This bit is set by hardware when one of 27 possible SMBus states is entered. (Status
    code 0xF8 does not cause SI to be set.) When the SI interrupt is enabled, setting this
    bit causes the CPU to vector to the SMBus interrupt service routine. This bit is not
    automatically cleared by hardware and must be cleared by software.
Bit2: AA: SMBus Assert Acknowledge Flag.
    This bit defines the type of acknowledge returned during the acknowledge cycle on the
    SCL line.
    0: A "not acknowledge" (high level on SDA) is returned during the acknowledge
    cycle.
    1: An "acknowledge" (low level on SDA) is returned during the acknowledge cycle.

TABLE 51-continued

Bit1: FTE: SMBus Free Timer Enable Bit
  0: No timeout when SCL is high
  1: Timeout when SCL high time exceeds limit specified by the SMB0CR value.
Bit0: TOE: SMBus Timeout Enable Bit
  0: No timeout when SCL is low.
  1: Timeout when SCL low time exceeds limit specified by Timer 3, if enabled.

TABLE 52

SMB0CR: SMBus Clock Rate Register

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xCF |

Bits7-0: SMB0CR.[7:0]: SMBus Clock Rate Preset
  The SMB0CR Clock Rate register controls the frequency of
  the serial clock SCL in master mode. The 8-bit word
  stored in the SMB0CR Register preloads a dedicated
  8-bit timer. The timer counts up, and when it rolls over
  to 0x00, the SCL logic state toggles. The period of the SCL
  clock is given in the following equation:
  $T_H = T_L = T_{SYSCLK} * [(256 - SMB0CR) + 2.5] \geq 5$ usec
  Using the same value of SMB0CR from above, the Bus Free
  Timeout period is given in the following equation:
  $T_{BFT} = T_{SYSCLK} * [10 * (256 - SMB0CR) + 1] \geq 50$ usec

TABLE 53

SMB0DAT: SMBus Data Register

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xC2 |

Bits7-0: SMB0DAT: SMBus Data.
  The SMB0DAT register contains a byte of data to be transmitted
  on the SMBus serial interface or a byte that has just been
  received on the SMBus serial interface. The CPU can read
  from or write to this register whenever the SI serial interrupt
  flag (SMB0CN.3) is set to logic one. The serial data in the
  register remains stable as long as the SI flag is set. When
  the SI flag is not set, the system may be in the process of
  shifting data in/out and the CPU should not attempt to
  access this register.

TABLE 54

SMB0ADR: SMBus Address Register

| R/W | R/W | R/W | R/W | R/W | R/W | R/W | R/W | Reset Value 00000000 |
|---|---|---|---|---|---|---|---|---|
| SLV6 | SLV5 | SLV4 | SLV3 | SLV2 | SLV1 | SLV0 | GC | |

TABLE 54-continued

| Bit7 | Bit6 | Bit5 | Bit4 | Bit3 | Bit2 | Bit1 | Bit0 | SFR Address: 0xC3 |
|---|---|---|---|---|---|---|---|---|

Bits7-1: SLV6-SLV0: SMBus Slave Address.
  These bits are loaded with the 7-bit slave address to which the
  SMBus will respond when operating as a slave transmitter or
  slave receiver. SLV6 is the most significant bit of the address
  and corresponds to the first bit of the address byte received
  on the SMBus.
Bit0: GC: General Call Address Enable.
  This bit is used to enable general call address (0x00) recognition.
  0: General call address is ignored.
  1: General call address is recognized.

TABLE 55

SMB0STA: SMBus Status Register

| R/W | R/W | R/W | R/W | R/W | R/W | R/W | R/W | Reset Value 11111000 |
|---|---|---|---|---|---|---|---|---|
| STA7 | STA6 | STA5 | STA4 | STA3 | STA2 | STA1 | STA0 | |
| Bit7 | Bit6 | Bit5 | Bit4 | Bit3 | Bit2 | Bit1 | Bit0 | SFR Address: 0xC1 |

Bits7-3: STA7-STA3: SMBus Status Code.
  These bits contain the SMBus Status Code. There are 28
  possible status codes. Each status code corresponds to a
  single SMBus state. A valid status code is present in SMB0STA
  when the SI flag (SMB0CN.3) is set. The content of SMB0STA
  is not defined when the SI flag is logic 0. Writing to the
  SMB0STA register at any time will yield indeterminate results.
Bits2-0: STA2-STA0: The three least significant bits of SMB0STA are
  always read as logic 0 when the SI flag is logic 1.

TABLE 57

SPI0CFG: SPI Configuration Register

| R/W | R/W | R | R | R | R/W | R/W | R/W | Reset Value 00000000 |
|---|---|---|---|---|---|---|---|---|
| CKPHA | CKPOL | BC2 | BC1 | BC0 | SPIFRS2 | SPIFRS1 | SPIFRS0 | |
| Bit7 | Bit6 | Bit5 | Bit4 | Bit3 | Bit2 | Bit1 | Bit0 | SFR Address: 0x9A |

Bit7: CKPHA: SPI Clock Phase.
  This bit controls the SPI clock phase.
  0: Data sampled on first edge of SCK period.
  1: Data sampled on second edge of SCK period.

TABLE 57-continued

Bit6: CKPOL: SPI Clock Polarity.
This bit controls the SPI clock polarity.
0: SCK line low in idle state.
1: SCK line high in idle state.
Bits5-3: BC2-BC0: SPI Bit Count.
Indicates which of the up to 8 bits of the SPI word have been transmitted.

| BC2-BC0 | | | Bit Transmitted |
|---|---|---|---|
| 0 | 0 | 0 | Bit 0 (LSB) |
| 0 | 0 | 1 | Bit 1 |
| 0 | 1 | 0 | Bit 2 |
| 0 | 1 | 1 | Bit 3 |
| 1 | 0 | 0 | Bit 4 |
| 1 | 0 | 1 | Bit 5 |
| 1 | 1 | 0 | Bit 6 |
| 1 | 1 | 1 | Bit 7 (MSB) |

Bits2-0: SPIFRS2-SPIFRS0: SPI Frame Size.
These three bits determine the number of bits to shift in/out of the SPI shift register during a data transfer in master mode. They are ignored in slave mode.

| SPIFRS | | | Bits Shifted |
|---|---|---|---|
| 0 | 0 | 0 | 1 |
| 0 | 0 | 1 | 2 |
| 0 | 1 | 0 | 3 |
| 0 | 1 | 1 | 4 |
| 1 | 0 | 0 | 5 |
| 1 | 0 | 1 | 6 |
| 1 | 1 | 0 | 7 |
| 1 | 1 | 1 | 8 |

TABLE 58

SPI0CN: SPI Control Register

| R/W | R/W | R/W | R/W | R | R | R/W | R/W | Reset Value |
|---|---|---|---|---|---|---|---|---|
| SPIF | WCOL | MODF | RXOVRN | TXBSY | SLVSEL | MSTEN | SPIEN | 00000000 |
| Bit7 | Bit6 | Bit5 | Bit4 | Bit3 | Bit2 | Bit1 | Bit0 | SFR Address: 0xF8 |

Bit7: SPIF: SPI Interrupt Flag.
This bit is set to logic 1 by hardware at the end of a data transfer. If interrupts are enabled, setting this bit causes the CPU to vector to the SPI0 interrupt service routine. This bit is not automatically cleared by hardware. It must be cleared by software.
Bit6: WCOL: Write Collision Flag.
This bit is set to logic 1 by hardware (and generates a SPI interrupt) to indicate a write to the SPI data register was attempted while a data transfer was in progress. It is cleared by software.
Bit5: MODF: Mode Fault Flag.
This bit is set to logic 1 by hardware (and generates a SPI interrupt) when a master mode collision is detected (NSS is low and MSTEN = 1). This bit is not automatically cleared by hardware. It must be cleared by software.
Bit4: RXOVRN: Receive Overrun Flag.
This bit is set to logic 1 by hardware (and generates a SPI interrupt) when the receive buffer still holds unread data from a previous transfer and the last bit of the current transfer is shifted into the SPI shift register. This bit is not automatically cleared by hardware. It must be cleared by software.
Bit3: TXBSY: Transmit Busy Flag.
This bit is set to logic 1 by hardware while a master mode transfer is in progress. It is cleared by hardware at the end of the transfer.
Bit2: SLVSEL: Slave Selected Flag.
This bit is set to logic 1 whenever the NSS pin is low indicating it is enabled as a slave. It is cleared to logic 0 when NSS is high (slave disabled).
Bit1: MSTEN: Master Mode Enable.
0: Disable master mode. Operate in slave mode.
1: Enable master mode. Operate as a master.
Bit0: SPIEN: SPI Enable.
This bit enables/disables the SPI.
0: SPI disabled.
1: SPI enabled.

TABLE 59

SPI0CKR: SPI Clock Rate Register

| R/W | R/W | R/W | R/W | R/W | R/W | R/W | R/W | Reset Value |
|---|---|---|---|---|---|---|---|---|
| SCR7 | SCR6 | SCR5 | SCR4 | SCR3 | SCR2 | SCR1 | SCR0 | 00000000 |
| Bit7 | Bit6 | Bit5 | Bit4 | Bit3 | Bit2 | Bit1 | Bit0 | SFR Address: 0x9D |

TABLE 59-continued

Bits7-0: SCR7-SCR0: SPI Clock Rate
These bits determine the frequency of the SCK output when the SPI module is configured for master mode operation. The SCK clock frequency is a divided down version of the system clock, and is given in the following equations:

$f_{SCK} = 0.5 * f_{SYSCLK}/(\text{SPI0CKR} + 1)$, for $3 <= \text{SPI0CKR} <= 255$, $f_{SCK} = f_{SYSCLK}/8$, for $0 <= \text{SPI0CKR} <= 2$.

TABLE 60

SPI0DAT: SPI Data Register

| R/W | R/W | R/W | R/W | R/W | R/W | R/W | R/W | Reset Value |
|---|---|---|---|---|---|---|---|---|
| — | — | — | — | — | — | — | — | 00000000 |
| Bit7 | Bit6 | Bit5 | Bit4 | Bit3 | Bit2 | Bit1 | Bit0 | SFR Address: 0x9B |

Bits7-0: SPI0DAT: SPI0 Transmit and Receive Data.
The SPI0DAT register is used to transmit and receive SPI data. Writing data to SPI0DAT places the data immediately into the shift register and initiates a transfer when in Master Mode. A read of SPI0DAT returns the contents of the receive buffer.

TABLE 61

SBUF: Serial (UART) Data Buffer Register

| R/W | R/W | R/W | R/W | R/W | R/W | R/W | R/W | Reset Value |
|---|---|---|---|---|---|---|---|---|
| | | | | | | | | 00000000 |
| Bit7 | Bit6 | Bit5 | Bit4 | Bit3 | Bit2 | Bit1 | Bit0 | SFR Address: 0x99 |

Bits7-0: SBUF.[7:0]: Serial Data Buffer Bits 7-0 (MSB-LSB)
This is actually two registers; a transmit and a receive buffer register. When data is moved to SBUF, it goes to the transmit buffer and is held for serial transmission. Moving a byte to SBUF is what initiates the transmission. When data is moved from SBUF, it comes from the receive buffer.

TABLE 62

SCON: Serial Port Control Register

| R/W | R/W | R/W | R/W | R/W | R/W | R/W | R/W | Reset Value |
|---|---|---|---|---|---|---|---|---|
| SM0 | SM1 | SM2 | REN | TB8 | RB8 | TI | RI | 00000000 |
| Bit7 | Bit6 | Bit5 | Bit4 | Bit3 | Bit2 | Bit1 | Bit0 (bit address- able) | SFR Address: 0x98 |

Bits7-6: SM0-SM1: Serial Port Operation Mode.
These bits select the Serial Port Operation Mode.

| SM0 | SM1 | Mode |
|---|---|---|
| 0 | 0 | Mode 0: Synchronous Mode |
| 0 | 1 | Mode 1: 8-Bit UART, Variable Baud Rate |
| 1 | 0 | Mode 2: 9-Bit UART, Fixed Baud Rate |
| 1 | 1 | Mode 3: 9-Bit UART, Variable Baud Rate |

Bit5: SM2: Multiprocessor Communication Enable.
The function of this bit is dependent on the Serial Port Operation Mode.
Mode 0: No effect
Mode 1: Checks for valid stop bit.
0: Logic level of stop bit is ignored.
1: RI will only be activated if stop bit is logic level 1.
Mode 2 and 3: Multiprocessor Communications Enable.
0: Logic level of ninth bit is ignored.
1: RI is set and an interrupt is generated only when the ninth bit is logic 1.

TABLE 62-continued

Bit4: REN: Receive Enable.
This bit enables/disables the UART receiver.
0: UART reception disabled.
1: UART reception enabled.
Bit3: TB8: Ninth Transmission Bit.
The logic level of this bit will be assigned to the ninth transmission bit in Modes 2 and 3. It is not used in Modes 0 and 1. Set or cleared by software as required.
Bit2: RB8: Ninth Receive Bit.
The bit is assigned the logic level of the ninth bit received in Modes 2 and 3. In Mode 1, if SM2 is logic 0, RB8 is assigned the logic level of the received stop bit. RB8 is not used in Mode 0.
Bit1: TI: Transmit Interrupt Flag.
Set by hardware when a byte of data has been transmitted by the UART (after the $8^{th}$ bit in Mode 0, or at the beginning of the stop bit in other modes). When the UART interrupt is enabled, setting this bit causes the CPU to vector to the UART interrupt service routine. This bit must be cleared manually by software
Bit0: RI: Receive Interrupt Flag.
Set by hardware when a byte of data has been received by the UART (after the $8^{th}$ bit in Mode 0, or after the stop bit in other modes - see SM2 bit for exception). When the UART interrupt is enabled, setting this bit causes the CPU to vector to the UART interrupt service routine. This bit must be cleared manually by software.

TABLE 64

TCON: Timer Control Register

| R/W | R/W | R/W | R/W | R/W | R/W | R/W | R/W | Reset Value |
|---|---|---|---|---|---|---|---|---|
| TF1 | TR1 | TF0 | TR0 | IE1 | IT1 | IE0 | IT0 | 00000000 |
| Bit7 | Bit6 | Bit5 | Bit4 | Bit3 | Bit2 | Bit1 | Bit0 | SFR Address: 0x88 |

Bit7: TF1: Timer 1 Overflow Flag.
Set by hardware when Timer 1 overflows. This flag can be cleared by software but is automatically cleared when the CPU vectors to the Timer 1 interrupt service routine.
0: No Timer 1 overflow detected.
1: Timer 1 has overflowed.
Bit6: TR1: Timer 1 Run Control.
0: Timer 1 disabled.
1: Timer 1 enabled.
Bit5: TF0: Timer 0 Overflow Flag.
Set by hardware when Timer 0 overflows. This flag can be cleared by software but is automatically cleared when the CPU vectors to the Timer 0 interrupt service routine.
0: No Timer 0 overflow detected.
1: Timer 0 has overflowed.
Bit4: TR0: Timer 0 Run Control.
0: Timer 0 disabled.
1: Timer 0 enabled.
Bit3: IE1: External Interrupt 1.
This flag is set by hardware when an edge/level of type defined by IT1 is detected. It can be cleared by software but is automatically cleared when the CPU vectors to the External Interrupt 1 service routine if IT1 = 1. This flag is the inverse of the /INT1 input signal's logic level when IT1 = 0.
Bit2: IT1: Interrupt 1 Type Select.
This bit selects whether the configured /INT1 signal will detect falling edge or active-low level-sensitive interrupts.
0: /INT1 is level triggered.
1: /INT1 is edge triggered.
Bit1: IE0: External Interrupt 0.
This flag is set by hardware when an edge/level of type defined by IT0 is detected. It can be cleared by software but is automatically cleared when the CPU vectors to the External Interrupt 0 service routine if IT0 = 1. This flag is the inverse of the /INT0 input signal's logic level when IT0 = 0.
Bit0: IT0: Interrupt 0 Type Select.
This bit selects whether the configured /INT0 signal will detect falling edge or active-low level-sensitive interrupts.
0: /INT0 is level triggered.
1: /INT0 is edge triggered.

TABLE 66

TMOD: Timer Mode Register

| R/W | R/W | R/W | R/W | R/W | R/W | R/W | R/W | Reset Value |
|-----|-----|-----|-----|-----|-----|-----|-----|-------------|
| GATE1 | C/T1 | T1M1 | T1M0 | GATE0 | C/T0 | T0M1 | T0M0 | 00000000 |
| Bit7 | Bit6 | Bit5 | Bit4 | Bit3 | Bit2 | Bit1 | Bit0 | SFR Address: 0x89 |

Bit7: GATE1: Timer 1 Gate Control.
    0: Timer 1 enabled when TR1 = 1 irrespective of /INT1 logic level.
    1: Timer 1 enabled only when TR1 = 1 AND /INT1 = logic level one.
Bit6: C/T1: Counter/Timer 1 Select.
    0: Timer Function: Timer 1 incremented by clock defined by T1M bit (CKCON.4).
    1: Counter Function: Timer 1 incremented by high-to-low transitions on external input pin.
Bits5-4: T1M1-T1M0: Timer 1 Mode Select.
    These bits select the Timer 1 operation mode.

| T1M1 | T1M0 | Mode |
|------|------|------|
| 0 | 0 | Mode 0: 13-bit counter/timer |
| 0 | 1 | Mode 1: 16-bit counter/timer |
| 1 | 0 | Mode 2: 8-bit counter/timer with auto-reload |
| 1 | 1 | Mode 3: Timer 1 Inactive |

Bit3: GATE0: Timer 0 Gate Control.
    0: Timer 0 enabled when TR0 = 1 irrespective of /INT0 logic level.
    1: Timer 0 enabled only when TR0 = 1 AND /INT0 = logic level one.
Bit2: C/T0: Counter/Timer Select.
    0: Timer Function: Timer 0 incremented by clock defined by T0M bit (CKCON.3).
    1: Counter Function: Timer 0 incremented by high-to-low transitions on external input pin.
Bits1-0: T0M1-T0M0: Timer 0 Mode Select.
    These bits select the Timer 0 operation mode.

| T0M1 | T0M0 | Mode |
|------|------|------|
| 0 | 0 | Mode 0: 13-bit counter/timer |
| 0 | 1 | Mode 1: 16-bit counter/timer |
| 1 | 0 | Mode 2: 8-bit counter/timer with auto-reload |
| 1 | 1 | Mode 3: Two 8-bit counter/timers |

TABLE 69

CKCON: Clock Control Register

| R/W | R/W | R/W | R/W | R/W | R/W | R/W | R/W | Reset Value |
|-----|-----|-----|-----|-----|-----|-----|-----|-------------|
| — | — | T2M | T1M | T0M | — | — | — | 00000000 |
| Bit7 | Bit6 | Bit5 | Bit4 | Bit3 | Bit2 | Bit1 | Bit0 | SFR Address: 0x8E |

Bits7-6: UNUSED. Read = 00b, Write = don't care.
Bit5: T2M: Timer 2 Clock Select.
    This bit controls the division of the system clock supplied to Timer 2. This bit is ignored when the timer is in baud rate generator mode or counter mode (i.e. C/T2 = 1).
    0: Timer 2 uses the system clock divided by 12.
    1: Timer 2 uses the system clock.
Bit4: T1M: Timer 1 Clock Select.
    This bit controls the division of the system clock supplied to Timer 1.
    0: Timer 1 uses the system clock divided by 12.
    1: Timer 1 uses the system clock.
Bit3: T0M: Timer 0 Clock Select.
    This bit controls the division of the system clock supplied to Counter/Timer 0.
    0: Counter/Timer uses the system clock divided by 12.
    1: Counter/Timer uses the system clock.
Bits2-0: UNUSED. Read = 000b, Write = don't care.

TABLE 70

TL0: Timer 0 Low Byte

| R/W | R/W | R/W | R/W | R/W | R/W | R/W | R/W | Reset Value |
|-----|-----|-----|-----|-----|-----|-----|-----|-------------|
| | | | | | | | | 00000000 |
| Bit7 | Bit6 | Bit5 | Bit4 | Bit3 | Bit2 | Bit1 | Bit0 | SFR Address: 0x8A |

Bits 7-0: TL0: Timer 0 Low Byte.
    The TL0 register is the low byte of the 16-bit Timer 0.

TABLE 71

TL1: Timer 1 Low Byte

| R/W | R/W | R/W | R/W | R/W | R/W | R/W | R/W | Reset Value |
|-----|-----|-----|-----|-----|-----|-----|-----|-------------|
| | | | | | | | | 00000000 |
| Bit7 | Bit6 | Bit5 | Bit4 | Bit3 | Bit2 | Bit1 | Bit0 | SFR Address: 0x8B |

Bits 7-0: TL1: Timer 1 Low Byte.
    The TL1 register is the low byte of the 16-bit Timer 1.

TABLE 72

TH0: Timer 0 High Byte

| R/W | R/W | R/W | R/W | R/W | R/W | R/W | R/W | Reset Value |
|-----|-----|-----|-----|-----|-----|-----|-----|-------------|
| | | | | | | | | 00000000 |
| Bit7 | Bit6 | Bit5 | Bit4 | Bit3 | Bit2 | Bit1 | Bit0 | SFR Address: 0x8C |

Bits 7-0: TH0: Timer 0 High Byte.
    The TH0 register is the high byte of the 16-bit Timer 0.

TABLE 73

TH1: Timer 1 High Byte

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0x8D |

Bits 7-0: TH1: Timer 1 High Byte.
The TH1 register is the high byte of the 16-bit Timer 1.

TABLE 74

T2CON: Timer 2 Control Register

| R/W | R/W | R/W | R/W | R/W | R/W | R/W | R/W | Reset Value |
|---|---|---|---|---|---|---|---|---|
| TF2 | EXF2 | RCLK | TCLK | EXEN2 | TR2 | C/T2 | CP/RL2 | 00000000 |
| Bit7 | Bit6 | Bit5 | Bit4 | Bit3 | Bit2 | Bit1 | Bit0 (bit addressable) | SFR Address: 0xC8 |

Bit7: TF2: Timer 2 Overflow Flag.
Set by hardware when Timer 2 overflows from 0xFFFF to 0x0000. When the Timer 2 interrupt is enabled, setting this bit causes the CPU to vector to the Timer 2 interrupt service routine. This bit is not automatically cleared by hardware and must be cleared by software. TF2 will not be set when RCLK and/or TCLK are logic 1.
Bit6: EXF2: Timer 2 External Flag.
Set by hardware when either a capture or reload is caused by a high-to-low transition on the T2EX input pin and EXEN2 is logic 1. When the Timer 2 interrupt is enabled, setting this bit causes the CPU to vector to the Timer 2 Interrupt service routine. This bit is not automatically cleared by hardware and must be cleared by software.
Bit5: RCLK: Receive Clock Flag.
Selects which timer is used for the UART's receive clock in modes 1 or 3.
0: Timer 1 overflows used for receive clock.
1: Timer 2 overflows used for receive clock.
Bit4: TCLK: Transmit Clock Flag.
Selects which timer is used for the UART's transmit clock in modes 1 or 3.
0: Timer 1 overflows used for transmit clock.
1: Timer 2 overflows used for transmit clock.
Bit3: EXEN2: Timer 2 External Enable.
Enables high-to-low transitions on T2EX to trigger captures or reloads when Timer 2 is not operating in Baud Rate Generator mode.
0: High-to-low transitions on T2EX ignored.
1: High-to-low transitions on T2EX cause a capture or reload.
Bit2: TR2: Timer 2 Run Control.
This bit enables/disables Timer 2.
0: Timer 2 disabled.
1: Timer 2 enabled.
Bit1: C/T2: Counter/Timer Select.
0: Timer Function: Timer 2 incremented by clock defined by T2M (CKCON.5).
1: Counter Function: Timer 2 incremented by high-to-low transition on external input pin.
Bit0: CP/RL2: Capture/Reload Select.
This bit selects whether Timer 2 functions in capture or auto-reload mode. EXEN2 must be logic 1 for high-to-low transitions on T2EX to be recognized and used to trigger captures or reloads. If RCLK or TCLK is set, this bit is ignored and Timer 2 will function in auto-reload mode.
0: Auto-reload on Timer 2 overflow or high-to-low transition at T2EX (EXEN2 = 1).
1: Capture on high-to-low transition at T2EX (EXEN2 = 1).

TABLE 75

RCAP2L: Timer 2 Capture Register Low Byte

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xCA |

Bits 7-0: RCAP2L: Timer 2 Capture Register Low Byte.
The RCAP2L register captures the low byte of Timer 2 when Timer 2 is configured in capture mode. When Timer 2 is configured in auto-reload mode, it holds the low byte of the reload value.

TABLE 76

RCAP2H: Timer 2 Capture Register High Byte

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xCB |

Bits 7-0: RCAP2H: Timer 2 Capture Register High Byte.
The RCAP2H register captures the high byte of Timer 2 when TABLE 76-continued Timer 2 is configured in capture mode. When Timer 2 is configured in auto-reload mode, it holds the high byte of the reload value.

TABLE 77

TL2: Timer 2 Low Byte

| R/W | R/W | R/W | R/W | R/W | R/W | R/W | R/W | Reset Value 00000000 |
|---|---|---|---|---|---|---|---|---|
| Bit7 | Bit6 | Bit5 | Bit4 | Bit3 | Bit2 | Bit1 | Bit0 | SFR Address: 0xCC |

TABLE 77-continued

Bits 7-0: TL2: Timer 2 Low Byte.
The TL2 register contains the low byte of the 16-bit Timer 2.

TABLE 78

TH2: Timer 2 High Byte

| R/W | R/W | R/W | R/W | R/W | R/W | R/W | R/W | Reset Value |
|---|---|---|---|---|---|---|---|---|
| Bit7 | Bit6 | Bit5 | Bit4 | Bit3 | Bit2 | Bit1 | Bit0 | 00000000 SFR Address: 0xCD |

Bits 7-0: TH2: Timer 2 High Byte.
The TH2 register contains the high byte of the 16-bit Timer 2.

TABLE 80

PCA0CN: PCA Control Register

| R/W | R/W | R/W | R/W | R/W | R/W | R/W | R/W | Reset Value |
|---|---|---|---|---|---|---|---|---|
| CF | CR | — | CCF4 | CCF3 | CCF2 | CCF1 | CCF0 | 00000000 |
| Bit7 | Bit6 | Bit5 | Bit4 | Bit3 | Bit2 | Bit1 | Bit0 | SFR Address: 0xD8 |

- Bit7: CF: PCA Counter/Timer Overflow Flag.
  Set by hardware when the PCA Counter/Timer overflows from 0xFFFF to 0x0000. When the Counter/Timer Overflow (CF) interrupt is enabled, setting this bit causes the CPU to vector to the CF interrupt service routine. This bit is not automatically cleared by hardware and must be cleared by software.
- Bit6: CR: PCA Counter/Timer Run Control.
  This bit enables/disables the PCA Counter/Timer.
  0: PCA Counter/Timer disabled.
  1: PCA Counter/Timer enabled.
- Bit5: UNUSED. Read = 0, Write = don't care.
- Bit4: CCF4: PCA Module 4 Capture/Compare Flag.
  This bit is set by hardware when a match or capture occurs. When the CCF interrupt is enabled, setting this bit causes the CPU to vector to the CCF interrupt service routine. This bit is not automatically cleared by hardware and must be cleared by software.
- Bit3: CCF3: PCA Module 3 Capture/Compare Flag.
  This bit is set by hardware when a match or capture occurs. When the CCF interrupt is enabled, setting this bit causes the CPU to vector to the CCF interrupt service routine. This bit is not automatically cleared by hardware and must be cleared by software.
- Bit2: CCF2: PCA Module 2 Capture/Compare Flag.
  This bit is set by hardware when a match or capture occurs.

TABLE 80-continued

When the CCF interrupt is enabled, setting this bit causes the CPU to vector to the CCF interrupt service routine. This bit is not automatically cleared by hardware and must be cleared by software.
- Bit1: CCF1: PCA Module 1 Capture/Compare Flag.
  This bit is set by hardware when a match or capture occurs. When the CCF interrupt is enabled, setting this bit causes the CPU to vector to the CCF interrupt service routine. This bit is not automatically cleared by hardware and must be cleared by software.
- Bit0: CCF0: PCA Module 0 Capture/Compare Flag.
  This bit is set by hardware when a match or capture occurs. When the CCF interrupt is enabled, setting this bit causes the CPU to vector to the CCF interrupt service routine. This bit is not automatically cleared by hardware and must be cleared by software.

TABLE 81

PCA0MD: PCA Mode Register

| R/W | R/W | R/W | R/W | R/W | R/W | R/W | R/W | Reset Value |
|---|---|---|---|---|---|---|---|---|
| CIDL | — | — | — | — | CPS1 | CPS0 | ECF | 00000000 |
| Bit7 | Bit6 | Bit5 | Bit4 | Bit3 | Bit2 | Bit1 | Bit0 | SFR Address: 0xD9 |

- Bit7: CIDL: PCA Counter/Timer Idle Control.
  Specifies PCA behavior when CPU is in Idle Mode.
  0: PCA continues to function normally while the system controller is in Idle Mode.
  1: PCA operation is suspended while the system controller is in Idle Mode.
- Bits6-3: UNUSED. Read = 0000b, Write = don't care.
- Bits2-1: CPS1-CPS0: PCA Counter/Timer Pulse Select.
  These bits select the timebase source for the PCA counter.

| CPS1 | CPS0 | Timebase |
  |---|---|---|
  | 0 | 0 | System clock divided by 12 |
  | 0 | 1 | System clock |
  | 1 | 0 | Timer 0 overflow |
  | 1 | 1 | High-to-low transitions on ECI (max rate = system clock divided by 4) |

- Bit0: ECF: PCA Counter/Timer Overflow Interrupt Enable.
  This bit sets the masking of the PCA Counter/Timer Overflow (CF) interrupt.
  0: Disable the CF interrupt.
  1: Enable a PCA Counter/Timer Overflow interrupt request when CF (PCA0CN.7) is set.

TABLE 82

PCA0CPMn: PCA Capture/Compare Registers

| R/W | R/W | R/W | R/W | R/W | R/W | R/W | R/W | Reset Value |
|---|---|---|---|---|---|---|---|---|
| — | ECOMn | CAPPn | CAPNn | MATn | TOGn | PWMn | ECCFn | 00000000 |
| Bit7 | Bit6 | Bit5 | Bit4 | Bit3 | Bit2 | Bit1 | Bit0 | SFR Address: 0xDA-0xDE |

PCA0CPMn Address:
- PCA0CPM0 = 0xDA (n = 0)
- PCA0CPM1 = 0xDB (n = 1)
- PCA0CPM2 = 0xDC (n = 2)
- PCA0CPM3 = 0xDD (n = 3)
- PCA0CPM4 = 0xDE (n = 4)

- Bit7: UNUSED. Read = 0, Write = don't care.
- Bit6: ECOMn: Comparator Function Enable.
  This bit enables/disables the comparator function for PCA module n.
  0: Disabled.
  1: Enabled.
- Bit5: CAPPn: Capture Positive Function Enable.
  This bit enables/disables the positive edge capture for PCA module n.
  0: Disabled.
  1: Enabled.

TABLE 82-continued

Bit4:   CAPNn: Capture Negative Function Enable.
        This bit enables/disables the negative edge capture
        for PCA module n.
        0: Disabled.
        1: Enabled.
Bit3:   MATn: Match Function Enable.
        This bit enables/disables the match function for PCA module n.
        When enabled, matches of the PCA counter with a module's
        capture/compare register cause the CCFn bit in
        PCA0MD register to be set.
        0: Disabled.
        1: Enabled.
Bit2:   TOGn: Toggle Function Enable.
        This bit enables/disables the toggle function for PCA module n.
        When enabled, matches of the PCA counter with a module's
        capture/compare register cause the logic level on the
        CEXn pin to toggle.
        0: Disabled.
        1: Enabled.
Bit1:   PWMn: Pulse Width Modulation Mode Enable.
        This bit enables/disables the comparator function for PCA module n.
        When enabled, a pulse width modulated signal is output on the CEXn pin.
        0: Disabled.
        1: Enabled.
Bit0:   ECCFn: Capture/Compare Flag Interrupt Enable.
        This bit sets the masking of the Capture/Compare Flag (CCFn) interrupt.
        0: Disable CCFn interrupts.
        1: Enable a Capture/Compare Flag interrupt request when CCFn is set.

TABLE 83

PCA0L: PCA Counter/Timer Low Byte

| R/W | R/W | R/W | R/W | R/W | R/W | R/W | R/W | Reset Value 00000000 |
|-----|-----|-----|-----|-----|-----|-----|-----|----------------------|
| Bit7 | Bit6 | Bit5 | Bit4 | Bit3 | Bit2 | Bit1 | Bit0 | SFR Address: 0xE9 |

Bits 7-0:  PCA0L: PCA Counter/Timer Low Byte.
           The PCA0L register holds the low byte (LSB) of the
           16-bit PCA Counter/Timer.

TABLE 84

PCA0H: PCA Counter/Timer High Byte

| R/W | R/W | R/W | R/W | R/W | R/W | R/W | R/W | Reset Value 00000000 |
|-----|-----|-----|-----|-----|-----|-----|-----|----------------------|
| Bit7 | Bit6 | Bit5 | Bit4 | Bit3 | Bit2 | Bit1 | Bit0 | SFR Address: 0xF9 |

Bits 7-0:  PCA0H: PCA Counter/Timer High Byte.
           The PCA0H register holds the high byte (MSB) of the
           16-bit PCA Counter/Timer.

TABLE 85

PCA0CPLn: PCA Capture Module Low Byte

| R/W | R/W | R/W | R/W | R/W | R/W | R/W | R/W | Reset Value 00000000 |
|-----|-----|-----|-----|-----|-----|-----|-----|----------------------|
| Bit7 | Bit6 | Bit5 | Bit4 | Bit3 | Bit2 | Bit1 | Bit0 | SFR Address: 0xEA-0xEE |

PCA0CPLn Address:
           PCA0CPL0 = 0xEA (n = 0)
           PCA0CPL1 = 0xEB (n = 1)
           PCA0CPL2 = 0xEC (n = 2)
           PCA0CPL3 = 0xED (n = 3)
           PCA0CPL4 = 0xEE (n = 4)
Bits7-6:   PCA0CPLn: PCA Capture Module Low Byte.
           The PCA0CPLn register holds the low byte
           (LSB) of the 16-bit capture module n.

TABLE 86

PCA0CPHn: PCA Capture Module High Byte

| R/W | R/W | R/W | R/W | R/W | R/W | R/W | R/W | Reset Value 00000000 |
|-----|-----|-----|-----|-----|-----|-----|-----|----------------------|
| Bit7 | Bit6 | Bit5 | Bit4 | Bit3 | Bit2 | Bit1 | Bit0 | SFR Address: 0xFA-0xFE |

PCA0CPHn Address:
           PCA0CPH0 = 0xFA (n = 0)
           PCA0CPH1 = 0xFB (n = 1)
           PCA0CPH2 = 0xFC (n = 2)
           PCA0CPH3 = 0xFD (n = 3)
           PCA0CPH4 = 0xFE (n = 4)
Bits7-0:   PCA0CPHn: PCA Capture Module High Byte.
           The PCA0CPHn register hold the high byte
           (MSB) of the 16-bit capture module n.

TABLE 87

Boundary Data Register Bit Definitions
EXTEST provides access to both capture and update actions, while Sample
only performs a capture.

| Bit | Action | Target |
|-----|--------|--------|
| 0 | Capture | Reset Enable from MCU |
|   | Update | Reset Enable to /RST pin |

TABLE 87-continued

Boundary Data Register Bit Definitions
EXTEST provides access to both capture and update actions, while Sample only performs a capture.

| Bit | Action | Target |
| --- | --- | --- |
| 1 | Capture | Reset input from /RST pin |
| | Update | Reset output to /RST pin |
| 2 | Capture | External Clock from XTAL1 pin |
| | Update | Not used |
| 3 | Capture | Weak pullup enable to Port pins |
| | Update | Weak pullup enable from MCU |
| 4-11 | Capture | SFR Address Bus bit from CIP-51 (e.g. Bit4=SFRA0, Bit5=SFRA1...) |
| | Update | SFR Address Bus bit to SFR Address Bus (e.g. Bit4=XSFRA0, Bit5=XSFRA1) |
| 12-19 | Capture | SFR Data Bus bit read from SFR (e.g. Bit12=SFRD0, Bit13=SFRD1...) |
| | Update | SFR Data Bus bit written to SFR (e.g. Bit12=SFRD0, Bit13=SFRD1...) |
| 20 | Capture | SFR Write Strobe from CIP-51 |
| | Update | SFR Write Strobe to SFR Bus |
| 21 | Capture | SFR Read Strobe from CIP-51 |
| | Update | SFR Read Strobe to SFR Bus |
| 22 | Capture | SFR Read/Modify/Write Strobe from CIP-51 |
| | Update | SFR Read/Modify/Write Strobe to SFR Bus |
| 23, 25, 27, 29, | Capture | P0.n output enable from MCU (e.g. Bit23=P0.0, Bit25=P0.1, etc.) |
| 31, 33, 35, 37 | Update | P0.n output enable to pin (e.g. Bit23=P0.0oe, Bit25=P0.1oe, etc.) |
| 24, 26, 28, 30, | Capture | P0.n input from pin (e.g. Bit24=P0.0, Bit26=P0.1, etc.) |
| 32, 34, 36, 38 | Update | P0.n output to pin (e.g. Bit24=P0.0, Bit26=P0.1, etc.) |
| 39, 41, 43, 45, | Capture | P1.n output enable from MCU (e.g. Bit39=P1.0, Bit41=P1.1, etc.) |
| 47, 49, 51, 53 | Update | P1.n output enable to pin (e.g. Bit39=P1.0oe, Bit41=P1.1oe, etc.) |
| 40, 42, 44, 46, | Capture | P1.n input from pin (e.g. Bit40=P1.0, Bit42=P1.1, etc.) |
| 48, 50, 52, 54 | Update | P1.n output to pin (e.g. Bit40=P1.0, Bit42=P1.1, etc.) |
| 55, 57, 59, 61, | Capture | P2.n output enable from MCU (e.g. Bit55=P2.0, Bit57=P2.1, etc.) |
| 63, 65, 67, 69 | Update | P2.n output enable to pin (e.g. Bit55=P2.0oe, Bit57=P2.1oe, etc.) |
| 56, 58, 60, 62, | Capture | P2.n input from pin (e.g. Bit56=P2.0, Bit58=P2.1, etc.) |
| 64, 66, 68, 70 | Update | P2.n output to pin (e.g. Bit56=P2.0, Bit58=P2.1, etc.) |
| 71, 73, 75, 77, | Capture | P3.n output enable from MCU (e.g. Bit71=P3.0, Bit73=P3.1, etc.) |
| 79, 81, 83, 85 | Update | P3.n output enable to pin (e.g. Bit71=P3.0oe, Bit73=P3.1oe, etc.) |
| 72, 74, 76, 78, | Capture | P3.n input from pin (e.g. Bit72=P3.0, Bit74=P3.1, etc.) |
| 80, 82, 84, 86 | Update | P3.n output to pin (e.g. Bit72=P3.0, Bit74=P3.1, etc.) |

What is claimed is:

1. An integrated circuit package on a single chip, comprising:
a processing core for operating on a set of instructions to carry out predefined processes;
a plurality of comparators for performing compare operations within the integrated circuit package;
at least one control register associated with each of the plurality of comparators for storing a first group of control bits controlling an amount of positive hysteresis of each of the plurality of comparators and a second group of control bits controlling an amount of negative hysteresis of each of the plurality of comparators;
wherein each of the plurality of comparators are software programmable to control a hysteresis of the plurality of comparators responsive to control bits established in the at least one control register by the processing core, the amount of positive hysteresis programmed via the first group of the control bits in the at least one control register and the amount of negative hysteresis programmed via the second group of the control bits in the at least one control register;
a crossbar switch for assigning an output of the plurality of comparators to package pins; and
wherein when a comparator output is assigned to the package pins, the comparator output can be programmed by the processing core to operate in either an open drain mode or a push-pull mode.

2. The integrated circuit package of claim 1, wherein positive and negative going symmetry of hysteresis around a threshold voltage may be software programmed responsive to hysteresis symmetry control bits within the at least one control register set by the processing core.

3. The integrated circuit package of claim 1, wherein each of the plurality of comparators can be enabled or disabled by the processing core responsive to a software programmed bit in the control register.

4. The integrated circuit package of claim 1, wherein each of the plurality of comparators may be placed in a low power shut down mode by the processing core.

5. The integrated circuit package of claim 1, wherein each of the plurality of comparators may be software programmed to generate an interrupt on a rising clock edge responsive to a first control bit, a falling clock responsive to a second control bit, and both a rising and falling clock edge responsive to the first and the second control bits.

6. The integrated circuit package of claim 1, wherein the at least one control register programs each of the plurality of comparators to operate in either an open drain mode or a push-pull mode.

7. An integrated circuit package, comprising:
a processing core for operating on a set of instructions to carry out predefined processes;
a plurality of comparators for performing compare operations within the integrated circuit package;
at least one control register associated with each of the plurality of comparators for storing a first group of control bits controlling an amount of positive hysteresis of each of the plurality of comparators and a second group of control bits controlling an amount of negative hysteresis of each of the plurality of comparators; and wherein each of the plurality of comparators are software programmable to control a hysteresis of the plurality of comparators responsive to control bits established in the at least one control register of the comparator by the processing core, the amount of positive hysteresis programmed via the first group of the control bits in the at least one control register and the amount of negative hysteresis programmed via the second group of the control bits in the at least one control register;

wherein each of the plurality of comparators may be software programmed to generate an interrupt on a rising clock edge responsive to a first control bit, a falling clock responsive to a second control bit, and both a rising and falling clock edge responsive to the first and the second control bits; and wherein each of the plurality of comparators can be enabled or disabled by the processing core responsive to a software programmed bit in the control register.

8. The integrated circuit package of claim 7, further including:

a crossbar switch for assigning an output of the plurality of comparators to package pins; and wherein when a comparator output is assigned to the package pins, the comparator output can be programmed by the processing core to operate in either an open drain mode or a push-pull mode.

9. The integrated circuit package of claim 7, wherein each of the plurality of comparators may be placed in a low power shut down mode by the processing core.

10. The integrated circuit package of claim 7, wherein the at least one control register programs each of the plurality of comparators to operate in either an open drain mode or a push-pull mode.

11. An integrated circuit package on a single chip, comprising:

a processing core for operating on a set of instructions to carry out predefined processes;

a plurality of comparators for performing compare operations within the integrated circuit package;

at least one control register associated with each of the plurality of comparators for storing a first group of control bits controlling an amount of positive hysteresis of each of the plurality of comparators and a second group of control bits controlling an amount of negative hysteresis of comparators;

wherein each of the plurality of comparators are software programmable to control an amount of hysteresis voltage of each of the plurality of comparators and to control a positive going and negative going symmetry of hysteresis around the amount of hysteresis voltage;

a crossbar switch for assigning an output of the plurality of comparators to package pins; and wherein when a comparator output is assigned to the package pins, the comparator output can be programmed by the processing core to operate in either an open drain mode or a push-pull mode.

* * * * *